(12) United States Patent
Samachisa et al.

(10) Patent No.: US 9,245,629 B2
(45) Date of Patent: Jan. 26, 2016

(54) METHOD FOR NON-VOLATILE MEMORY HAVING 3D ARRAY OF READ/WRITE ELEMENTS WITH EFFICIENT DECODING OF VERTICAL BIT LINES AND WORD LINES

(71) Applicant: SANDISK 3D LLC, Milpitas, CA (US)

(72) Inventors: George Samachisa, Atherton, CA (US); Luca Fasoli, Campbell, CA (US); Masaaki Higashitani, Cupertino, CA (US); Roy Edwin Scheuerlein, Cupertino, CA (US)

(73) Assignee: SANDISK 3D LLC, Milpitas, CA (US)

( * ) Notice: Subject to any disclaimer, the term of this patent is extended or adjusted under 35 U.S.C. 154(b) by 151 days.

(21) Appl. No.: 14/057,971

(22) Filed: Oct. 18, 2013

(65) Prior Publication Data

US 2014/0043911 A1  Feb. 13, 2014

Related U.S. Application Data

(63) Continuation of application No. 13/151,217, filed on Jun. 1, 2011, now abandoned.

(60) Provisional application No. 61/352,714, filed on Jun. 8, 2010.

(51) Int. Cl.
*G11C 11/00* (2006.01)
*G11C 16/10* (2006.01)
(Continued)

(52) U.S. Cl.
CPC .............. *G11C 16/10* (2013.01); *G11C 13/003* (2013.01); *H01L 27/2409* (2013.01);
(Continued)

(58) Field of Classification Search
CPC . H01L 27/2409; H01L 27/249; H01L 45/065; H01L 45/085; H01L 45/144; G11C 13/003; G11C 2213/71; G11C 16/10

USPC ...................................................... 365/185.18
See application file for complete search history.

(56) References Cited

U.S. PATENT DOCUMENTS

| | | |
|---|---|---|
| 3,448,302 A | 6/1969 | Shanefield |
| 3,643,236 A | 2/1972 | Kolankowsky et al. |

(Continued)

FOREIGN PATENT DOCUMENTS

| | | |
|---|---|---|
| CN | 1823418 | 5/2004 |
| CN | 1574076 | 2/2005 |

(Continued)

OTHER PUBLICATIONS

Chinese Office Action for Application No. 2010800235399, mailed on Feb. 3, 2015, 14 pages.

(Continued)

*Primary Examiner* — Richard Elms
*Assistant Examiner* — Xiaochun L Chen
(74) *Attorney, Agent, or Firm* — Davis Wright Tremaine LLP

(57) ABSTRACT

A three-dimensional array of memory elements is formed across multiple layers of planes positioned at different distances above a semiconductor substrate. The memory elements reversibly change a level of electrical conductance in response to a voltage difference being applied across them. The three-dimensional array includes a two-dimensional array of pillar lines from the substrate through the multiple layers of planes. A first set of pillar lines acts as local bit lines for accessing the memory elements together with an array of word lines on each plane. A second set of pillar lines is connected to the word lines. An array of metal lines on the substrate is switchable connected to the pillar lines to provide access to the first and second sets of pillar lines, thereby to provide access respectively to the bit lines and word lines of the three-dimensional array.

17 Claims, 38 Drawing Sheets

(51) Int. Cl.
*G11C 13/00* (2006.01)
*H01L 27/24* (2006.01)
*H01L 45/00* (2006.01)

(52) U.S. Cl.
CPC ......... *H01L 27/249* (2013.01); *G11C 2213/71* (2013.01); *H01L 45/06* (2013.01); *H01L 45/065* (2013.01); *H01L 45/08* (2013.01); *H01L 45/085* (2013.01); *H01L 45/1226* (2013.01); *H01L 45/144* (2013.01); *H01L 45/146* (2013.01); *H01L 45/149* (2013.01)

(56) References Cited

U.S. PATENT DOCUMENTS

| | | | |
|---|---|---|---|
| 4,583,201 A | 4/1986 | Bertin et al. | |
| 4,805,142 A | 2/1989 | Bertin et al. | |
| 5,172,338 A | 12/1992 | Mehrotra et al. | |
| 5,453,955 A * | 9/1995 | Sakui et al. | 365/203 |
| 5,570,315 A | 10/1996 | Tanaka et al. | |
| 5,640,343 A | 6/1997 | Gallagher et al. | |
| 5,172,338 B1 | 7/1997 | Mehrotra et al. | |
| 5,737,260 A | 4/1998 | Takata et al. | |
| 5,774,397 A | 6/1998 | Endoh et al. | |
| 5,835,396 A | 11/1998 | Zhang | |
| 5,894,437 A | 4/1999 | Chang et al. | |
| 6,046,935 A | 4/2000 | Takeuchi et al. | |
| 6,055,200 A | 4/2000 | Choi et al. | |
| 6,133,126 A | 10/2000 | Reisinger et al. | |
| 6,222,762 B1 | 4/2001 | Guterman et al. | |
| 6,373,746 B1 | 4/2002 | Takeuchi et al. | |
| 6,456,528 B1 | 9/2002 | Chen | |
| 6,522,580 B2 | 2/2003 | Chen et al. | |
| 6,538,922 B1 | 3/2003 | Khalid et al. | |
| 6,608,773 B2 | 8/2003 | Lowrey et al. | |
| 6,643,188 B2 | 11/2003 | Tanaka et al. | |
| 6,664,639 B2 | 12/2003 | Cleeves | |
| 6,678,192 B2 | 1/2004 | Gongwer et al. | |
| 6,771,536 B2 | 8/2004 | Li et al. | |
| 6,781,877 B2 | 8/2004 | Cernea et al. | |
| 6,870,755 B2 | 3/2005 | Rinerson et al. | |
| 6,921,932 B1 | 7/2005 | Yu et al. | |
| 7,023,739 B2 | 4/2006 | Chen et al. | |
| 7,177,191 B2 | 2/2007 | Fasoli et al. | |
| 7,221,588 B2 | 5/2007 | Fasoli et al. | |
| 7,237,074 B2 | 6/2007 | Guterman et al. | |
| 7,324,393 B2 | 1/2008 | Chan et al. | |
| 7,339,812 B2 * | 3/2008 | Nejad et al. | 365/63 |
| 7,342,279 B2 | 3/2008 | Harari et al. | |
| 7,382,647 B1 | 6/2008 | Gopalakrishnan | |
| 7,456,460 B2 | 11/2008 | Burr et al. | |
| 7,843,715 B2 * | 11/2010 | Park | G11C 5/02 365/105 |
| 7,847,342 B2 * | 12/2010 | Fukuzumi et al. | 257/324 |
| 7,983,065 B2 | 7/2011 | Samachisa | |
| 8,031,508 B2 * | 10/2011 | Toda et al. | 365/148 |
| 8,208,282 B2 | 6/2012 | Johnson et al. | |
| 8,351,236 B2 | 1/2013 | Yan et al. | |
| 2001/0048608 A1 | 12/2001 | Numata et al. | |
| 2003/0103377 A1 | 6/2003 | Kajiyama | |
| 2003/0206481 A1 | 11/2003 | Hsu et al. | |
| 2003/0223292 A1 | 12/2003 | Nejad et al. | |
| 2004/0057276 A1 | 3/2004 | Nejad et al. | |
| 2004/0108528 A1 | 6/2004 | Hsu et al. | |
| 2004/0151024 A1 | 8/2004 | Fricke et al. | |
| 2004/0159868 A1 | 8/2004 | Rinerson et al. | |
| 2004/0264244 A1 | 12/2004 | Morimoto | |
| 2005/0045919 A1 | 3/2005 | Kaeriyama et al. | |
| 2005/0128807 A1 | 6/2005 | Chen et al. | |
| 2005/0226041 A1 * | 10/2005 | Nejad et al. | 365/158 |
| 2006/0184720 A1 | 8/2006 | Sinclair et al. | |
| 2006/0250837 A1 | 11/2006 | Herner et al. | |
| 2007/0019467 A1 | 1/2007 | Toda | |
| 2007/0133268 A1 | 6/2007 | Choi et al. | |
| 2007/0170543 A1 | 7/2007 | Furukawa et al. | |
| 2007/0252201 A1 | 11/2007 | Kito et al. | |
| 2007/0263423 A1 | 11/2007 | Scheuerlein et al. | |
| 2008/0002461 A1 | 1/2008 | Rinerson et al. | |
| 2008/0006812 A1 | 1/2008 | Kozicki et al. | |
| 2008/0084729 A1 | 4/2008 | Cho et al. | |
| 2008/0175031 A1 * | 7/2008 | Park | G11C 5/02 365/51 |
| 2008/0175032 A1 | 7/2008 | Tanaka et al. | |
| 2008/0239790 A1 | 10/2008 | Herner et al. | |
| 2008/0265235 A1 | 10/2008 | Kamigaichi et al. | |
| 2008/0273365 A1 | 11/2008 | Kang et al. | |
| 2009/0001342 A1 | 1/2009 | Schricker et al. | |
| 2009/0001344 A1 | 1/2009 | Schricker et al. | |
| 2009/0027950 A1 | 1/2009 | Lam et al. | |
| 2009/0085153 A1 | 4/2009 | Maxwell et al. | |
| 2009/0122598 A1 | 5/2009 | Toda et al. | |
| 2009/0146206 A1 * | 6/2009 | Fukuzumi et al. | 257/324 |
| 2009/0201710 A1 | 8/2009 | Ueda | |
| 2009/0261386 A1 | 10/2009 | Makino | |
| 2010/0046273 A1 | 2/2010 | Azuma et al. | |
| 2010/0073990 A1 | 3/2010 | Siau et al. | |
| 2010/0226195 A1 | 9/2010 | Lue | |
| 2010/0259960 A1 | 10/2010 | Samachisa | |
| 2010/0259961 A1 | 10/2010 | Fasoli et al. | |
| 2010/0259962 A1 | 10/2010 | Yan et al. | |
| 2010/0289084 A1 | 11/2010 | Yoon et al. | |
| 2011/0297912 A1 | 12/2011 | Samachisa et al. | |
| 2011/0299314 A1 | 12/2011 | Samachisa et al. | |
| 2011/0299340 A1 | 12/2011 | Samachisa et al. | |

FOREIGN PATENT DOCUMENTS

| | | |
|---|---|---|
| CN | 1578988 | 2/2005 |
| CN | 10139388 | 3/2009 |
| EP | 1 796 103 A2 | 6/2007 |
| EP | 2417600 | 2/2012 |
| JP | 2007511895 | 5/2007 |
| JP | 2008-243263 A | 10/2008 |
| JP | 2009-004725 A | 1/2009 |
| JP | 2009004725 | 1/2009 |
| JP | 2009004725 A | 1/2009 |
| WO | 03098636 A2 | 11/2003 |
| WO | WO 03/098636 A2 | 11/2003 |
| WO | WO 2004/105039 | 2/2004 |
| WO | 2004/105039 A2 | 12/2004 |
| WO | WO 2009/011221 A1 | 1/2009 |

OTHER PUBLICATIONS

European Office Action for Application No. 11731579.6-1806, mailed on Oct. 24, 2014, 4 pages.
Chinese Office Action, Application No. 201080023571.7, mailed on Jan. 12, 2014, 16 pages.
Chinese Office Action, Application No. 201080023575.5, mailed Nov. 1, 2013, 10 pages.
Chinese Office Action, Application No. 201080023539.9, mailed on Nov. 27, 2013, 13 pages.
U.S. Office Action, U.S. Appl. No. 13/973,218, mailed on Dec. 9, 2013, 17 pages.
European Office Action, Application No. 10712669.0, mailed on Feb. 28, 2014, 8 pages.
European Office Action, Application No. 10719436.7, mailed on Feb. 18, 2014, 9 pages.
European Office Action , Application 10726352.7, mailed on Feb. 28, 2014, 9 pages.
Office Action, Application No. 11725298.1, mailed Nov. 4, 2013, 3 pages.
Office Action, Application No. 11725299.9, mailed Nov. 4, 2013, 4 pages.
Office Action, U.S. Appl. No. 13/151,217, mailed on Dec. 6, 2013, 22 pages.
Japanese Office Action for Application No. 2012-504733, mailed on May 13, 2014, 4 pages.
Japanese Office Action for Application No. 2012-504735, mailed on May 27, 2014, 4 pages.
Chinese Office Action for Application No. 201180028664.3, mailed on Jul. 23, 2014, 8 pages.

(56) References Cited

OTHER PUBLICATIONS

Chinese Office Action for Application No. 201080023575.5, mailed on Jul. 6, 2014, 2 pages.
Chinese Office Action for Application No. 201080023539.9, mailed on Jul. 1, 2014, 12 pages.
Chinese Office Action for Application No. 201180028685.5, mailed on Aug. 1, 2014, 10 pages.
Office Action for U.S. Appl. No. 13/151,217, mailed on Jul. 23, 2014, 23 pages.
Chen et al., "Ultra-Thin Phase-Change Bridge Memory Device Using GeSb," 1-4244-0439-8/06, IEEE International Electron Devices Meeting, Aug. 2006, 4 pages.
Jang et al., "Vertical Cell Array using TCAT (Terabit Cell Array Transistor) Technology for Ultra High Density NAND Flash Memory," 2009 Symposium on VLSI Technology Digest of Technical Papers, Jun. 15-17, 2009, Kyoto, Japan, pp. 192-193.
Jung et al., "Three Dimensionally Stacked NAND Flash Memory Technology Using Stacking Single Crystal Si Layers on ILD and TANOS Structure for Beyond 30nm Node," IEEE, Aug. 2006, 1-4244-0439-8/06, 4 pages.
Kaeriyama et al., "A Nonvolatile Programmable Solid-Electrolyte Nanometer Switch," IEEE Journal of Solid-State Circuits, vol. 40, No. 1, Jan. 2005, pp. 168-176.
Kim et al., Novel Vertical-Stacked-Array-Transistor (VSAT) for ultra-high-density and cost-effective NAND Flash memory devices and SSD (Solid State Drive), 2009 Symposium on VLSI Technology Digest of Technical Papers, Jun. 15-17, 2009, Kyoto, Japan, pp. 186-187.
Kim et al., "Multi-Layered Vertical Gate NAND Flash Overcoming Stacking Limit for Terabit Density Storage," 2009 Symposium on VLSI Technology Digest of Technical Papers, Jun. 15-17, 2009, Kyoto, Japan, pp. 188-189.
Kozicki et al., "Multi-bit Memory Using Programmable Metallization Cell Technology," Proceedings of the International Conference on Electronic Devices and Memory, Grenoble, France, Jun. 12-17, 2005, pp. 48-53.
Kozicki et al., "Programmable Metallization Cell Memory Based on Ag—Ge—S ans Cu—Ge—S Solid Electrolytes," IEEE, Sep. 2005, 0-7803-9408-9/05, pp. 83-89.
Kreupl et al., "Carbon-Based Resistive Memory," 2008 IEEE International Electron Device Meeting, San Francisco, Dec. 15-17, 2008, pp. 1-4.
Kund et al., "Conductive bridging Ram (CBRAM): An emerging non-volatile memory technology scalable to sub 20nm," IEEE, Aug. 2005, 0-7803-9269-8/05, 4 pages.
Lee et al., "NiO Resistance Change Memory with a Novel Structure for 3D Integration and Improved Confinement of Conduction Path," 2009 Symposium on VLSI Technology Digest of Technical Papers, Jun. 15-17, 2009, Kyoto, Japan, pp. 28-29.
Numonyx™, "The basics of phase change memory (PCM) technology, A new class of non-volatile memory." http://www.numonyx.com/en-US/ResourceCenter/Pages/WhitePapers.aspx, 5 pages.
Sakamoto et al., "A $Ta_2O_5$ solid-electrolyte switch with improved reliability," 2007 Symposium on VLSI Technology Digest of Technical Papers, 978-4-900784-03-1, pp. 38-39.
Schrogmeier et al., "Time Discrete Voltage Sensing and Iterative Programming Control for a 4F2 Multilevel CBRAM," 2007 Symposium on VLSI Circuits.
Tanaka et al., "Bit Cost Scalable Technology with Punch and Plug Process for Ultra High Density Flash Memory," 2007 Symposium on VLSI Technology Digest of Technical Papers, 978-4-900784-03-1, pp. 14-15.
Williams, "How we found the missing Memristor. The memristor—the functional equivalent of a synapse—could revolutionaze circuit design," IEEE Spectrum, Dec. 2008, pp. 28-35.
Yang et al., "Memristive switching mechanism for metal/oxide/metal nanodevices," Published online on Jun. 15, 2008, Macmillian Publishers Limited, Nature nanotechnology, vol. 3, Jul. 2008, www.nature.com/naturenanotechnology, pp. 429-433.
Yoon et al., "Vertical Cross-point Resistance Change Memory for Ultra-High Density Non-volatile Memory Applications," 2009 Symposium on VLSI Technology Digest of Technical Papers, 2009 Symposium on VLSI in Kyoto, Japan, Jun. 15-17, 2009, 2 pages.
ISA/EPO, "Notification of Transmittal of the International Search Report and the Written Opinion of the International Searching Authority, or the Declaration," corresponding International Patent Application No. PCT/US2011/039416, mailed on Aug. 22, 2011, 11 pages.
ISA/EPO, "Notification of Transmittal of the International Search Report and the Written Opinion of the International Searching Authority, or the Declaration," corresponding International Patent Application No. PCT/US2011/039423, mailed on Aug. 22, 2011, 11 pages.
ISA/EPO, "Invitation to Pay Additional Fees," corresponding International Patent Application No. PCT/US2011/039405, mailed on Oct. 6, 2011, 6 pages.
ISA/EPO, "Notification of Tranamittal of the International Search Report and the Written Opinion of the International Searching Authority, or the Declaration," corresponding International Patent Application No. PCT/US2011/039405, mailed on Dec. 13, 2011, 16 pages.
Notice of Allowance and Fees Due, U.S. Appl. No. 12/748,233, mailed Feb. 8, 2012, 17 pages.
Office Action, U.S. Appl. No. 13/151,204, mailed Jan. 3, 2013, 17 pages.
Notice of Allowance and Fees Due, U.S. Appl. No. 13/151,204, mailed Apr. 30, 2013, 7 pages.
Office Action, U.S. Appl. No. 13/151,224, mailed Jan. 30, 2013, 23 pages.
Notice of Allowance and Fees Due, U.S. Appl. No. 13/151,224, mailed Jun. 20, 2013, 9 pages.
Office Action dated Dec. 20, 2012 in U.S. Appl. No. 13/151,217, 25 pages.
Office Action dated Jan. 3, 2013 in U.S. Appl. No. 13/151,204, 17 pages.
Notice of Allowance dated Apr. 30, 2013 in U.S. Appl. No. 13/151,204, 7 pages.
Andreasson et al., "Origin of oxygen vacancies in restrictive switching memory devices", Journal of Physics: Conference Series (2009), 190(1), 7 pages.
Office Action, mailed on Jul. 2, 2013, in U.S. Appl. No. 13/151,217, 19 pages.
Chinese Office Action for Application No. 201080023571.7, mailed on Sep. 19, 2014, 1 page.
Chinese Office Action for Application No. 201080023575.5, mailed on Oct. 28, 2014, 1 page.
Decision of Refusal issued for JP Patent Application No. 2012-504733 dated Feb. 3, 2015, 4 pages.
Non-Final Office Action issued for U.S. Appl. No. 14/153,794 dated Mar. 20, 2015, 27 pages.
EPO/ISA "Notification of Transmittal of the International Search Report and Written Opinion of the International Searching Authority, of the Declaration" corresponding International Patent Application No. PCT/US2010/029852, mailed on Nov. 24, 2010, 36 pages.
EPO/ISA "Notification of Transmittal of the International Search Report and Written Opinion of the International Searching Authority, of the Declaration" corresponding International Patent Application No. PCT/US2010/029855, mailed on Jul. 21, 2010, 20 pages.
EPO/ISA "Notification of Transmittal of the International Search Report and Written Opinion of the International Searching Authority, of the Declaration" corresponding International Patent Application No. PCT/US2010/029857, mailed on Jul. 28, 2010, 19 pages.
EPO/ISA, "Invitation to Pay Additional Fees" corresponding International Patent Application No. PCT/US2010/029852, mailed on Jul. 2, 2010, 8 pages.
First Office Action, mailed on Sep. 3, 2013, in Japanese Patent Application 2012-504732, 16 pages.
First Office Action, mailed on Jul. 30, 2013, in Japanese Patent Application 2012-504733, 7 pages.
First Office Action, mailed on Jul. 30, 2013, in Japanese Patent Application 2012-504735, 6 pages.

(56) References Cited

OTHER PUBLICATIONS

USPTO "Notice of Allowance and Fee(s) Due" mailed in related U.S. Appl. No. 12/420,334 on Mar. 17, 2011, 22 pages.
USPTO "Office Action" mailed in related U.S. Appl. No. 12/420,334 on Sep. 2, 2010.
USPTO Office Action for U.S. Appl. No. 13/735,983, mailed on Aug. 22, 2013, 11 pages.
USPTO Office Action for U.S. Appl. No. 13/151,217 mailed on Dec. 6, 2013, 22 pages.

* cited by examiner

READ Bias Voltage and Leakage Current Flow
Double Global Bit line Structure

Single-Sided Word line Structure

Single-Sided Word line Structure

READ Bias Voltage and Leakage Current Flow

Single-Sided Word line Structure

3D Structure with laterally formed active elements

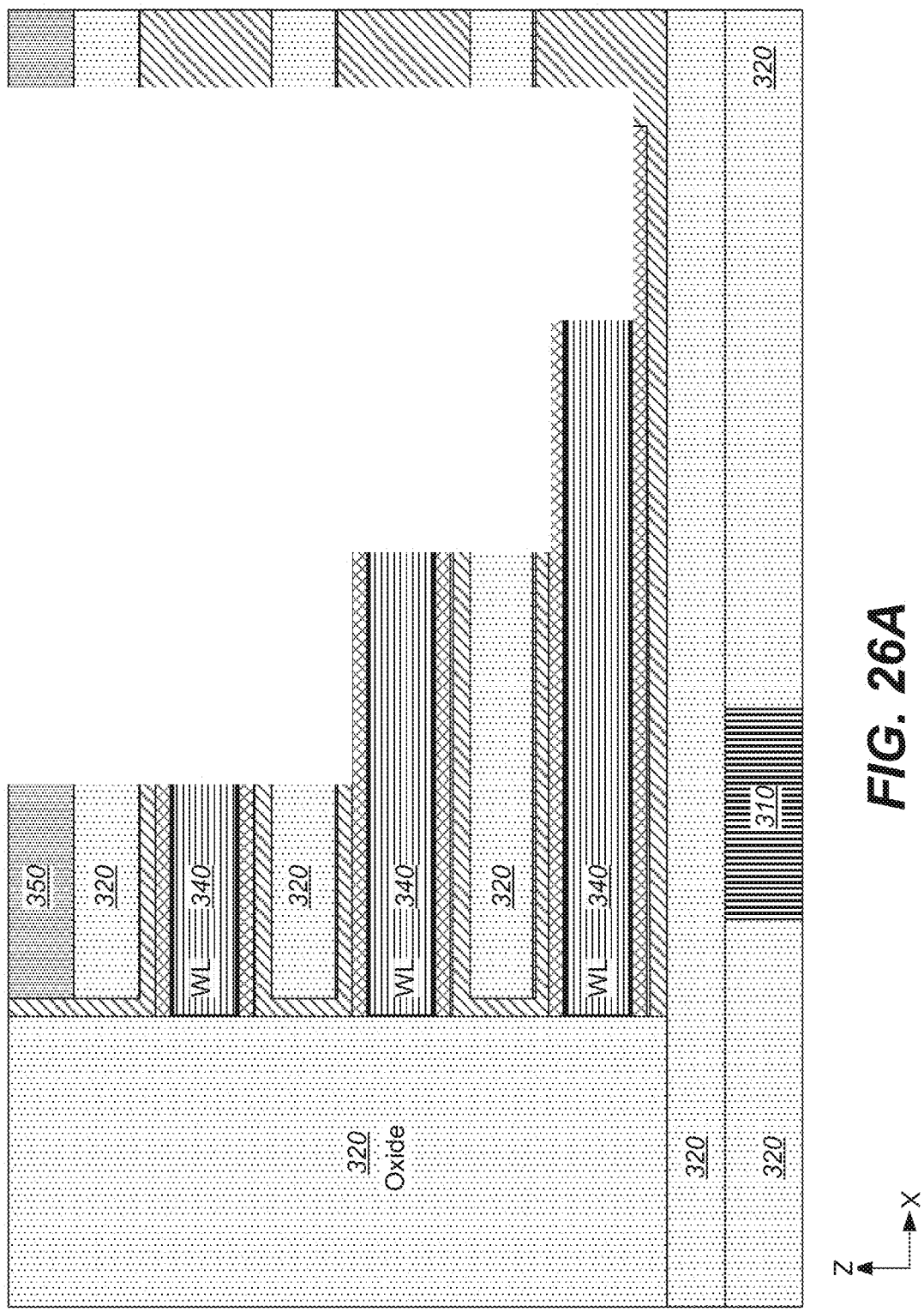

FEOL layout of unit Block with 1st BEOL Architecture - 1st Embodiment

FEOL layout of unit Block with 1st BEOL Architecture – 2nd Embodiment

FEOL layout of unit Block with 1st BEOL Architecture – 3rd Embodiment

BEOL layout of unit Block – 2nd Architecture

BEOL layout of unit Block – 2nd Architecture – Cross Section

FEOL layout of unit Block with 2nd BEOL Architecture - 1st Embodiment

3D Memory Array schematic view

METHOD FOR NON-VOLATILE MEMORY HAVING 3D ARRAY OF READ/WRITE ELEMENTS WITH EFFICIENT DECODING OF VERTICAL BIT LINES AND WORD LINES

CROSS-REFERENCE TO RELATED APPLICATIONS

This application is a continuation of U.S. application Ser. No. 13/151,217 filed on Jun. 1, 2011, which claims priority to United States provisional patent application of George Samachisa, Johann Alsmeier, Luca Fasoli, Masaaki Higashitani, Roy E. Scheuerlein, Application No. 61/352,714 filed on Jun. 8, 2010.

This application is also related to U.S. application Ser. No. 13/151,224 filed on Jun. 1, 2011, now U.S. Pat. No. 8,547,720.

BACKGROUND

The subject matter of this application is the structure, use and making of re-programmable non-volatile memory cell arrays, and, more specifically, to three-dimensional arrays of memory storage elements formed on semiconductor substrates.

Uses of re-programmable non-volatile mass data storage systems utilizing flash memory are widespread for storing data of computer files, camera pictures, and data generated by and/or used by other types of hosts. A popular form of flash memory is a card that is removably connected to the host through a connector. There are many different flash memory cards that are commercially available, examples being those sold under trademarks CompactFlash (CF), the MultiMediaCard (MMC), Secure Digital (SD), miniSD, microSD, Memory Stick, Memory Stick Micro, xD-Picture Card, SmartMedia and TransFlash. These cards have unique mechanical plugs and/or electrical interfaces according to their specifications, and plug into mating receptacles provided as part of or connected with the host.

Another form of flash memory systems in widespread use is the flash drive, which is a hand held memory system in a small elongated package that has a Universal Serial Bus (USB) plug for connecting with a host by plugging it into the host's USB receptacle. SanDisk Corporation, assignee hereof, sells flash drives under its Cruzer, Ultra and Extreme Contour trademarks. In yet another form of flash memory systems, a large amount of memory is permanently installed within host systems, such as within a notebook computer in place of the usual disk drive mass data storage system. Each of these three forms of mass data storage systems generally includes the same type of flash memory arrays. They each also usually contain its own memory controller and drivers but there are also some memory only systems that are instead controlled at least in part by software executed by the host to which the memory is connected. The flash memory is typically formed on one or more integrated circuit chips and the controller on another circuit chip. But in some memory systems that include the controller, especially those embedded within a host, the memory, controller and drivers are often formed on a single integrated circuit chip.

There are two primary techniques by which data are communicated between the host and flash memory systems. In one of them, addresses of data files generated or received by the system are mapped into distinct ranges of a continuous logical address space established for the system. The extent of the address space is typically sufficient to cover the full range of addresses that the system is capable of handling. As one example, magnetic disk storage drives communicate with computers or other host systems through such a logical address space. The host system keeps track of the logical addresses assigned to its files by a file allocation table (FAT) and the memory system maintains a map of those logical addresses into physical memory addresses where the data are stored. Most memory cards and flash drives that are commercially available utilize this type of interface since it emulates that of magnetic disk drives with which hosts have commonly interfaced.

In the second of the two techniques, data files generated by an electronic system are uniquely identified and their data logically addressed by offsets within the file. Theses file identifiers are then directly mapped within the memory system into physical memory locations. Both types of host/memory system interfaces are described and contrasted elsewhere, such as in patent application publication no. US 2006/0184720 A1.

Flash memory systems typically utilize integrated circuits with arrays of memory cells that individually store an electrical charge that controls the threshold level of the memory cells according to the data being stored in them. Electrically conductive floating gates are most commonly provided as part of the memory cells to store the charge but dielectric charge trapping material is alternatively used. A NAND architecture is generally preferred for the memory cell arrays used for large capacity mass storage systems. Other architectures, such as NOR, are typically used instead for small capacity memories. Examples of NAND flash arrays and their operation as part of flash memory systems may be had by reference to U.S. Pat. Nos. 5,570,315, 5,774,397, 6,046,935, 6,373,746, 6,456,528, 6,522,580, 6,643,188, 6,771,536, 6,781,877 and 7,342,279.

The amount of integrated circuit area necessary for each bit of data stored in the memory cell array has been reduced significantly over the years, and the goal remains to reduce this further. The cost and size of the flash memory systems are therefore being reduced as a result. The use of the NAND array architecture contributes to this but other approaches have also been employed to reducing the size of memory cell arrays. One of these other approaches is to form, on a semiconductor substrate, multiple two-dimensional memory cell arrays, one on top of another in different planes, instead of the more typical single array. Examples of integrated circuits having multiple stacked NAND flash memory cell array planes are given in U.S. Pat. Nos. 7,023,739 and 7,177,191.

Another type of re-programmable non-volatile memory cell uses variable resistance memory elements that may be set to either conductive or non-conductive states (or, alternately, low or high resistance states, respectively), and some additionally to partially conductive states and remain in that state until subsequently re-set to the initial condition. The variable resistance elements are individually connected between two orthogonally extending conductors (typically bit and word lines) where they cross each other in a two-dimensional array. The state of such an element is typically changed by proper voltages being placed on the intersecting conductors. Since these voltages are necessarily also applied to a large number of other unselected resistive elements because they are connected along the same conductors as the states of selected elements being programmed or read, diodes are commonly connected in series with the variable resistive elements in order to reduce leakage currents that can flow through them. The desire to perform data reading and programming operations with a large number of memory cells in parallel results in reading or programming voltages being applied to a very large number of other memory cells. An example of an array of variable resistive memory elements and associated diodes is given in patent application publication no. US 2009/0001344 A1.

SUMMARY OF THE INVENTION

According to a general framework of the invention, a 3D memory includes memory elements arranged in a three-dimensional pattern defined by rectangular coordinates having x, y and z-directions and with a plurality of parallel planes stacked in the z-direction. The memory elements in each plane are accessed by a plurality of word lines and relatively short local bit lines in tandem with a plurality of global bit lines. The plurality of local bit lines are in the z-direction through the plurality of planes and arranged in a two dimensional rectangular array of rows in the x-direction and columns in the y-directions. The plurality of word lines in each plane are elongated in the x-direction and spaced apart in the y-direction between and separated from the plurality of local bit lines in the individual planes. A non-volatile, reprogramming memory element is located near a crossing between a word line and local bit line and accessible by the word line and local bit line and wherein a group of memory elements are accessible in parallel by a common word line and a row of local bit lines.

The memory has the structure of a 3D resistive mesh. The memory elements used in the three-dimensional array are preferably variable resistive memory elements. That is, the resistance (and thus inversely the conductance) of the individual memory elements is typically changed as a result of a voltage placed across the orthogonally intersecting conductors to which the element is connected. Depending on the type of variable resistive element, the state may change in response to a voltage across it, a level of current though it, an amount of electric field across it, a level of heat applied to it, and the like. With some variable resistive element material, it is the amount of time that the voltage, current, electric field, heat and the like is applied to the element that determines when its conductive state changes and the direction in which the change takes place. In between such state changing operations, the resistance of the memory element remains unchanged, so is non-volatile. The three-dimensional array architecture summarized above may be implemented with a memory element material selected from a wide variety of such materials having different properties and operating characteristics.

The 3D memory preferably has a single-sided word line architecture with each word line exclusively connected to one row of memory elements. This is accomplished by providing one word line for each row of memory elements instead of sharing one word line between two rows of memory elements and linking the memory element across the array across the word lines. A single-sided word line architecture provides a word line exclusively for each row of memory elements instead of sharing one word line between two rows of memory elements thereby avoids linking the memory element across the array across the word lines. While the row of memory elements is also being accessed by a corresponding row of local bit lines, there is no extension of coupling between adjacent rows of local bit lines and therefore leakage currents beyond the word line. This helps to reduce the leakage across the resistive mesh.

Efficient Decoding of Vertical Bit Lines and Horizontal Word Lines

A memory of operating a three-dimensional array of memory elements, where the memory elements is formed across multiple layers of planes positioned at different distances above a semiconductor substrate. The memory elements reversibly change a level of electrical conductance in response to a voltage difference being applied across them. The three-dimensional array includes a two-dimensional array of pillar lines from the substrate through the multiple layers of planes. A first set of pillar lines acts as local bit lines for accessing the memory elements together with an array of word lines on each plane. A second set of pillar lines is connected to the word lines. An array of metal lines on the substrate is switchable connected to the pillar lines to provide access to the first and second sets of pillar lines, thereby to provide access respectively to the bit lines and word lines of the three-dimensional array.

This provides a highly scalable architecture for decoding bit lines and word lines. For example, one of the causes of leakage in the resistive mesh is due to finite resistance across the length of individual word lines. The word lines can be segmented to reduce their resistance. The segmented word lines can be readily accessed by appropriating more of the pillar lines and metal lines to the increased number of segments.

Preferably in operating, a selected row of pillar lines are simultaneously switched by two rows of adjacent switches to different ones of the metal lines. This has the advantage of doubling the drive power by allowing two banks of select devices to be used in parallel. It therefore has a multiplier of M=2.

Preferably in operation, by operating the switches (select transistors each with its source and drain coinciding with either a vertical local line pillar, or a contact) formed in a diagonal manner relative to the global lines, the length of the select devices (and hence the drive power) can be increased by a factor of SQRT(2).

Various aspects, advantages, features and details of the innovative three-dimensional variable resistive element memory system are included in a description of exemplary examples thereof that follows, which description should be taken in conjunction with the accompanying drawings.

All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIG. 26A illustrates the 3D structure is terraced to provide an offset at different layers.

DESCRIPTION OF EXEMPLARY EMBODIMENTS

Figure 1:
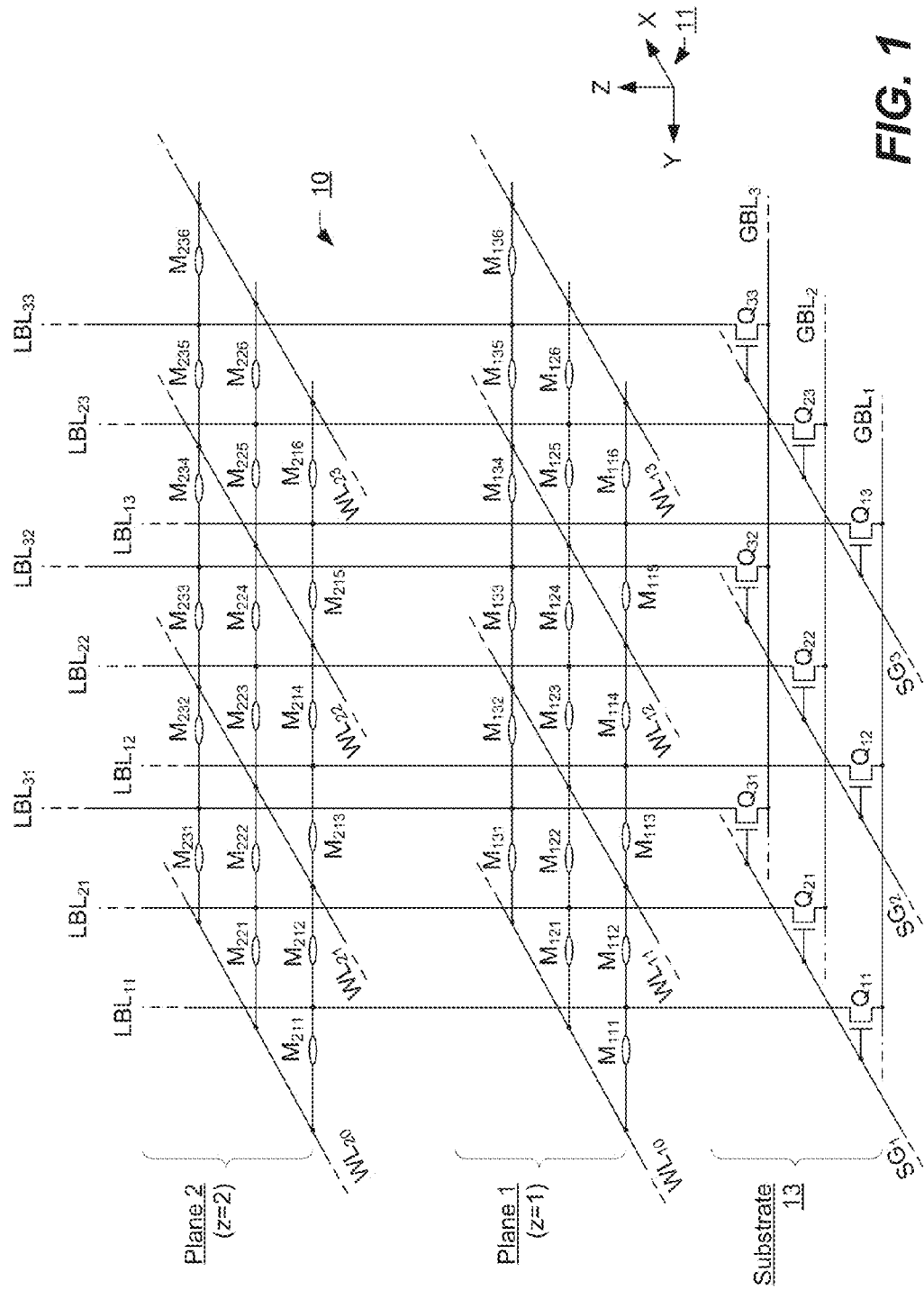
FIG. 1 is an equivalent circuit of a portion of a three-dimensional array of variable resistance memory elements, wherein the array has vertical bit lines.

Referring initially to FIG. 1, an architecture of a three-dimensional memory 10 is schematically and generally illustrated in the form of an equivalent circuit of a portion of such a memory. This is a specific example of the three-dimensional array summarized above. A standard three-dimensional rectangular coordinate system 11 is used for reference, the directions of each of vectors x, y and z being orthogonal with the other two.

A circuit for selectively connecting internal memory elements with external data circuits is preferably formed in a semiconductor substrate 13. In this specific example, a two-dimensional array of select or switching devices $Q_{xy}$ are utilized, where x gives a relative position of the device in the x-direction and y its relative position in the y-direction. The individual devices $Q_{xy}$ may be a select gate or select transistor, as examples. Global bit lines ($GBL_x$) are elongated in the y-direction and have relative positions in the x-direction that are indicated by the subscript. The global bit lines ($GBL_x$) are individually connectable with the source or drain of the select devices Q having the same position in the x-direction, although during reading and also typically programming only one select device connected with a specific global bit line is turned on at time. The other of the source or drain of the individual select devices Q is connected with one of the local bit lines ($LBL_{xy}$). The local bit lines are elongated vertically, in the z-direction, and form a regular two-dimensional array in the x (row) and y (column) directions.

In order to connect one set (in this example, designated as one row) of local bit lines with corresponding global bit lines, control gate lines $SG_y$ are elongated in the x-direction and connect with control terminals (gates) of a single row of select devices $Q_{xy}$ having a common position in the y-direction. The select devices $Q_{xy}$ therefore connect one row of local bit lines ($LBL_{xy}$) across the x-direction (having the same position in the y-direction) at a time to corresponding ones of the global bit-lines ($GBL_x$), depending upon which of the control gate lines $SG_y$ receives a voltage that turns on the select devices to which it is connected. The remaining control gate lines receive voltages that keep their connected select devices off. It may be noted that since only one select device ($Q_{xy}$) is used with each of the local bit lines ($LBL_{xy}$), the pitch of the array across the semiconductor substrate in both x and y-directions may be made very small, and thus the density of the memory storage elements large.

Memory storage elements $M_{zxy}$ are formed in a plurality of planes positioned at different distances in the z-direction above the substrate 13. Two planes 1 and 2 are illustrated in FIG. 1 but there will typically be more, such as 4, 6 or even more. In each plane at distance z, word lines $WL_{zy}$ are elongated in the x-direction and spaced apart in the y-direction between the local bit-lines ($LBL_{xy}$). The word lines $WL_{zy}$ of each plane individually cross adjacent two of the local bit-lines $LBL_{xy}$ on either side of the word lines. The individual memory storage elements $M_{zxy}$ are connected between one local bit line $LBL_{xy}$ and one word line $WL_{zy}$ adjacent these individual crossings. An individual memory element $M_{zxy}$ is therefore addressable by placing proper voltages on the local bit line $LBL_{xy}$ and word line $WL_{zy}$ between which the memory element is connected. The voltages are chosen to provide the electrical stimulus necessary to cause the state of the memory element to change from an existing state to the desired new state. The levels, duration and other characteristics of these voltages depend upon the material that is used for the memory elements.

Each "plane" of the three-dimensional memory cell structure is typically formed of at least two layers, one in which the conductive word lines $WL_{zy}$ are positioned and another of a dielectric material that electrically isolates the planes from each other. Additional layers may also be present in each plane, depending for example on the structure of the memory elements $M_{zxy}$. The planes are stacked on top of each other on a semiconductor substrate with the local bit lines $LBL_{xy}$ being connected with storage elements $M_{zxy}$ of each plane through which the local bit lines extend.

Figure 2:
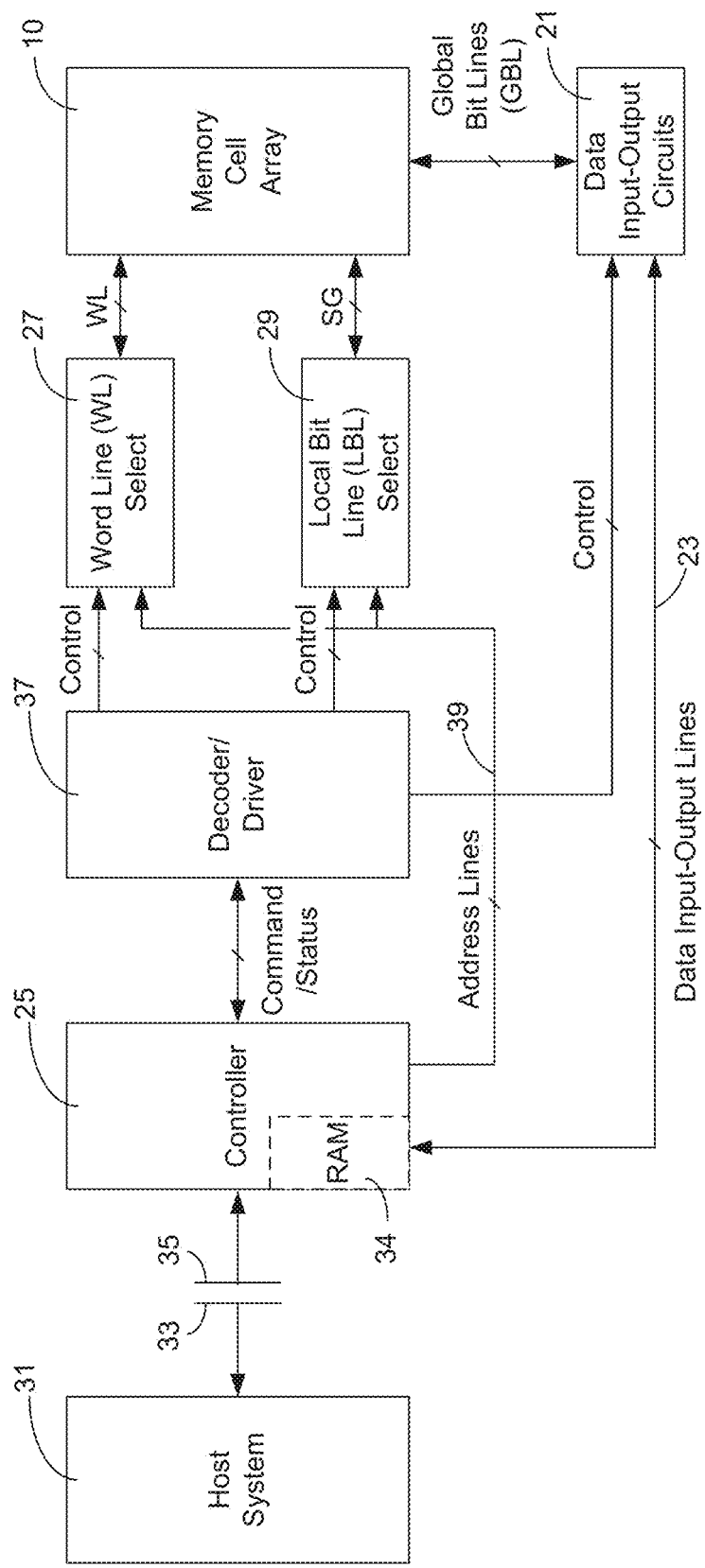
FIG. 2 is a schematic block diagram of a re-programmable non-volatile memory system which utilizes the memory cell array of FIG. 1, and which indicates connection of the memory system with a host system.

FIG. 2 is a block diagram of an illustrative memory system that can use the three-dimensional memory 10 of FIG. 1. Data input-output circuits 21 are connected to provide (during programming) and receive (during reading) analog electrical quantities in parallel over the global bit-lines $GBL_x$ of FIG. 1 that are representative of data stored in addressed storage elements $M_{zxy}$. The circuits 21 typically contain sense amplifiers for converting these electrical quantities into digital data values during reading, which digital values are then conveyed over lines 23 to a memory system controller 25. Conversely, data to be programmed into the array 10 are sent by the controller 25 to the input-output circuits 21, which then programs that data into addressed memory element by placing proper voltages on the global bit lines $GBL_x$. For binary operation, one voltage level is typically placed on a global bit line to represent a binary "1" and another voltage level to represent a binary "0". The memory elements are addressed for reading or programming by voltages placed on the word lines $WL_{zy}$ and select gate control lines $SG_y$ by respective word line select circuits 27 and local bit line circuits 29. In the specific three-dimensional array of FIG. 1, the memory elements lying between a selected word line and any of the local bit lines $LBL_{xy}$ connected at one instance through the select devices $Q_{xy}$ to the global bit lines $GBL_x$ may be addressed for programming or reading by appropriate voltages being applied through the select circuits 27 and 29.

The memory system controller 25 typically receives data from and sends data to a host system 31. The controller 25 usually contains an amount of random-access-memory (RAM) 34 for temporarily storing such data and operating information. Commands, status signals and addresses of data being read or programmed are also exchanged between the controller 25 and host 31. The memory system operates with a wide variety of host systems. They include personal computers (PCs), laptop and other portable computers, cellular telephones, personal digital assistants (PDAs), digital still cameras, digital movie cameras and portable audio players. The host typically includes a built-in receptacle 33 for one or more types of memory cards or flash drives that accepts a mating memory system plug 35 of the memory system but some hosts require the use of adapters into which a memory card is plugged, and others require the use of cables therebetween. Alternatively, the memory system may be built into the host system as an integral part thereof.

The memory system controller 25 conveys to decoder/driver circuits 37 commands received from the host. Similarly, status signals generated by the memory system are communicated to the controller 25 from the circuits 37. The circuits 37 can be simple logic circuits in the case where the controller controls nearly all of the memory operations, or can include a state machine to control at least some of the repetitive memory operations necessary to carry out given commands. Control signals resulting from decoding commands are applied from the circuits 37 to the word line select circuits 27, local bit line select circuits 29 and data input-output circuits 21. Also connected to the circuits 27 and 29 are address lines 39 from the controller that carry physical addresses of memory elements to be accessed within the array 10 in order to carry out a command from the host. The physical addresses correspond to logical addresses received from the host system 31, the conversion being made by the controller 25 and/or the decoder/driver 37. As a result, the circuits 29 partially address the designated storage elements within the array 10 by placing proper voltages on the control elements of the select devices $Q_{xy}$ to connect selected local bit lines ($LBL_{xy}$) with the global bit lines ($GBL_x$). The addressing is completed by the circuits 27 applying proper voltages to the word lines $WL_{zy}$ of the array.

Although the memory system of FIG. 2 utilizes the three-dimensional memory element array 10 of FIG. 1, the system is not limited to use of only that array architecture. A given memory system may alternatively combine this type of memory with other another type including flash memory, such as flash having a NAND memory cell array architecture, a magnetic disk drive or some other type of memory. The other type of memory may have its own controller or may in some cases share the controller 25 with the three-dimensional memory cell array 10, particularly if there is some compatibility between the two types of memory at an operational level.

Although each of the memory elements $M_{zxy}$ in the array of FIG. 1 may be individually addressed for changing its state according to incoming data or for reading its existing storage state, it is certainly preferable to program and read the array in units of multiple memory elements in parallel. In the three-dimensional array of FIG. 1, one row of memory elements on one plane may be programmed and read in parallel. The number of memory elements operated in parallel depends on the number of memory elements connected to the selected word line. In some arrays, the word lines may be segmented (not shown in FIG. 1) so that only a portion of the total number of memory elements connected along their length may be addressed for parallel operation, namely the memory elements connected to a selected one of the segments.

Previously programmed memory elements whose data have become obsolete may be addressed and re-programmed from the states in which they were previously programmed. The states of the memory elements being re-programmed in parallel will therefore most often have different starting states among them. This is acceptable for many memory element materials but it is usually preferred to re-set a group of memory elements to a common state before they are reprogrammed. For this purpose, the memory elements may be grouped into blocks, where the memory elements of each block are simultaneously reset to a common state, preferably one of the programmed states, in preparation for subsequently programming them. If the memory element material being used is characterized by changing from a first to a second state in significantly less time than it takes to be changed from the second state back to the first state, then the reset operation is preferably chosen to cause the transition taking the longer time to be made. The programming is then done faster than resetting. The longer reset time is usually not a problem since resetting blocks of memory elements containing nothing but obsolete data is typically accomplished in a high percentage of the cases in the background, therefore not adversely impacting the programming performance of the memory system.

With the use of block re-setting of memory elements, a three-dimensional array of variable resistive memory elements may be operated in a manner similar to current flash memory cell arrays. Resetting a block of memory elements to a common state corresponds to erasing a block of flash memory cells to an erased state. The individual blocks of memory elements herein may be further divided into a plurality of pages of storage elements, wherein the memory elements of a page are programmed and read together. This is like the use of pages in flash memories. The memory elements of an individual page are programmed and read together. Of course, when programming, those memory elements that are to store data that are represented by the reset state are not changed from the reset state. Those of the memory elements of a page that need to be changed to another state in order to represent the data being stored in them have their states changed by the programming operation.

Figure 3:
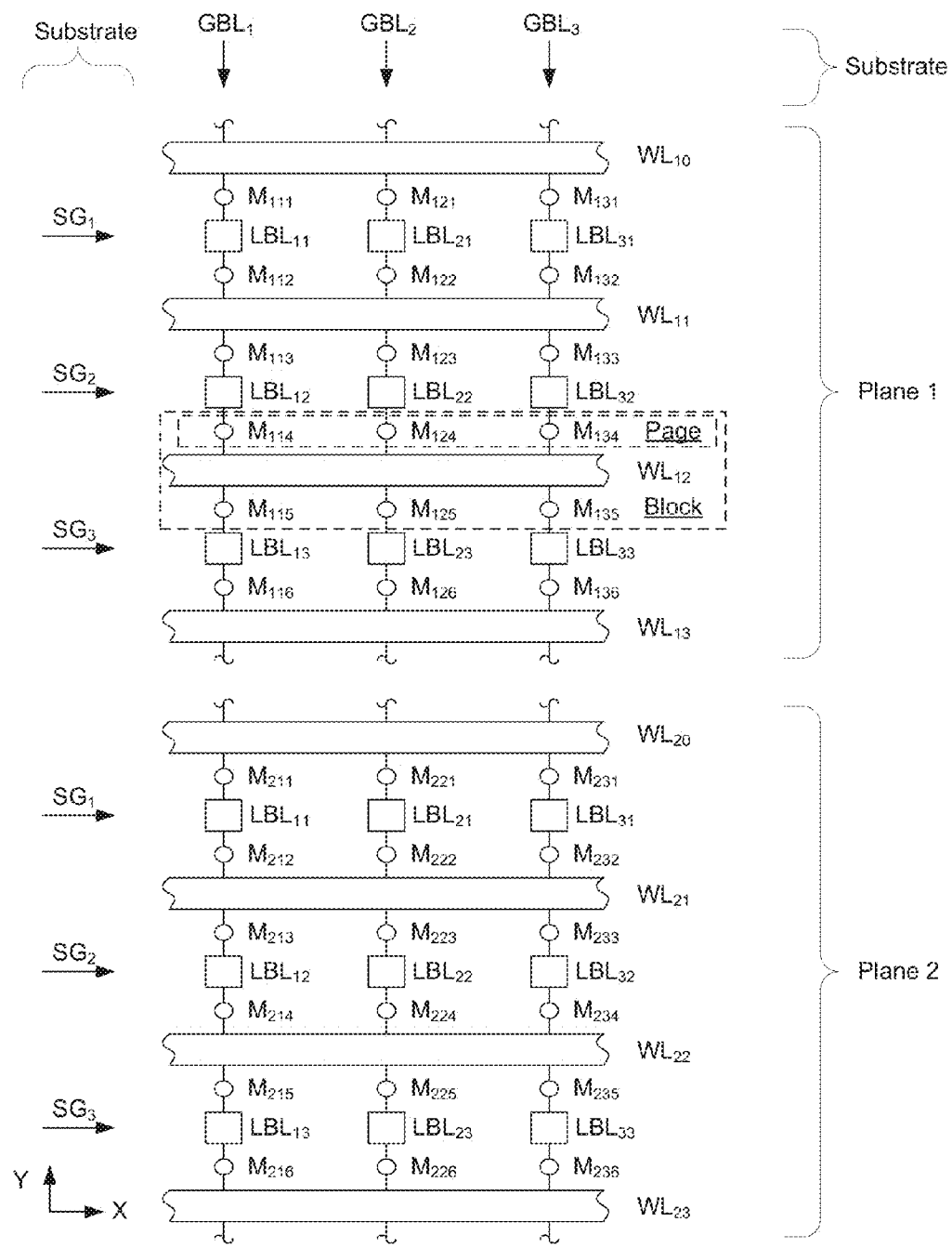
FIG. 3 provides plan views of the two planes and substrate of the three-dimensional array of FIG. 1, with some structure added.

An example of use of such blocks and pages is illustrated in FIG. 3, which provides plan schematic views of planes 1 and 2 of the array of FIG. 1. The different word lines $WL_{zy}$ that extend across each of the planes and the local bit lines $LBL_{xy}$ that extend through the planes are shown in two-dimensions. Individual blocks are made up of memory elements connected to both sides of one word line, or one segment of a word line if the word lines are segmented, in a single one of the planes. There are therefore a very large number of such blocks in each plane of the array. In the block illustrated in FIG. 3, each of the memory elements $M_{114}$, $M_{124}$, $M_{134}$, $M_{115}$, $M_{125}$ and $M_{135}$ connected to both sides of one word line $WL_{12}$ form the block. Of course, there will be many more memory elements connected along the length of a word line but only a few of them are illustrated, for simplicity. The memory elements of each block are connected between the single word line and different ones of the local bit lines, namely, for the block illustrated in FIG. 3, between the word line $WL_{12}$ and respective local bit lines $LBL_{12}$, $LBL_{22}$, $LBL_{32}$, $LBL_{13}$, $LBL_{23}$ and $LBL_{33}$.

A page is also illustrated in FIG. 3. In the specific embodiment being described, there are two pages per block. One page is formed by the memory elements along one side of the word line of the block and the other page by the memory elements along the opposite side of the word line. The example page marked in FIG. 3 is formed by memory elements $M_{114}$, $M_{124}$ and $M_{134}$. Of course, a page will typically have a very large number of memory elements in order to be able to program and read a large amount of data at one time. Only a few of the storage elements of the page of FIG. 3 are included, for simplicity in explanation.

Example resetting, programming and reading operations of the memory array of FIGS. 1 and 3, when operated as array 10 in the memory system of FIG. 2, will now be described. For these examples, each of the memory elements $M_{zxy}$ is taken to include a non-volatile memory material that can be switched between two stable states of different resistance levels by impressing voltages (or currents) of different polarity across the memory element, or voltages of the same polarity but different magnitudes and/or duration. For example, one class of material may be placed into a high resistance state by passing current in one direction through the element, and into a low resistance state by passing current in the other direction through the element. Or, in the case of switching using the same voltage polarity, one element may need a higher voltage and a shorter time to switch to a high resistance state and a lower voltage and a longer time to switch to a lower resistance state. These are the two memory states of the individual memory elements that indicate storage of one bit of data, which is either a "0" or a "1", depending upon the memory element state.

To reset (erase) a block of memory elements, the memory elements in that block are placed into their high resistance state. This state will be designated as the logical data state "1", following the convention used in current flash memory arrays but it could alternatively be designated to be a "0". As shown by the example in FIG. 3, a block includes all the memory elements that are electrically connected to one word line WL or segment thereof. A block is the smallest unit of memory elements in the array that are reset together. It can include thousands of memory elements. If a row of memory elements on one side of a word line includes 1000 of them, for example, a block will have 2000 memory elements from the two rows on either side of the word line.

The following steps may be taken to reset all the memory elements of a block, using the block illustrated in FIG. 3 as an example:

1. Set all of the global bit lines ($GBL_1$, $GBL_2$ and $GBL_3$ in the array of FIGS. 1 and 3) to zero volts, by the circuits 21 of FIG. 2.
2. Set at least the two select gate lines on either side of the one word line of the block to H' volts, so that the local bit lines on each side of the word line in the y-direction are connected to their respective global bit lines through their select devices and therefore brought to zero volts. The voltage H' is made high enough to turn on the select devices $Q_{xy}$, like something in a range of 1-3 volts, typically 2 volts. The block shown in FIG. 3 includes the word line $WL_{12}$, so the select gate lines $SG_2$ and $SG_3$ (FIG. 1) on either side of that word line are set to H' volts, by the circuits 29 of FIG. 2, in order to turn on the select devices $Q_{12}$, $Q_{22}$, $Q_{32}$, $Q_{13}$, $Q_{23}$ and $Q_{33}$. This causes each of the local bit lines $LBL_{12}$, $LBL_{22}$, $LBL_{32}$, $LBL_{13}$, $LBL_{23}$ and $LBL_{33}$ in two adjacent rows extending in the x-direction to be connected to respective ones of the global bit lines GBL1, GBL2 and GBL3. Two of the local bit lines adjacent to each other in the y-direction are connected to a single global bit line. Those local bit lines are then set to the zero volts of the global bit lines. The remaining local bit lines preferably remain unconnected and with their voltages floating.
3. Set the word line of the block being reset to H volts. This reset voltage value is dependent on the switching material in the memory element and can be between a fraction of a volt to a few volts. All other word lines of the array, including the other word lines of selected plane 1 and all the word lines on the other unselected planes, are set to zero volts. In the array of FIGS. 1 and 3, word line $WL_{12}$ is placed at H volts, while all other word lines in the array are placed at zero volts, all by the circuits 27 of FIG. 2.

The result is that H volts are placed across each of the memory elements of the block. In the example block of FIG. 3, this includes the memory elements $M_{114}$, $M_{124}$, $M_{134}$, $M_{115}$, $M_{125}$ and $M_{135}$. For the type of memory material being used as an example, the resulting currents through these memory elements places any of them not already in a high resistance state, into that re-set state.

It may be noted that no stray currents will flow because only one word line has a non-zero voltage. The voltage on the one word line of the block can cause current to flow to ground only through the memory elements of the block. There is also nothing that can drive any of the unselected and electrically floating local bit lines to H volts, so no voltage difference will exist across any other memory elements of the array outside of the block. Therefore no voltages are applied across unselected memory elements in other blocks that can cause them to be inadvertently disturbed or reset.

It may also be noted that multiple blocks may be concurrently reset by setting any combination of word lines and the adjacent select gates to H or H' respectively. In this case, the only penalty for doing so is an increase in the amount of current that is required to simultaneously reset an increased number of memory elements. This affects the size of the power supply that is required.

The memory elements of a page are preferably programmed concurrently, in order to increase the parallelism of the memory system operation. An expanded version of the page indicated in FIG. 3 is provided in FIG. 4, with annotations added to illustrate a programming operation. The individual memory elements of the page are initially in their reset state because all the memory elements of its block have previously been reset. The reset state is taken herein to represent a logical data "1". For any of these memory elements to store a logical data "0" in accordance with incoming data being programmed into the page, those memory elements are switched into their low resistance state, their set state, while the remaining memory elements of the page remain in the reset state.

For programming a page, only one row of select devices is turned on, resulting in only one row of local bit lines being connected to the global bit lines. This connection alternatively allows the memory elements of both pages of the block to be programmed in two sequential programming cycles, which then makes the number of memory elements in the reset and programming units equal.

Figure 4:
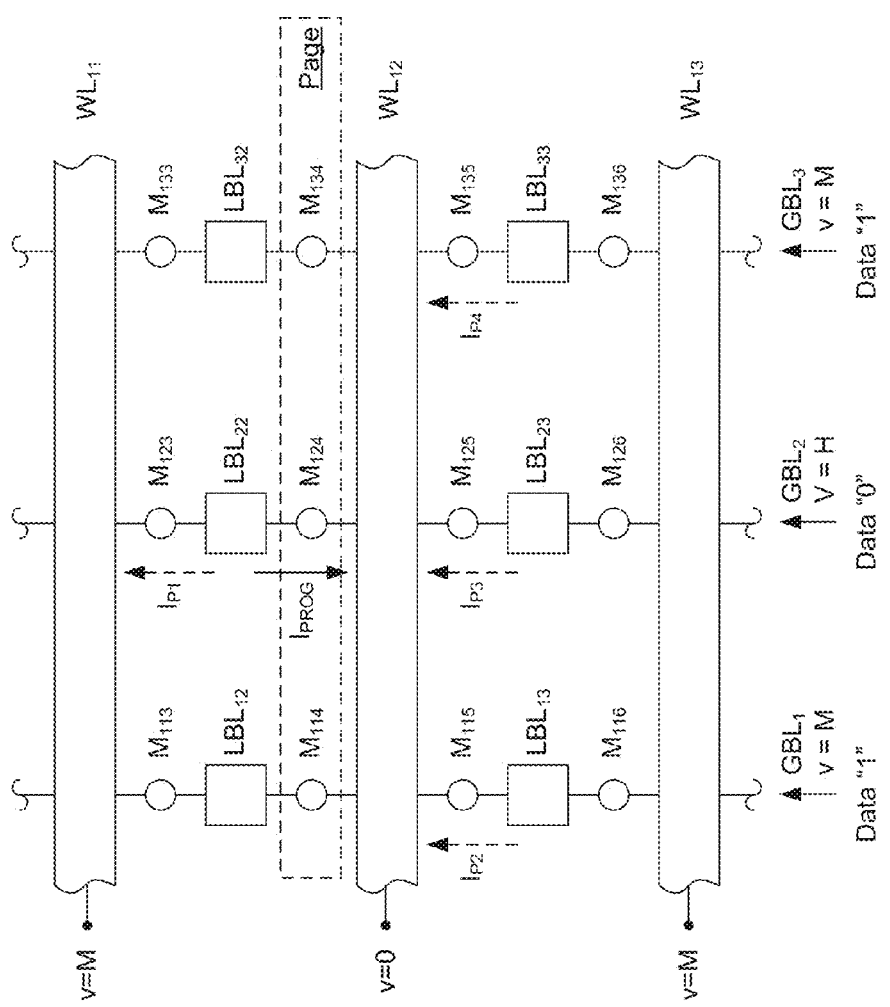
FIG. 4 is an expanded view of a portion of one of the planes of FIG. 3, annotated to show effects of programming data therein.

Referring to FIGS. 3 and 4, an example programming operation within the indicated one page of memory elements $M_{114}$, $M_{124}$ and $M_{134}$ is described, as follows:

1. The voltages placed on the global bit lines are in accordance with the pattern of data received by the memory system for programming. In the example of FIG. 4, $GBL_1$ carries logical data bit "1", $GBL_2$ the logical bit "0" and $GBL_3$ the logical bit "1." The bit lines are set respectively to corresponding voltages M, H and M, as shown, where the M level voltage is high but not sufficient to program a memory element and the H level is high enough to force a memory element into the programmed state. The M level voltage may be about one-half of the H level voltage, between zero volts and H. For example, a M level can be 0.7 volt, and a H level can be 1.5 volt. The H level used for programming is not necessary the same as the H level used for resetting or reading. In this case, according to the received data, memory elements $M_{114}$ and $M_{134}$ are to remain in their reset state, while memory element $M_{124}$ is being programmed. Therefore, the programming voltages are applied only to memory element $M_{124}$ of this page by the following steps.

2. Set the word line of the page being programmed to 0 volts, in this case selected word line $WL_{12}$. This is the only word line to which the memory elements of the page are connected. Each of the other word lines on all planes is set to the M level. These word line voltages are applied by the circuits 27 of FIG. 2.

3. Set one of the select gate lines below and on either side of the selected word line to the H' voltage level, in order to select a page for programming. For the page indicated in FIGS. 3 and 4, the H' voltage is placed on select gate line $SG_2$ in order to turn on select devices $Q_{12}$, $Q_{22}$ and $Q_{32}$ (FIG. 1). All other select gate lines, namely lines $SG_1$ and $SG_3$ in this example, are set to 0 volts in order to keep their select devices off. The select gate line voltages are applied by the circuits 29 of FIG. 2. This connects one row of local bit lines to the global bit lines and leaves all other local bit lines floating. In this example, the row of local bit lines $LBL_{12}$, $LBL_{22}$ and $LBL_{32}$ are connected to the respective global bit lines $GBL_1$, $GBL_2$ and $GBL_3$ through the select devices that are turned on, while all other local bit lines (LBLs) of the array are left floating.

The result of this operation, for the example memory element material mentioned above, is that a programming current $I_{PROG}$ is sent through the memory element $M_{124}$, thereby causing that memory element to change from a reset to a set (programmed) state. The same will occur with other memory elements (not shown) that are connected between the selected word line $WL_{12}$ and a local bit line (LBL) that has the programming voltage level H applied.

An example of the relative timing of applying the above-listed programming voltages is to initially set all the global bit lines (GBLs), the selected select gate line (SG), the selected word line and two adjacent word lines on either side of the selected word line on the one page all to the voltage level M. After this, selected ones of the GBLs are raised to the voltage level H according to the data being programmed while simultaneously dropping the voltage of the selected word line to 0 volts for the duration of the programming cycle. The word lines in plane 1 other than the selected word line $WL_{12}$ and all word lines in the unselected other planes can be weakly driven to M, some lower voltage or allowed to float in order to reduce power that must be delivered by word line drivers that are part of the circuits 27 of FIG. 2.

By floating all the local bit lines other than the selected row (in this example, all but $LBL_{12}$, $LBL_{22}$ and $LBL_{32}$), voltages can be loosely coupled to outer word lines of the selected plane 1 and word lines of other planes that are allowed to float through memory elements in their low resistance state (programmed) that are connected between the floating local bit lines and adjacent word lines. These outer word lines of the selected plane and word lines in unselected planes, although allowed to float, may eventually be driven up to voltage level M through a combination of programmed memory elements.

There are typically parasitic currents present during the programming operation that can increase the currents that must be supplied through the selected word line and global bit lines. During programming there are two sources of parasitic currents, one to the adjacent page in a different block and another to the adjacent page in the same block. An example of the first is the parasitic current $I_{P1}$ shown on FIG. 4 from the local bit line $LBL_{22}$ that has been raised to the voltage level H during programming. The memory element $M_{123}$ is connected between that voltage and the voltage level M on its word line $WL_{11}$. This voltage difference can cause the parasitic current $-I_{P1}$ to flow. Since there is no such voltage difference between the local bit lines $LBL_{12}$ or $LBL_{32}$ and the word line $WL_{11}$, no such parasitic current flows through either of the memory elements $M_{113}$ or $M_{133}$, a result of these memory elements remaining in the reset state according to the data being programmed.

Other parasitic currents can similarly flow from the same local bit line $LBL_{22}$ to an adjacent word line in other planes. The presence of these currents may limit the number of planes that can be included in the memory system since the total current may increase with the number of planes. The limitation for programming is in the current capacity of the memory power supply, so the maximum number of planes is a tradeoff between the size of the power supply and the number of planes. A number of 4-8 planes may generally be used in most cases.

The other source of parasitic currents during programming is to an adjacent page in the same block. The local bit lines that are left floating (all but those connected to the row of memory elements being programmed) will tend to be driven to the voltage level M of unselected word lines through any programmed memory element on any plane. This in turn can cause parasitic currents to flow in the selected plane from these local bit lines at the M voltage level to the selected word line that is at zero volts. An example of this is given by the currents $I_{P2}$, $I_{P3}$ and $I_{P4}$ shown in FIG. 4. In general, these currents will be much less than the other parasitic current $I_{P1}$ discussed above, since these currents flow only through those memory elements in their conductive state that are adjacent to the selected word line in the selected plane.

The above-described programming techniques ensure that the selected page is programmed (local bit lines at H, selected word line at 0) and that adjacent unselected word lines are at M. As mentioned earlier, other unselected word lines can be weakly driven to M or initially driven to M and then left floating. Alternately, word lines in any plane distant from the selected word line (for example, more than 5 word lines away) can also be left uncharged (at ground) or floating because the parasitic currents flowing to them are so low as to be negligible compared to the identified parasitic currents since they must flow through a series combination of five or more ON devices (devices in their low resistance state). This can reduce the power dissipation caused by charging a large number of word lines.

While the above description assumes that each memory element of the page being programmed will reach its desired ON value with one application of a programming pulse, a program-verify technique commonly used in NOR or NAND flash memory technology may alternately be used. In this process, a complete programming operation for a given page includes of a series of individual programming operations in which a smaller change in ON resistance occurs within each program operation. Interspersed between each program operation is a verify (read) operation that determines whether an individual memory element has reached its desired programmed level of resistance or conductance consistent with the data being programmed in the memory element. The sequence of program/verify is terminated for each memory element as it is verified to reach the desired value of resistance or conductance. After all of memory elements being programmed are verified to have reached their desired programmed value, programming of the page of memory elements is then completed. An example of this technique is described in U.S. Pat. No. 5,172,338.

Figure 5:
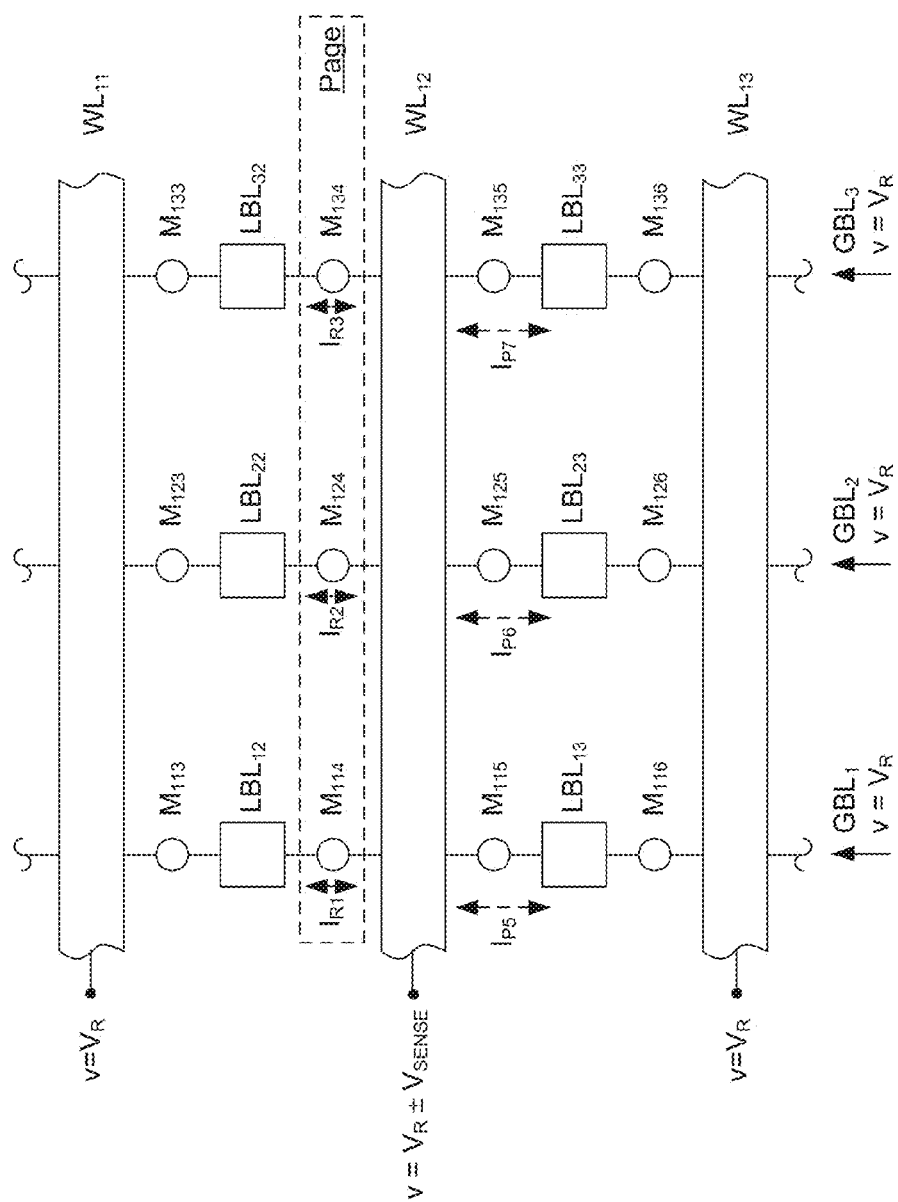
FIG. 5 is an expanded view of a portion of one of the planes of FIG. 3, annotated to show effects of reading data therefrom.

With reference primarily to FIG. 5, the parallel reading of the states of a page of memory elements, such as the memory elements $M_{114}$, $M_{124}$ and $M_{134}$, is described. The steps of an example reading process are as follows:

1. Set all the global bit lines GBLs and all the word lines WL to a voltage $V_R$. The voltage $V_R$ is simply a convenient reference voltage and can be any number of values but will typically be between 0 and 1 volt. In general, for operating modes where repeated reads occur, it is convenient to set all word lines in the array to $V_R$ in order to reduce parasitic read currents, even though this requires charging all the word lines. However, as an alternative, it is only necessary to raise the selected word line ($WL_{12}$ in FIG. 5), the word line in each of the other planes that is in the same position as the selected word line and the immediately adjacent word lines in all planes to $V_R$.
2. Turn on one row of select devices by placing a voltage on the control line adjacent to the selected word line in order to define the page to be read. In the example of FIGS. 1 and 5, a voltage is applied to the control line $SG_2$ in order to turn on the select devices $Q_{12}$, $Q_{22}$ and $Q_{32}$. This connects one row of local bit lines $LBL_{12}$, $LBL_{22}$ and $LBL_{32}$ to their respective global bit lines $GBL_1$, $GBL_2$ and $GBL_3$. These local bit lines are then connected to individual sense amplifiers (SA) that are present in the circuits 21 of FIG. 2, and assume the potential $V_R$ of the global bit lines to which they are connected. All other local bit lines LBLs are allowed to float.
3. Set the selected word line ($WL_{12}$) to a voltage of $V_R \pm V$sense. The sign of Vsense is chosen based on the sense amplifier and has a magnitude of about 0.5 volt. The voltages on all other word lines remain the same.
4. Sense current flowing into ($V_R$+Vsense) or out of ($V_R$-Vsense) each sense amplifier for time T. These are the currents $I_{R1}$, $I_{R2}$ and $I_{R3}$ shown to be flowing through the addressed memory elements of the example of FIG. 5, which are proportional to the programmed states of the respective memory elements $M_{114}$, $M_{124}$ and $M_{134}$. The states of the memory elements $M_{114}$, $M_{124}$ and $M_{134}$ are then given by binary outputs of the sense amplifiers within the circuits 21 that are connected to the respective global bit lines $GBL_1$, $GBL_2$ and $GBL_3$. These sense amplifier outputs are then sent over the lines 23 (FIG. 2) to the controller 25, which then provides the read data to the host 31.
5. Turn off the select devices ($Q_{12}$, $Q_{22}$ and $Q_{32}$) by removing the voltage from the select gate line ($SG_2$), in order to disconnect the local bit lines from the global bit lines, and return the selected word line ($WL_{12}$) to the voltage $V_R$.

Parasitic currents during such a read operation have two undesirable effects. As with programming, parasitic currents place increased demands on the memory system power supply. In addition, it is possible for parasitic currents to exist that are erroneously included in the currents though the addressed memory elements that are being read. This can therefore lead to erroneous read results if such parasitic currents are large enough.

As in the programming case, all of the local bit lines except the selected row ($LBL_{12}$, $LBL_{22}$ and $LBL_{32}$ in the example of FIG. 5) are floating. But the potential of the floating local bit lines may be driven to $V_R$ by any memory element that is in its programmed (low resistance) state and connected between a floating local bit line and a word line at $V_R$, in any plane. A parasitic current comparable to $I_{P1}$ in the programming case (FIG. 4) is not present during data read because both the selected local bit lines and the adjacent non-selected word lines are both at $V_R$. Parasitic currents may flow, however, through low resistance memory elements connected between floating local bit lines and the selected word line. These are comparable to the currents $I_{P2}$, $I_{P3}$, and $I_{P4}$ during programming (FIG. 4), indicated as $I_{P5}$, $I_{P6}$ and $I_{P7}$ in FIG. 5. Each of these currents can be equal in magnitude to the maximum read current through an addressed memory element. However, these parasitic currents are flowing from the word lines at the voltage $V_R$ to the selected word line at a voltage $V_R \pm V$sense without flowing through the sense amplifiers. These parasitic currents will not flow through the selected local bit lines ($LBL_{12}$, $LBL_{22}$ and $LBL_{32}$ in FIG. 5) to which the sense amplifiers are connected. Although they contribute to power dissipation, these parasitic currents do not therefore introduce a sensing error.

Although the neighboring word lines should be at $V_R$ to minimize parasitic currents, as in the programming case it may be desirable to weakly drive these word lines or even allow them to float. In one variation, the selected word line and the neighboring word lines can be pre-charged to $V_R$ and then allowed to float. When the sense amplifier is energized, it may charge them to $V_R$ so that the potential on these lines is accurately set by the reference voltage from the sense amplifier (as opposed to the reference voltage from the word line driver). This can occur before the selected word line is changed to $V_R \pm V$sense but the sense amplifier current is not measured until this charging transient is completed.

Reference cells may also be included within the memory array 10 to facilitate any or all of the common data operations (erase, program, or read). A reference cell is a cell that is structurally as nearly identical to a data cell as possible in which the resistance is set to a particular value. They are useful to cancel or track resistance drift of data cells associated with temperature, process non-uniformities, repeated programming, time or other cell properties that may vary during operation of the memory. Typically they are set to have a resistance above the highest acceptable low resistance value of a memory element in one data state (such as the ON resistance) and below the lowest acceptable high resistance value of a memory element in another data state (such as the OFF resistance). Reference cells may be "global" to a plane or the entire array, or may be contained within each block or page.

In one embodiment, multiple reference cells may be contained within each page. The number of such cells may be only a few (less than 10), or may be up to a several percent of the total number of cells within each page. In this case, the reference cells are typically reset and written in a separate operation independent of the data within the page. For example, they may be set one time in the factory, or they may be set once or multiple times during operation of the memory array. During a reset operation described above, all of the global bit lines are set low, but this can be modified to only set the global bit lines associated with the memory elements being reset to a low value while the global bit lines associated with the reference cells are set to an intermediate value, thus inhibiting them from being reset. Alternately, to reset reference cells within a given block, the global bit lines associated with the reference cells are set to a low value while the global bit lines associated with the data cells are set to an intermediate value. During programming, this process is reversed and the global bit lines associated with the reference cells are raised to a high value to set the reference cells to a desired ON resistance while the memory elements remain in the reset state. Typically the programming voltages or times will be changed to program reference cells to a higher ON resistance than when programming memory elements.

If, for example, the number of reference cells in each page is chosen to be 1% of the number of data storage memory elements, then they may be physically arranged along each word line such that each reference cell is separated from its neighbor by 100 data cells, and the sense amplifier associated with reading the reference cell can share its reference information with the intervening sense amplifiers reading data. Reference cells can be used during programming to ensure the data is programmed with sufficient margin. Further information regarding the use of reference cells within a page can be found in U.S. Pat. Nos. 6,222,762, 6,538,922, 6,678,192 and 7,237,074.

In a particular embodiment, reference cells may be used to approximately cancel parasitic currents in the array. In this case the value of the resistance of the reference cell(s) is set to that of the reset state rather than a value between the reset state and a data state as described earlier. The current in each reference cell can be measured by its associated sense amplifier and this current subtracted from neighboring data cells. In this case, the reference cell is approximating the parasitic currents flowing in a region of the memory array that tracks and is similar to the parasitic currents flowing in that region of the array during a data operation. This correction can be applied in a two step operation (measure the parasitic current in the reference cells and subsequently subtract its value from that obtained during a data operation) or simultaneously with the data operation. One way in which simultaneous operation is possible is to use the reference cell to adjust the timing or reference levels of the adjacent data sense amplifiers. An example of this is shown in U.S. Pat. No. 7,324,393.

In conventional two-dimensional arrays of variable resistance memory elements, a diode is usually included in series with the memory element between the crossing bit and word lines. The primary purpose of the diodes is to reduce the number and magnitudes of parasitic currents during resetting (erasing), programming and reading the memory elements. A significant advantage of the three-dimensional array herein is that resulting parasitic currents are fewer and therefore have a reduced negative effect on operation of the array than in other types of arrays.

Diodes may also be connected in series with the individual memory elements of the three-dimensional array, as currently done in other arrays of variable resistive memory elements, in order to reduce further the number of parasitic currents but there are disadvantages in doing so. Primarily, the manufacturing process becomes more complicated. Added masks and added manufacturing steps are then necessary. Also, since formation of the silicon p-n diodes often requires at least one high temperature step, the word lines and local bit lines cannot then be made of metal having a low melting point, such as aluminum that is commonly used in integrated circuit manufacturing, because it may melt during the subsequent high temperature step. Use of a metal, or composite material including a metal, is preferred because of its higher conductivity than the conductively doped polysilicon material that is typically used for bit and word lines because of being exposed to such high temperatures. An example of an array of resistive switching memory elements having a diode formed as part of the individual memory elements is given in patent application publication no. US 2009/0001344 A1.

Because of the reduced number of parasitic currents in the three-dimensional array herein, the total magnitude of parasitic currents can be managed without the use of such diodes. In addition to the simpler manufacturing processes, the absence of the diodes allows bi-polar operation; that is, an operation in which the voltage polarity to switch the memory element from its first state to its second memory state is opposite of the voltage polarity to switch the memory element from its second to its first memory state. The advantage of the bi-polar operation over a unipolar operation (same polarity voltage is used to switch the memory element from its first to second memory state as from its second to first memory state) is the reduction of power to switch the memory element and an improvement in the reliability of the memory element. These advantages of the bi-polar operation are seen in memory elements in which formation and destruction of a conductive filament is the physical mechanism for switching, as in the memory elements made from metal oxides and solid electrolyte materials.

The level of parasitic currents increases with the number of planes and with the number of memory elements connected along the individual word lines within each plane. But since the number of word lines on each plane does not significantly affect the amount of parasitic current, the planes may individually include a large number of word lines. The parasitic currents resulting from a large number of memory elements connected along the length of individual word lines can further be managed by segmenting the word lines into sections of fewer numbers of memory elements. Erasing, programming and reading operations are then performed on the memory elements connected along one segment of each word line instead of the total number of memory elements connected along the entire length of the word line.

The re-programmable non-volatile memory array being described herein has many advantages. The quantity of digital data that may be stored per unit of semiconductor substrate area is high. It may be manufactured with a lower cost per stored bit of data. Only a few masks are necessary for the entire stack of planes, rather than requiring a separate set of masks for each plane. The number of local bit line connections with the substrate is significantly reduced over other multi-plane structures that do not use the vertical local bit lines. The architecture eliminates the need for each memory cell to have a diode in series with the resistive memory element, thereby further simplifying the manufacturing process and enabling the use of metal conductive lines. Also, the voltages necessary to operate the array are much lower than those used in current commercial flash memories.

Since at least one-half of each current path is vertical, the voltage drops present in large cross-point arrays are significantly reduced. The reduced length of the current path due to the shorter vertical component means that there are approximately one-half the number memory cells on each current path and thus the leakage currents are reduced as is the number of unselected cells disturbed during a data programming or read operation. For example, if there are N cells associated with a word line and N cells associated with a bit line of equal length in a conventional array, there are 2N cells associated or "touched" with every data operation. In the vertical local bit line architecture described herein, there are n cells associated with the bit line (n is the number of planes and is typically a small number such as 4 to 8), or N+n cells are associated with a data operation. For a large N this means that the number of cells affected by a data operation is approximately one-half as many as in a conventional three-dimensional array.

Materials Useful for the Memory Storage Elements

The material used for the non-volatile memory storage elements $M_{zxy}$ in the array of FIG. 1 can be a chalcogenide, a metal oxide, or any one of a number of materials that exhibit a stable, reversible shift in resistance in response to an external voltage applied to or current passed through the material.

Figure 6:
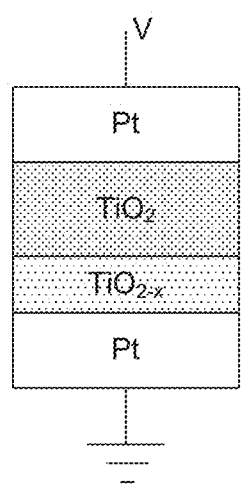
FIG. 6 illustrates an example memory storage element.

Metal oxides are characterized by being insulating when initially deposited. One suitable metal oxide is a titanium oxide ($TiO_x$). A previously reported memory element using this material is illustrated in FIG. 6. In this case, near-stoichiometric $TiO_2$ bulk material is altered in an annealing process to create an oxygen deficient layer (or a layer with oxygen vacancies) in proximity of the bottom electrode. The top platinum electrode, with its high work function, creates a high potential $Pt/TiO_2$ barrier for electrons. As a result, at moderate voltages (below one volt), a very low current will flow through the structure. The bottom $Pt/TiO_{2-x}$ barrier is lowered by the presence of the oxygen vacancies ($O^+_2$) and behaves as a low resistance contact (ohmic contact). (The oxygen vacancies in $TiO_2$ are known to act as n-type dopant, transforming the insulating oxide in an electrically conductive doped semiconductor.) The resulting composite structure is in a non-conductive (high resistance) state.

But when a large negative voltage (such as 1.5 volt) is applied across the structure, the oxygen vacancies drift toward the top electrode and, as a result, the potential barrier $Pt/TiO_2$ is reduced and a relatively high current can flow through the structure. The device is then in its low resistance (conductive) state. Experiments reported by others have shown that conduction is occurring in filament-like regions of the $TiO_2$, perhaps along grain boundaries.

The conductive path is broken by applying a large positive voltage across the structure of FIG. 6. Under this positive bias, the oxygen vacancies move away from the proximity of the top $Pt/TiO_2$ barrier, and "break" the filament. The device returns to its high resistance state. Both of the conductive and non-conductive states are non-volatile. Sensing the conduction of the memory storage element by applying a voltage around 0.5 volts can easily determine the state of the memory element.

While this specific conduction mechanism may not apply to all metal oxides, as a group, they have a similar behavior: transition from a low conductive state to a high conductive occurs state when appropriate voltages are applied, and the two states are non-volatile. Examples of other materials include HfOx, ZrOx, WOx, NiOx, CoOx, CoalOx, MnOx, $ZnMn_2O_4$, ZnOx, TaOx, NbOx, HfSiOx, HfAlOx. Suitable top electrodes include metals with a high work function (typically >4.5 eV) capable to getter oxygen in contact with the metal oxide to create oxygen vacancies at the contact. Some examples are TaCN, TiCN, Ru, RuO, Pt, Ti rich TiOx, TiAlN, TaAlN, TiSiN, TaSiN, $IrO_2$. Suitable materials for the bottom electrode are any conducting oxygen rich material such as Ti(O)N, Ta(O)N, TiN and TaN. The thicknesses of the electrodes are typically 1 nm or greater. Thicknesses of the metal oxide are generally in the range of 5 nm to 50 nm.

Another class of materials suitable for the memory storage elements is solid electrolytes but since they are electrically conductive when deposited, individual memory elements need to be formed and isolated from one another. Solid electrolytes are somewhat similar to the metal oxides, and the conduction mechanism is assumed to be the formation of a metallic filament between the top and bottom electrode. In this structure the filament is formed by dissolving ions from one electrode (the oxidizable electrode) into the body of the cell (the solid electrolyte). In one example, the solid electrolyte contains silver ions or copper ions, and the oxidizable electrode is preferably a metal intercalated in a transition metal sulfide or selenide material such as $A_x(MB2)_{1-x}$, where A is Ag or Cu, B is S or Se, and M is a transition metal such as Ta, V, or Ti, and x ranges from about 0.1 to about 0.7. Such a composition minimizes oxidizing unwanted material into the solid electrolyte. One example of such a composition is $Ag_x(TaS2)_{1-x}$. Alternate composition materials include α-AgI. The other electrode (the indifferent or neutral electrode) should be a good electrical conductor while remaining insoluble in the solid electrolyte material. Examples include metals and compounds such as W, Ni, Mo, Pt, metal silicides, and the like.

Examples of solid electrolytes materials are: TaO, GeSe or GeS. Other systems suitable for use as solid electrolyte cells are: Cu/TaO/W, Ag/GeSe/W, Cu/GeSe/W, Cu/GeS/W, and Ag/GeS/W, where the first material is the oxidizable electrode, the middle material is the solid electrolyte, and the third material is the indifferent (neutral) electrode. Typical thicknesses of the solid electrolyte are between 30 nm and 100 nm.

In recent years, carbon has been extensively studied as a non-volatile memory material. As a non-volatile memory element, carbon is usually used in two forms, conductive (or grapheme like-carbon) and insulating (or amorphous carbon). The difference in the two types of carbon material is the content of the carbon chemical bonds, so called $sp^2$ and $sp^3$ hybridizations. In the $sp^3$ configuration, the carbon valence electrons are kept in strong covalent bonds and as a result the $sp^3$ hybridization is non-conductive. Carbon films in which the $sp^3$ configuration dominates, are commonly referred to as tetrahedral-amorphous carbon, or diamond like. In the $sp^2$ configuration, not all the carbon valence electrons are kept in covalent bonds. The weak tight electrons (phi bonds) contribute to the electrical conduction making the mostly $sp^2$ configuration a conductive carbon material. The operation of the carbon resistive switching nonvolatile memories is based on the fact that it is possible to transform the $sp^3$ configuration to the $sp^2$ configuration by applying appropriate current (or voltage) pulses to the carbon structure. For example, when a very short (1-5 ns) high amplitude voltage pulse is applied across the material, the conductance is greatly reduced as the material $sp^2$ changes into an $sp^3$ form ("reset" state). It has been theorized that the high local temperatures generated by this pulse causes disorder in the material and if the pulse is very short, the carbon "quenches" in an amorphous state ($sp^3$ hybridization). On the other hand, when in the reset state, applying a lower voltage for a longer time (~300 nsec) causes part of the material to change into the $sp^2$ form ("set" state). The carbon resistance switching non-volatile memory elements have a capacitor like configuration where the top and bottom electrodes are made of high temperature melting point metals like W, Pd, Pt and TaN.

There has been significant attention recently to the application of carbon nanotubes (CNTs) as a non-volatile memory material. A (single walled) carbon nanotube is a hollow cylinder of carbon, typically a rolled and self-closing sheet one carbon atom thick, with a typical diameter of about 1-2 nm and a length hundreds of times greater. Such nanotubes can demonstrate very high conductivity, and various proposals have been made regarding compatibility with integrated circuit fabrication. It has been proposed to encapsulate "short" CNT's within an inert binder matrix to form a fabric of CNT's. These can be deposited on a silicon wafer using a spin-on or spray coating, and as applied the CNT's have a random orientation with respect to each other. When an electric field is applied across this fabric, the CNT's tend to flex or align themselves such that the conductivity of the fabric is changed. The switching mechanism from low-to-high resistance and the opposite is not well understood. As in the other carbon based resistive switching non-volatile memories, the CNT based memories have capacitor-like configurations with top and bottom electrodes made of high melting point metals such as those mentioned above.

Yet another class of materials suitable for the memory storage elements is phase-change materials. A preferred group of phase-change materials includes chalcogenide glasses, often of a composition $Ge_xSb_yTe_z$, where preferably $x=2$, $y=2$ and $z=5$. GeSb has also been found to be useful. Other materials include AgInSbTe, GeTe, GaSb, BaSbTe, InSbTe and various other combinations of these basic elements. Thicknesses are generally in the range of 1 nm to 500 nm. The generally accepted explanation for the switching mechanism is that when a high energy pulse is applied for a very short time to cause a region of the material to melt, the material "quenches" in an amorphous state, which is a low conductive state. When a lower energy pulse is applied for a longer time such that the temperature remains above the crystallization temperature but below the melting temperature, the material crystallizes to form poly-crystal phases of high conductivity. These devices are often fabricated using sub-lithographic pillars, integrated with heater electrodes. Often the localized region undergoing the phase change may be designed to correspond to a transition over a step edge, or a region where the material crosses over a slot etched in a low thermal conductivity material. The contacting electrodes may be any high melting metal such as TiN, W, WN and TaN in thicknesses from 1 nm to 500 nm.

It will be noted that the memory materials in most of the foregoing examples utilize electrodes on either side thereof whose compositions are specifically selected. In embodiments of the three-dimensional memory array herein where the word lines (WL) and/or local bit lines (LBL) also form these electrodes by direct contact with the memory material, those lines are preferably made of the conductive materials described above. In embodiments using additional conductive segments for at least one of the two memory element electrodes, those segments are therefore made of the materials described above for the memory element electrodes.

Steering elements are commonly incorporated into controllable resistance types of memory storage elements. Steering elements can be a transistor or a diode. Although an advantage of the three-dimensional architecture described herein is that such steering elements are not necessary, there may be specific configurations where it is desirable to include steering elements. The diode can be a p-n junction (not necessarily of silicon), a metal/insulator/insulator/metal (MIIM), or a Schottky type metal/semiconductor contact but can alternately be a solid electrolyte element. A characteristic of this type of diode is that for correct operation in a memory array, it is necessary to be switched "on" and "off" during each address operation. Until the memory element is addressed, the diode is in the high resistance state ("off" state) and "shields" the resistive memory element from disturb voltages. To access a resistive memory element, three different operations are needed: a) convert the diode from high resistance to low resistance, b) program, read, or reset (erase) the memory element by application of appropriate voltages across or currents through the diode, and c) reset (erase) the diode. In some embodiments one or more of these operations can be combined into the same step. Resetting the diode may be accomplished by applying a reverse voltage to the memory element including a diode, which causes the diode filament to collapse and the diode to return to the high resistance state.

For simplicity the above description has consider the simplest case of storing one data value within each cell: each cell is either reset or set and holds one bit of data. However, the techniques of the present application are not limited to this simple case. By using various values of ON resistance and designing the sense amplifiers to be able to discriminate between several of such values, each memory element can hold multiple-bits of data in a multiple-level cell (MLC). The principles of such operation are described in U.S. Pat. No. 5,172,338 referenced earlier. Examples of MLC technology applied to three dimensional arrays of memory elements include an article entitled "Multi-bit Memory Using Programmable Metallization Cell Technology" by Kozicki et al., Proceedings of the International Conference on Electronic Devices and Memory, Grenoble, France, Jun. 12-17, 2005, pp. 48-53 and "Time Discrete Voltage Sensing and Iterative Programming Control for a 4F2 Multilevel CBRAM" by Schrogmeier et al. (2007 Symposium on VLSI Circuits).

Specific Structural Examples of the Three-Dimensional Array

Three alternative semiconductor structures for implementing the three-dimensional memory element array of FIG. 1 are now described.

Figure 7:
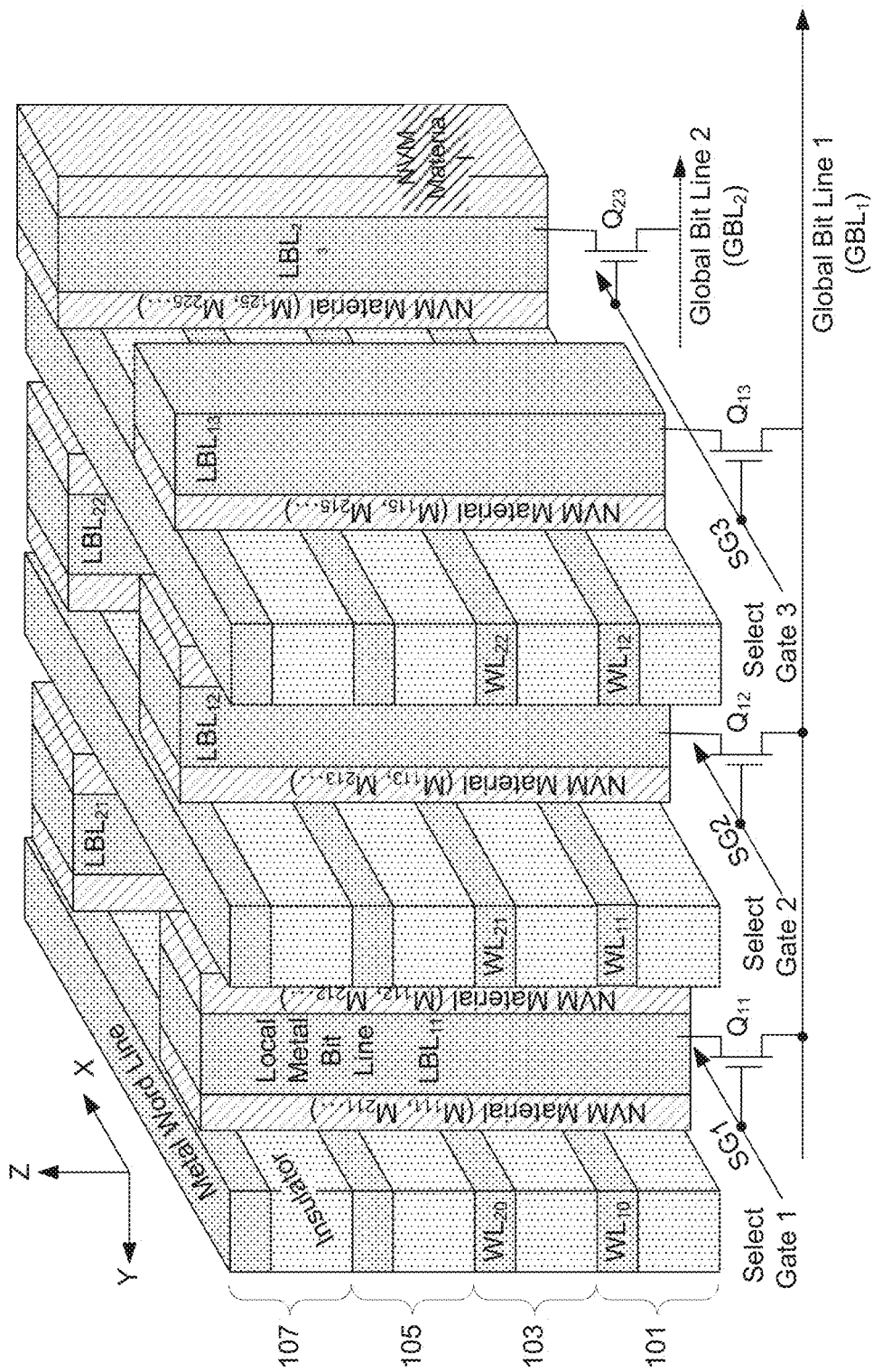
FIG. 7 is an isometric view of a portion of the three-dimensional array shown in FIG. 1 according to a first specific example of an implementation thereof

A first example, illustrated in FIG. 7, is configured for use of memory element (NVM) material that is non-conductive when first deposited. A metal oxide of the type discussed above has this characteristic. As explained with respect to FIG. 6, conductive filaments are formed between electrodes on opposite sides of the material in response to appropriate voltages placed on those electrodes. These electrodes are a bit line and a word line in the array. Since the material is otherwise non-conductive, there is no necessity to isolate the memory elements at the cross-points of the word and bit lines from each other. Several memory elements may be implemented by a single continuous layer of material, which in the case of FIG. 7 are strips of NVM material oriented vertically along opposite sides of the vertical bit lines in the y-direction and extending upwards through all the planes. A significant advantage of the structure of FIG. 7 is that all word lines and strips of insulation under them in a group of planes may be defined simultaneously by use of a single mask, thus greatly simplifying the manufacturing process.

Referring to FIG. 7, a small part of four planes 101, 103, 105 and 107 of the three-dimensional array are shown. Elements of the FIG. 7 array that correspond to those of the equivalent circuit of FIG. 1 are identified by the same reference numbers. It will be noted that FIG. 7 shows the two planes 1 and 2 of FIG. 1 plus two additional planes on top of them. All of the planes have the same horizontal pattern of gate, dielectric and memory storage element (NVM) material. In each plane, metal word lines (WL) are elongated in the x-direction and spaced apart in the y-direction. Each plane includes a layer of insulating dielectric that isolates its word lines from the word lines of the plane below it or, in the case of plane 101, of the substrate circuit components below it. Extending through each plane is a collection of metal local bit line (LBL) "pillars" elongated in the vertical z-direction and forming a regular array in the x-y direction.

Each bit line pillar is connected to one of a set of global bit lines (GBL) in the silicon substrate running in the y-direction at the same pitch as the pillar spacing through the select devices ($Q_{xy}$) formed in the substrate whose gates are driven by the select gate lines (SG) elongated in the x-direction, which are also formed in the substrate. The switching devices $Q_{xy}$ may be conventional CMOS transistors (or vertical npn transistors) and fabricated using the same process as used to form the other conventional circuitry. In the case of using npn transistors instead of MOS transistors, the select gate (SG) lines are replaced with the base contact electrode lines elongated in the x-direction. Also fabricated in the substrate but not shown in FIG. 7 are sense amplifiers, input-output (I/O) circuitry, control circuitry, and any other necessary peripheral circuitry. There is one select gate line (SG) for each row of local bit line pillars in the x-direction and one select device (Q) for each individual local bit line (LBL).

Each vertical strip of non-volatile memory element (NVM) material is sandwiched between the vertical local bit lines (LBL) and a plurality of word lines (WL) vertically stacked in all the planes. Preferably the NVM material is present between the local bit lines (LBL) in the x-direction. A memory storage element (M) is located at each intersection of a word line (WL) and a local bit line (LBL). In the case of a metal oxide described above for the memory storage element material, a small region of the NVM material between an intersecting local bit line (LBL) and word line (WL) is controllably alternated between conductive (set) and non-conductive (reset) states by appropriate voltages applied to the intersecting lines.

There may also be a parasitic NVM element formed between the LBL and the dielectric between planes. By choosing the thickness of the dielectric strips to be large compared to the thickness of the NVM material layer (that is, the spacing between the local bit lines and the word lines), a field caused by differing voltages between word lines in the same vertical word line stack can be made small enough so that the parasitic element never conducts a significant amount of current. Similarly, in other embodiments, the non-conducting NVM material may be left in place between adjacent local bit lines if the operating voltages between the adjacent LBLs remain below the programming threshold.

An outline of a process for fabricating the structure of FIG. 7 is as follows:

1. The support circuitry, including the select devices Q, global bit lines GBL, select gate lines SG and other circuits peripheral to the array, is formed in the silicon substrate in a conventional fashion and the top surface of this circuitry is planarized, such as by etching with use of a layer of etch stop material placed over the circuitry.
2. Alternating layers of dielectric (insulator) and metal are formed as sheets on top of each other and over at least the area of the substrate in which the select devices Q are formed. In the example of FIG. 7, four such sheets are formed.
3. These sheets are then etched (isolated) by using a mask formed over the top of them that has slits elongated in the x-direction and spaced apart in the y-direction. All of the material is removed down to the etch stop in order to form the trenches shown in FIG. 7 in which the local bit line (LBL) pillars and NVM material is later formed. Contact holes are also etched through the etch stop material layer at the bottom of the trenches to allow access to the drains of the select devices Q at the positions of the subsequently formed pillars. The formation of the trenches also defines the width in the y-direction of the word lines (WL).
4. Non-volatile memory (NVM) material is deposited in thin layers along the sidewalls of these trenches and across the structure above the trenches. This leaves the NVM material along the opposing sidewalls of each of the trenches and in contact with the word line (WL) surfaces that are exposed into the trenches.
5. Metal is then deposited in these trenches in order to make contact with the non-volatile memory (NVM) material. The metal is patterned using a mask with slits in the y-direction. Removal of the metal material by etching through this mask leaves the local bit line (LBL) pillars. The non-volatile memory (NVM) material in the x-direction may also be removed between pillars. The space between pillars in the x-direction is then filled with a dielectric material and planarized back to the top of the structure.

A significant advantage of the configuration of FIG. 7 is that only one etching operation through a single mask is required to form the trenches through all the layers of material of the planes at one time. However, process limitations may limit the number of planes that can be etched together in this manner. If the total thickness of all the layers is too great, the trench may need to be formed in sequential steps. A first number of layers are etched and, after a second number of layers have been formed on top of the first number of trenched layers, the top layers are subjected to a second etching step to form trenches in them that are aligned with the trenches in the bottom layers. This sequence may be repeated even more times for an implementation having a very large number of layers.

Figure 8:
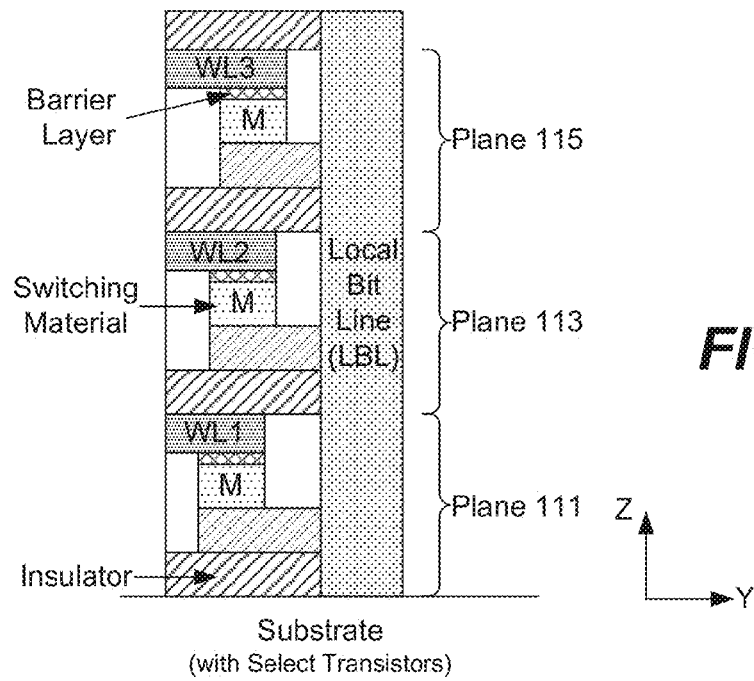
FIG. 8 is cross-section of a portion of the three-dimensional array shown in FIG. 1 according to a second specific example of an implementation thereof.

A second example of implementing the three-dimensional memory cell array of FIG. 1 is illustrated by FIG. 8, and a process of forming this structure is outlined with respect to FIGS. 9-14. This structure is configured to use any type of material for the non-volatile memory storage elements, electrically conductive or non-conductive when deposited on the structure, such as those described above. The NVM element is isolated from the LBL and is sandwiched between the bottom metal electrode and the word line. The bottom electrode makes electrical contact with the LBL while the word line is electrically isolated from the LBL through an insulator. The NVM elements at the intersections of the local bit lines (LBL) and word lines (WL) are electrically isolated from one another in the x and z-directions.

FIG. 8 shows a portion of each of three planes 111, 113 and 115 of this second structural example on only one side of a local bit line (LBL). The word lines (WL) and memory storage elements ($M_{xy}$) are defined in each plane as the plane is formed, using two masking steps. The local bit lines crossing each plane of the group in the z-direction are defined globally after the last plane in the group is defined. A significant feature of the structure of FIG. 8 is that the storage elements $M_{xy}$ are below their respective word lines, rather than serving as an insulator between the word lines (WL) and the vertical local bit lines (LBL) as done in the example of FIG. 7. Further, a bottom electrode contacts the lower surface of each storage element $M_{xy}$ and extends laterally in the y-direction to the local bit line (LBL). Conduction through one of the memory cells is through the bit line, laterally along the bottom electrode, vertically in the z-direction through the switching material of the storage elements $M_{xy}$ (and optional layer of barrier metal, if present) and to the selected word line (WL). This allows the use of conductive switching material for the storage elements $M_{zxy}$ which in the example of FIG. 7 would electrically short word lines in different planes which are vertically above each other. As shown in FIG. 8, the word lines (WL) stop short in the y-direction of the local bit lines (LBL) and do not have the non-volatile memory (NVM) material sandwiched between the word and local bit lines at the same z-location as is the case in the example of FIG. 7. The storage elements $M_{xy}$ are similarly spaced from the local bit lines (LBL), being electrically connected thereto by the bottom electrode.

Figure 9:
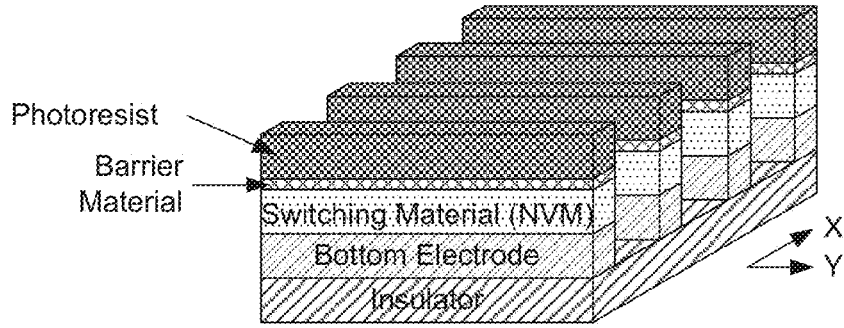
FIGS. 9-14 illustrate a process of forming the three-dimensional array example of FIG. 8.
Figure 10:
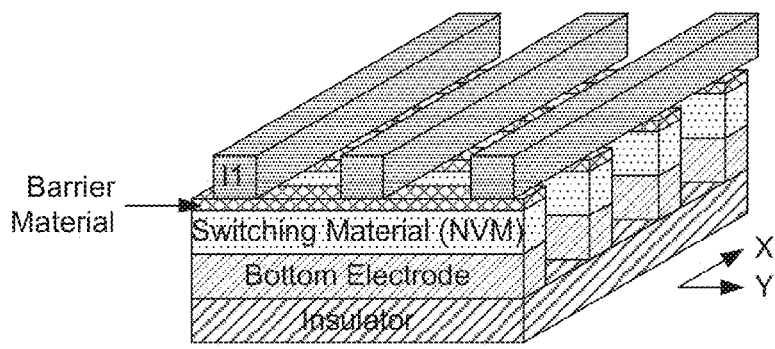
Figure 11:
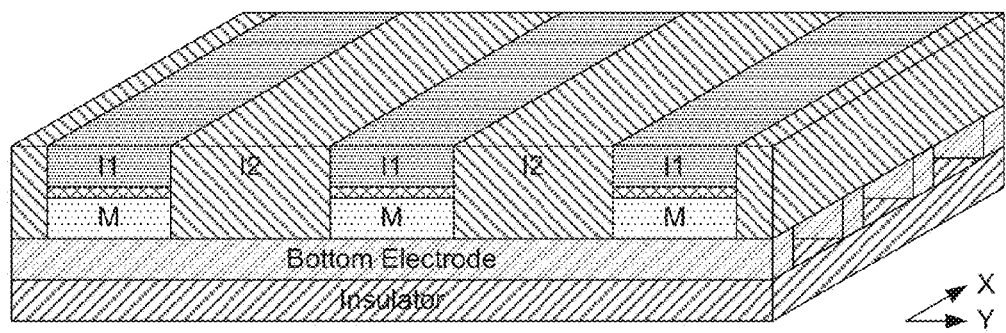
Figure 12:
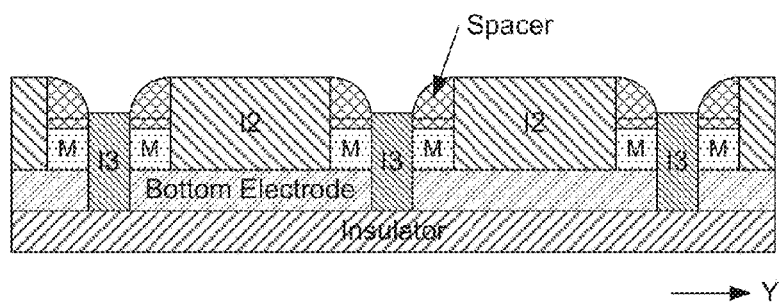
Figure 13:
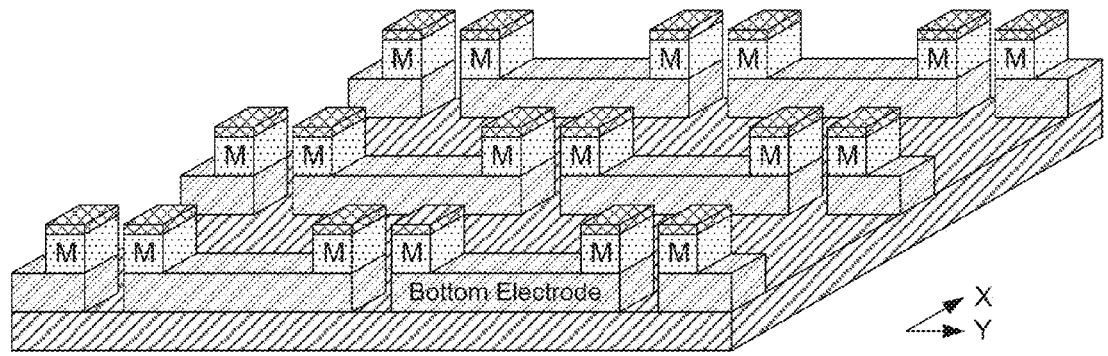

An outline of a process for forming one plane of the three-dimensional structure of FIG. 8 with storage elements $M_{zxy}$ in a regular array in the x-y direction is as follows:
  a. Form, on a continuous dielectric (insulator) layer, parallel sets of stacks containing strips of a bottom electrode, switching material and (optionally) a barrier metal, wherein the stacks are elongated in the y-direction and spaced apart in the x-direction. This intermediate structure is shown in FIG. 9. The process of forming this structure includes sequentially depositing layers of the bottom insulator (to insulate the device from the substrate in layer 111 and from lower planes in layers 113 and 115), a bottom electrode of electrically conducting material (for example, titanium), the switching NVM material layer, a top electrode barrier metal (for example, platinum), followed by a first layer of photoresist material. Pattern the photoresist as a set of horizontal lines and spaces running in the y-direction. The width of the photoresist lines are reduced (the photoresist is "slimmed") to reduce the width of the lines of mask material so that the spaces between stacks are larger than the width of the lines. This is to compensate for a possible subsequent misalignment of the rows of switching elements between different planes and to allow a common vertical local bit line to make contact to the bottom electrode simultaneously in all planes. This also reduces the size (and thus current) of the switching elements. Using the photoresist as a mask, the stack is etched, stopping on the bottom insulator layer. The photoresist is then removed, and the gaps between rows are filled with another insulator (not shown in FIG. 9) and the resulting structure is planarized.
  b. With reference to FIGS. 10-12, the stacks are separated to form an x-y array of individual memory elements, each containing a bottom electrode joining two adjacent memory elements in the y-direction.
    1. Deposit a layer of dielectric (insulator) over the structure.
    2. Pattern parallel lines of photoresist running in the x-direction and etch the top insulator layer to form from this layer the parallel strips of insulation I1 shown in FIG. 10. This etching is stopped on the barrier metal (or memory material if the barrier metal is not present) and the insulator filling the gaps between the stacks (not shown).
    3. Exposed areas of the array thus formed are filled with a second insulator (I2) with different etching properties than insulator I1, which is then planarized. The result is illustrated in FIG. 11.
    4. Thereafter, all remaining insulator I1 is removed by selective etching that uses the exposed I2 as a mask. Spacers are then formed along the edges of I2 as illustrated in FIG. 12.
    5. Using the spacers and the I2 strips as a mask, the parallel stacks are etched through, including the bottom electrode strips, thereby isolating the bottom electrode strips by trenches between them so that each strip contacts only two adjacent memory elements $M_{zxy}$. As an alternative to forming the spacers for use as part of the etch mask, a photoresist mask may be formed instead. However, there is a potential of misalignment of such a photoresist mask and its pitch may not be as small as can be obtained with the user of the spacers.
    6. A third insulator layer is then deposited over the structure and into the trenches just etched, and the third insulator layer is etched back to slightly above the height of the exposed switching material, thereby leaving the third insulators I3. The result is shown in FIG. 12, a cross-section drawn in the y-direction along one bottom electrode line.
  c. The word lines are then formed in the exposed region, making ohmic contact to two adjacent memory elements (this is a Damascene process).
    1. The spacers are first removed. The result is shown as FIG. 13, a rectangular x-y array of memory stacks (like upward facing pillars), each two adjacent stacks in the y-direction being connected by a common bottom electrode. Not shown for clarity is the insulator I2 filling the area over the bottom electrode between pillars, and the insulator I3 filling the trench between the gaps separating the bottom electrodes and adjacent pillars.

Figure 14:
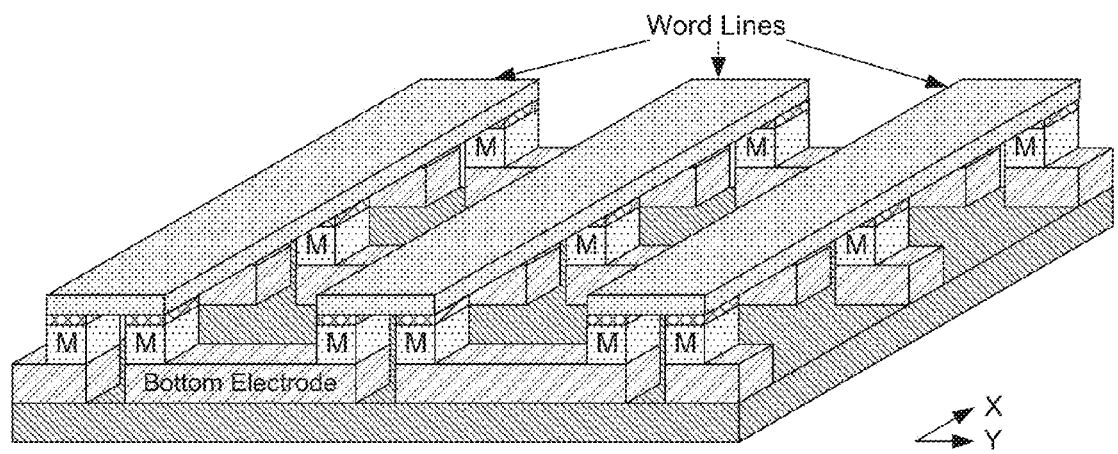

2. Conductive word line material is then deposited, and is removed by CMP so that it fills the exposed trench, stopping on insulator 13 and barrier metal (if present) or memory material. Note that the insulator I2 forms a trench where the conductive word line material is defined (as a damascene process). The word lines (WL) sit over insulator I3 and two adjacent memory stacks (shown here with barrier metal). The resulting structure is shown in FIG. 14.

d. The foregoing processing steps are repeated for each plane in the group of planes. Note that the memory elements in one plane will not be exactly aligned with memory elements in another plane because of photolithography misalignment.

e. After the circuit elements of all the planes have been formed, the vertical local bit lines are then formed:

1. A top insulator is deposited above the word lines of the upper plane.

2. Using a photoresist mask, an x-y "contact" pattern is opened for the individual local bit lines, and etching is performed through the group of planes all the way to the substrate. Rows of these openings are aligned parallel to the word lines along the x-direction but are spaced midway in the gaps between word lines in the y-direction. The size of these openings is smaller than the spacing between word lines and aligned in the x-direction to cut through the bottom electrodes in each plane. As the etch moves through each layer of bottom electrodes of the several planes, it separates the bottom electrodes into two segments so that each segment contacts only one memory element. The etching continues to the substrate where it exposes contacts to the select devices $Q_{xy}$.

3. These holes are then filled with metal to form the local bit lines, and the top surface is planarized so that each local bit line is independent of (electrically separated from) any other local bit line. A barrier metal may be optionally deposited as a part of this process. The resulting structure is shown in the vertical cross-section of FIG. 8.

4. Alternatively, instead of etching an x-y "contact" pattern for the local bit lines, slits elongated in x-direction and spaced apart in the y-direction are etched in the I2 oxide regions. Etching is performed through the group of planes, all the way to the substrate forming trenches in which the local bit line pillars are later formed.

5. Metal is then deposited to fill these trenches. The deposited metal makes contact with the bottom electrode of the memory element in all the planes. The metal is then patterned using a mask with slits in the x-direction. Removal of the metal material by etching through this mask leaves the local bit line pillars. The space between pillars in the x-direction is filled with a dielectric material and planarized back to the top of the structure.

Figure 15:
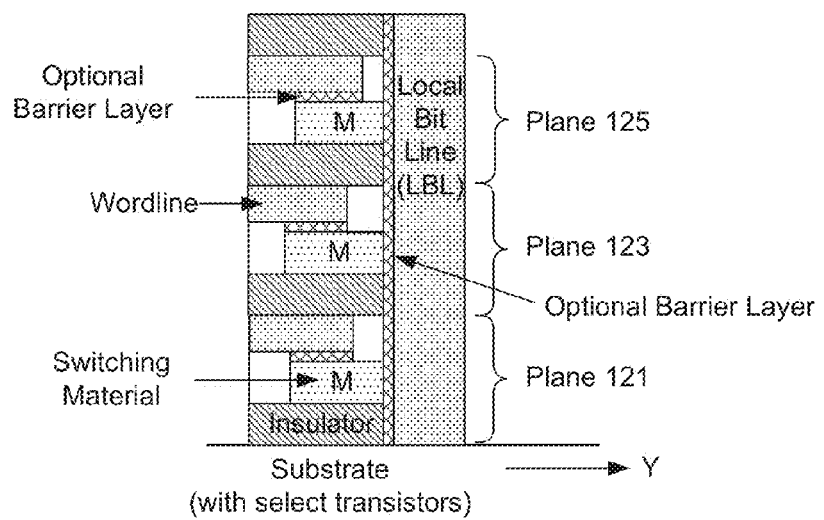
FIG. 15 is a cross-section of a portion of the three-dimensional array shown in FIG. 1 according to a third specific example of an implementation thereof

A third specific structural example is shown by FIG. 15, which shows a small portion of three planes 121, 123 and 125. The memory storage elements $M_{zxy}$ are also formed from a conductive switching material. This is a variation of the second example, wherein the memory elements of FIG. 15 individually takes the shape of the bottom electrode and contacts the vertical local bit line (LBL). The bottom electrodes of the example of FIG. 8 are missing from the layers shown in FIG. 15.

The structure shown in FIG. 15 is made by essentially the same process as that described above for the second example. The main difference is that in the second example, reference to the bottom electrode is replaced in this third example by the switching material, and reference to the switching material of the second embodiment is not used in this third embodiment.

The second example structure of FIG. 8 is particularly suited to any switching material that as deposited as an insulator or electrical conductor. The third example structure shown in FIG. 15 is suited primarily for switching materials that are deposited as an electrical conductor (phase change materials, carbon materials, carbon nanotubes and like materials). By isolating the switching material such that it does not span the region between two stacks, the possibility of a conductive short between switching elements is eliminated.

Embodiments with Reduced Leakage Currents

Conventionally, diodes are commonly connected in series with the variable resistive elements of a memory array in order to reduce leakage currents that can flow through them. The highly compact 3D reprogrammable memory described in the present invention has an architecture that does not require a diode in series with each memory element while able to keep the leakage currents reduced. This is possible with short local vertical bit lines which are selectively coupled to a set of global bit lines. In this manner, the structures of the 3D memory are necessarily segmented and couplings between the individual paths in the mesh are reduced.

Even if the 3D reprogrammable memory has an architecture that allows reduced current leakage, it is desirable to further reduce them. As described earlier and in connection with FIG. 5, parasitic currents may exist during a read operation and these currents have two undesirable effects. First, they result in higher power consumption. Secondly, and more seriously, they may occur in the sensing path of the memory element being sensed, cause erroneous reading of the sensed current.

Figure 16:
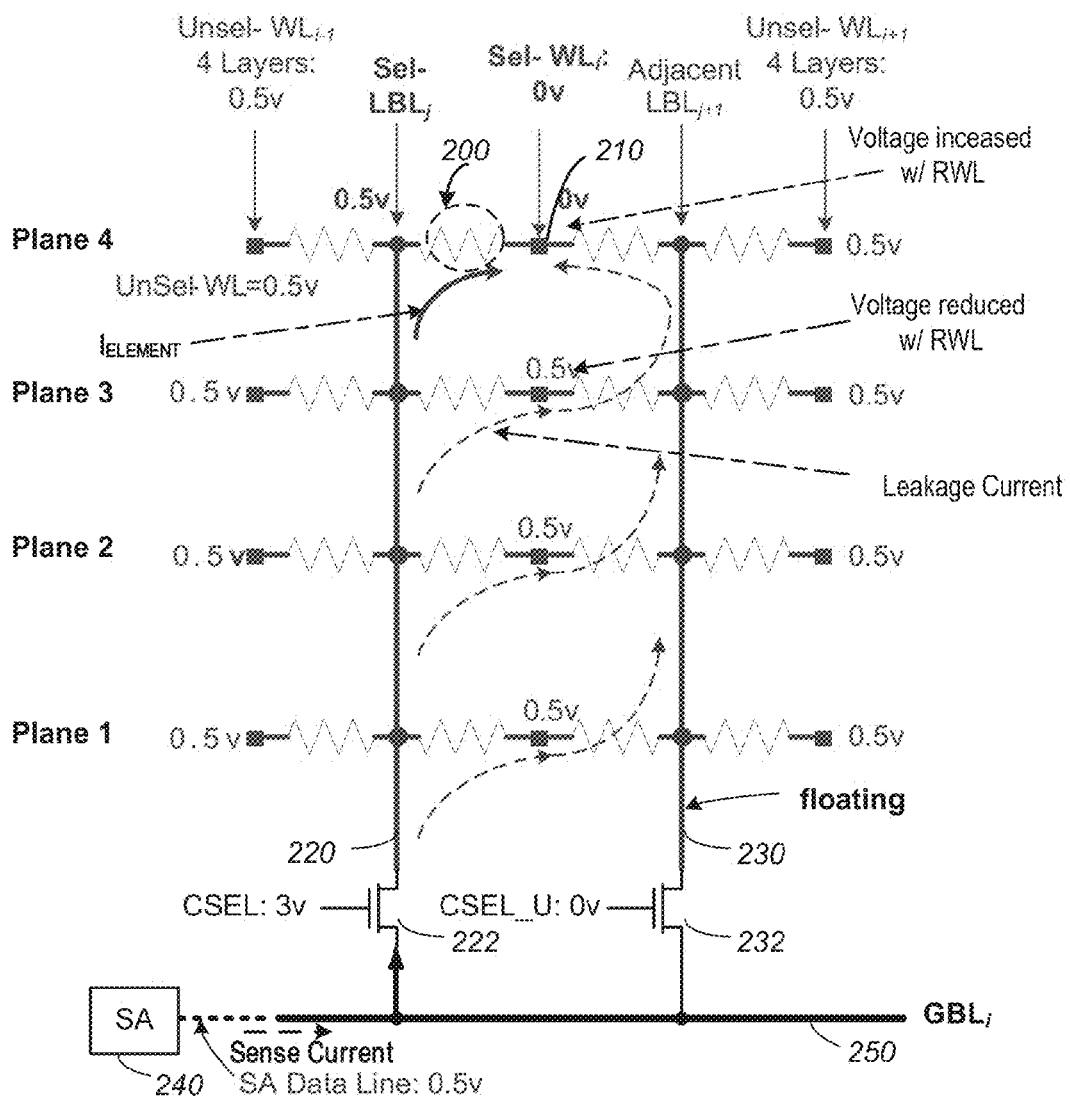
FIG. 16 illustrates the read bias voltages and current leakage across multiple planes of the 3D memory shown in FIG. 1 and FIG. 3.

FIG. 16 illustrates the read bias voltages and current leakage across multiple planes of the 3D memory shown in FIG. 1 and FIG. 3. FIG. 16 is a cross-sectional view across 4 planes along the x-direction of a portion of the perspective 3D view of the memory shown in FIG. 1. It should be clear that while FIG. 1 shows the substrate and 2 planes, FIG. 16 shows the substrate and 4 planes to better illustrate the effect of current leakage from one plane to another.

In accordance with the general principle described in connection with FIG. 5, when the resistive state of a memory element 200 in FIG. 16 is to be determined, a bias voltage is applied across the memory element and its element current $I_{ELEMENT}$ sensed. The memory element 200 resides on Plane 4 and is accessible by selecting the word line 210 (Sel-WLi) and the local bit line 220 (Sel-LBLj). For example, to apply the bias voltage, the selected word line 210 (Sel-WLi) is set to 0v and the corresponding selected local bit line 220 (Sel-LBLj) is set to a reference such as 0.5V via a turned on select gate 222 by a sense amplifier 240. With all other unselected word line in all planes also set to the reference 0.5V and all unselected local bit lines also set to the reference 0.5V, then the current sensed by the sense amplifier 240 will just be the $I_{ELEMENT}$ of the memory element 200.

The architecture shown in FIG. 1 and FIG. 16 has the unselected local bit lines (LBLj+1, LBLj+2, ... ) and the selected local bit line (Sel-LBLj) all sharing the same global bit line 250 (GBLi) to the sense amplifier 240. During sensing of the memory element 200, the unselected local bit lines can only be isolated from the sense amplifier 240 by having their respective select gate such as gate 232 turned off. In this way, the unselected local bit lines are left floating and will couple to the reference 0.5V by virtue of adjacent nodes which are at 0.5V. However, the adjacent nodes are not exactly at the reference 0.5V. This is due to a finite resistance in each word line (perpendicular to the plane in FIG. 16) which results in a progressive voltage drop away from one end of the word line at which 0.5V is applied. This ultimately results in the floating, adjacent unselected local bit lines coupling to a voltage slightly different from the reference 0.5V. In this instance, there will be leakage currents between the selected and unselected local bit lines as illustrated by broken flow lines in FIG. 16. Then sensed current is then $I_{ELEMENT}$+leakage currents instead of just $I_{ELEMENT}$. This problem becomes worse will increasing word line's length and resistivity.

Double-Global-Bit-Line Architecture

According to one aspect of the invention, a 3D memory includes memory elements arranged in a three-dimensional pattern defined by rectangular coordinates having x, y and z-directions and with a plurality of parallel planes stacked in the z-direction. The memory elements in each plane are accessed by a plurality of word lines and local bit lines in tandem with a plurality of global bit lines. The plurality of local bit lines are in the z-direction through the plurality of planes and arranged in a two dimensional rectangular array of rows in the x-direction and columns in the y-directions. The plurality of word lines in each plane are elongated in the x-direction and spaced apart in the y-direction between and separated from the plurality of local bit lines in the individual planes. A non-volatile, reprogramming memory element is located near a crossing between a word line and local bit line and accessible by the word line and bit line and wherein a group of memory elements are accessible in parallel by a common word line and a row of local bit lines. The 3D memory further includes a double-global-bit line architecture with two global bit lines respectively serving even and odd local bit lines in a column thereof in the y-direction. This architecture allows one global bit line to be used by a sense amplifier to access a selected local bit line and the other global bit line to be used to access an unselected local bit lines adjacent the selected local bit line in the y-direction. In this way the adjacent, unselected local lines can be set to exactly a reference voltage same as that of the selected local bit line in order to eliminate leakage currents between adjacent bit lines.

Figure 17:
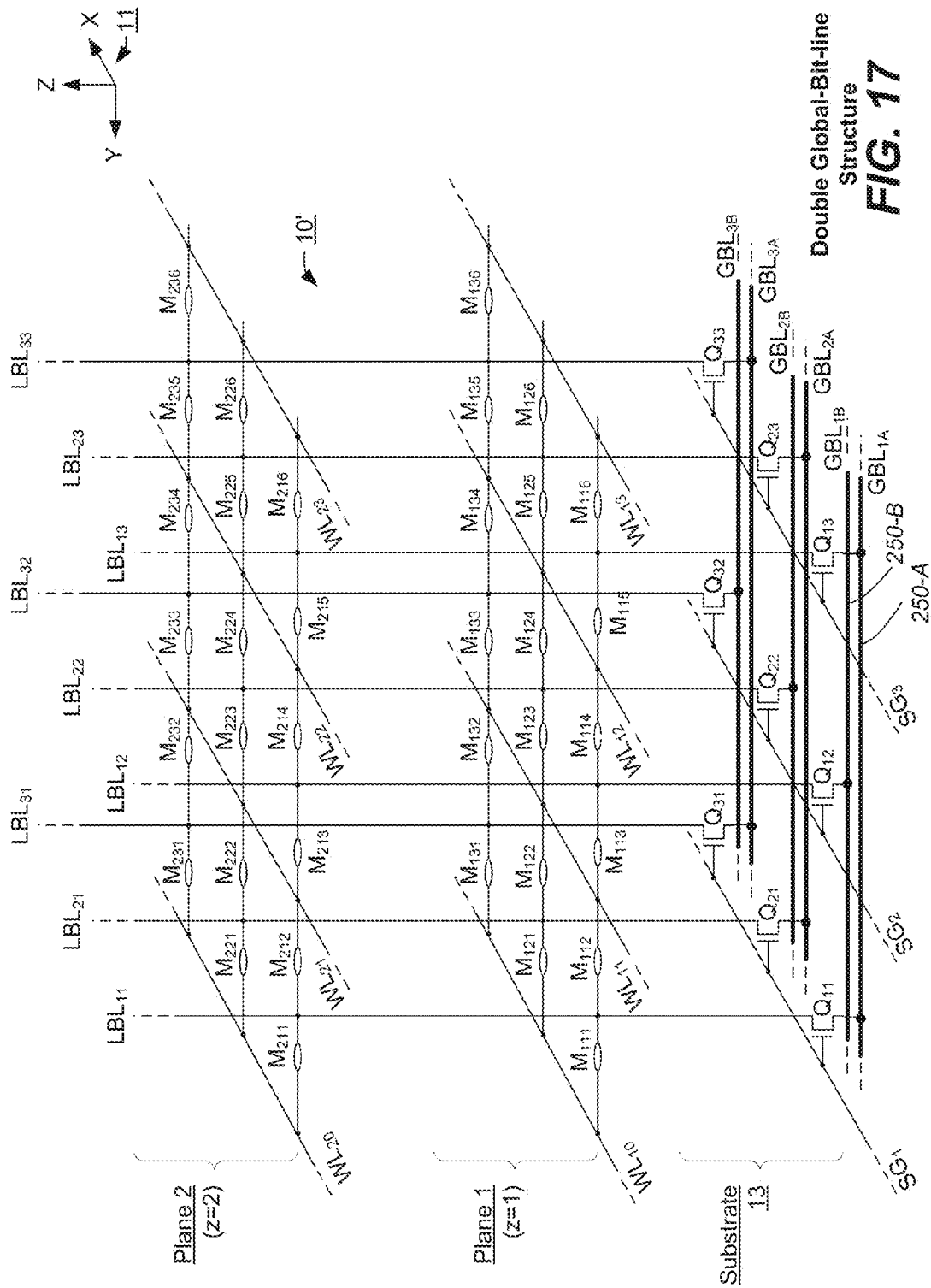
FIG. 17 illustrates a three-dimensional memory with a double-global-bit-line architecture for improved access to a set of local bit lines.

FIG. 17 illustrates a three-dimensional memory with a double-global-bit-line architecture for improved access to a set of local bit lines. An architecture of a three-dimensional memory 10' is schematically and generally illustrated in the form of an equivalent circuit of a portion of such a memory. This is a specific example of the three-dimensional array summarized above. A standard three-dimensional rectangular coordinate system 11 is used for reference, the directions of each of vectors x, y and z being preferably orthogonal with the other two and having a plurality of parallel planes stacked in the z-direction. The local bit lines are elongated vertically, in the z-direction, and form a regular two-dimensional array in the x (row) and y (column) directions.

Memory storage elements $M_{zxy}$ are formed in a plurality of planes positioned at different distances in the z-direction above the substrate 13. Two planes 1 and 2 are illustrated in FIG. 17 but there will typically be more, such as 4, 6 or even more. In each plane at distance z, word lines $WL_{zy}$ are elongated in the x-direction and spaced apart in the y-direction between the local bit-lines ($LBL_{xy}$). Each row of local bit lines $LBL_{xy}$ of each plane is sandwiched by a pair of word lines $WL_{zy}$ and $WL_{zy+1}$. Individually crossing between a local bit line a word line occurs at each plane where the local bit line intersects the plane. The individual memory storage elements $M_{zxy}$ are connected between one local bit line $LBL_{xy}$ and one word line $WL_{zy}$ adjacent these individual crossings. An individual memory element $M_{zxy}$ is therefore addressable by placing proper voltages on the local bit line $LBL_{xy}$ and word line $WL_{zy}$ between which the memory element is connected. The voltages are chosen to provide the electrical stimulus necessary to cause the state of the memory element to change from an existing state to the desired new state. The levels, duration and other characteristics of these voltages depend upon the material that is used for the memory elements.

Each "plane" of the three-dimensional memory cell structure is typically formed of at least two layers, one in which the conductive word lines $WL_{zy}$ are positioned and another of a dielectric material that electrically isolates the planes from each other. Additional layers may also be present in each plane, depending for example on the structure of the memory elements $M_{zxy}$. The planes are stacked on top of each other on a semiconductor substrate with the local bit lines $LBL_{xy}$ being connected with storage elements $M_{zxy}$ of each plane through which the local bit lines extend.

Essentially the three-dimensional memory 10' shown in FIG. 17 is similar to the 3D memory 10 shown in FIG. 1 except for the structure of the global bit lines which has a doubling of the global bit lines.

A circuit for selectively connecting internal memory elements with external data circuits is preferably formed in a semiconductor substrate 13. In this specific example, a two-dimensional array of select or switching devices $Q_{xy}$ are utilized, where x gives a relative position of the device in the x-direction and y its relative position in the y-direction. The individual devices $Q_{xy}$ may be a select gate or select transistor, as examples.

A pair of global bit lines ($GBL_{xA}$, $GBL_{xB}$) is elongated in the y-direction and have relative positions in the x-direction that are indicated by the subscript. The individual devices Qxy each couples a local bit line to one global bit line. Essentially, each local bit line in a row is coupleable to one of a corresponding pair of global bit lines. Along a column of local bit lines, even local bit lines are coupleable to a first one of a corresponding pair of global bit line while odd local bit lines are coupleable to a second one of the corresponding pair of global bit line.

Thus, a pair of global bit lines ($GBL_{x'A}$, $GBL_{x'B}$) at about the x'-position, are individually connectable with the source or drain of the select devices Q in such a manner that local bits (LBLx'y) at the x'-position and along the y-direction are coupleable alternately to the pair of global bit lines ($GBL_{x'A}$, $GBL_{x'B}$). For example, the odd local bit lines along the column in the y-direction at the x=1 position ($LBL_{11}$, $LBL_{13}$, . . . ) are coupleable respectively via select devices ($Q_{11}$, $Q_{13}$, . . . ) to a first one $GBL_{1A}$ of the pair of global bit line at x=1. Similarly, the even local bit lines along the same column at the x=1 position ($LBL_{12}$, $LBL_{14}$, . . . ) are coupleable respectively via select devices ($Q_{12}$, $Q_{14}$, . . . ) to a second one $GBL_{1B}$ of the pair of global bit line at x=1.

During reading and also typically programming, each global bit line is typically coupled to one local bit line by accessing through a corresponding select device that has been turned on. In this way a sense amplifier can access the local bit line via the coupled global bit line.

In order to connect one set (in this example, designated as one row) of local bit lines with a corresponding set of global bit lines, control gate lines $SG_y$ are elongated in the x-direction and connect with control terminals (gates) of a single row of select devices $Q_{xy}$ having a common position in the y-direction. In this way, a set or page of memory elements can be accessed in parallel. The select devices $Q_{xy}$ therefore connect one row of local bit lines ($LBL_{xy}$) across the x-direction (having the same position in the y-direction) at a time to corresponding ones of the global bit-lines, depending upon which of the control gate lines $SG_y$ receives a voltage that turns on the select devices to which it is connected. In the double-global-bit line architecture, there is a pair of global bit lines at about each x-position. If a row of local bit lines along the x-directions are coupleable to the first one of each pair of corresponding global bit lines, then along the y-direction, an adjacent row of local bit lines will be coupleable to the second one of each pair of corresponding global bit lines. For example, the row of local bit lines ($LBL_{11}$, $LBL_{21}$, $LBL_{31}$, ...) along the x-direction are coupled to the first of each pair of corresponding global bit lines ($GBL_{1A}$, $GBL_{2A}$, $GBL_{3A}$, ...) by turning on select devices ($Q_{11}$, $Q_{21}$, $Q_{31}$, ...) via the control gate line $SG_1$. Along the y-direction, an adjacent row of local bit lines ($LBL_{12}$, $LBL_{22}$, $LBL_{32}$, ...) along the x-direction are coupled to the second of each pair of corresponding global bit lines ($GBL_{1B}$, $GBL_{2B}$, $GBL_{3B}$, ...) by turning on select devices ($Q_{12}$, $Q_{22}$, $Q_{32}$, ...) via the control gate line $SG_2$. Similarly, a next adjacent row of local bit lines ($LBL_{13}$, $LBL_{23}$, $LBL_{33}$, ...) are coupled to the first of each pair of corresponding global bit lines ($GBL_{1A}$, $GBL_{2A}$, $GBL_{3A}$, ...) in an alternating manner between the first and second one of each pair.

By accessing a row of local bit lines and an adjacent row using different ones of each pair of corresponding global bit lines, the row and adjacent row of local bit lines can be accessed independently at the same time. This is in contrast to the case of the single-global-bit-line architecture shown in FIG. 1, where both a row and its adjacent row of local bit lines share the same corresponding global bit lines.

As discussed in connection with FIG. 16, the leakage currents due to adjacent rows are not well controlled when the adjacent bit lines can not be set independently to the reference voltage in order to eliminate current leakage.

Figure 18:
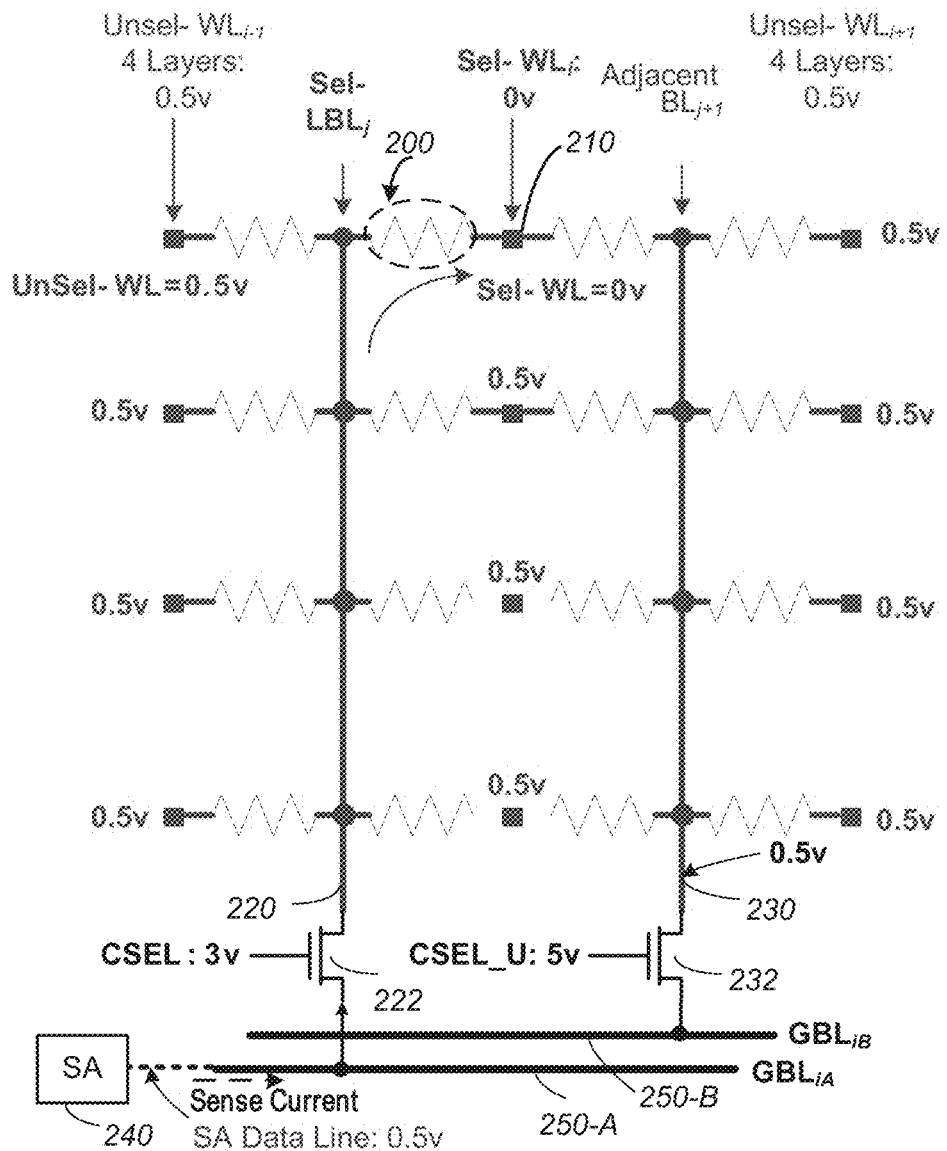
FIG. 18 illustrates the elimination of leakage currents in the double-global-line architecture 3D array of FIG. 17.

FIG. 18 illustrates the elimination of leakage currents in the double-global-line architecture 3D array of FIG. 17. The analysis of leakage current is similar to that described with respect to FIG. 16. However, with the double-global-bit-line architecture, the selected local bit line 220 (Sel-LBLj) allows the memory element 200 to be sensed by the sense amplifier 240 via the first one of the pair of global bit line $GBL_{iA}$, which is maintained at a reference voltage (e.g., 0.5V). At the same time, the adjacent local bit line 230 can be accessed independently by the second one of the pair of global bit line $GBL_{iB}$. This allows the adjacent local bit line 230 to be set to the same reference voltage. Since both the selected local bit line 220 and its adjacent local bit line (along the y-direction) are at the same reference voltage, there will be no leakage currents between the two local bit lines adjacent to each other.

The double-global-bit-line architecture doubles the number of global bit lines in the memory array compared to the architecture shown in FIG. 1. However, this disadvantage is offset by providing a memory array with less leakage currents among the memory elements.

Single-Sided Word Line Architecture

According to another embodiment of the invention, a 3D memory includes memory elements arranged in a three-dimensional pattern defined by rectangular coordinates having x, y and z-directions and with a plurality of parallel planes stacked in the z-direction. The memory elements in each plane are accessed by a plurality of word lines and local bit lines in tandem with a plurality of global bit lines. The plurality of local bit lines are in the z-direction through the plurality of planes and arranged in a two dimensional rectangular array of rows in the x-direction and columns in the y-directions. The plurality of word lines in each plane are elongated in the x-direction and spaced apart in the y-direction between and separated from the plurality of local bit lines in the individual planes. A non-volatile, reprogramming memory element is located near a crossing between a word line and local bit line and accessible by the word line and bit line and wherein a group of memory elements are accessible in parallel by a common word line and a row of local bit lines. The 3D memory has a single-sided word line architecture with each word line exclusively connected to one row of memory elements. This is accomplished by providing one word line for each row of memory elements instead of sharing one word line between two rows of memory elements and linking the memory element across the array across the word lines. While the row of memory elements is also being accessed by a corresponding row of local bit lines, there is no extension of coupling for the row of local bit lines beyond the word line.

A double-sided word line architecture has been described earlier in that each word line is connected to two adjacent rows of memory elements associated with two corresponding rows of local bit lines, one adjacent row along one side of the word line and another adjacent row along the other side. For example, as shown in FIG. 1 and FIG. 3, the word line $WL_{12}$ is connected on one side to a first row (or page) of memory elements ($M_{114}$, $M_{124}$, $M_{134}$, ...) associated respectively with local bit lines ($LBL_{12}$, $LBL_{22}$, $LBL_{32}$, ...) and also connected on another side to a second row (or page) of memory elements ($M_{115}$, $M_{125}$, $M_{135}$, ...) associated respectively with local bit lines ($LBL_{13}$, $LBL_{23}$, $LBL_{33}$, ...)

Figure 19:
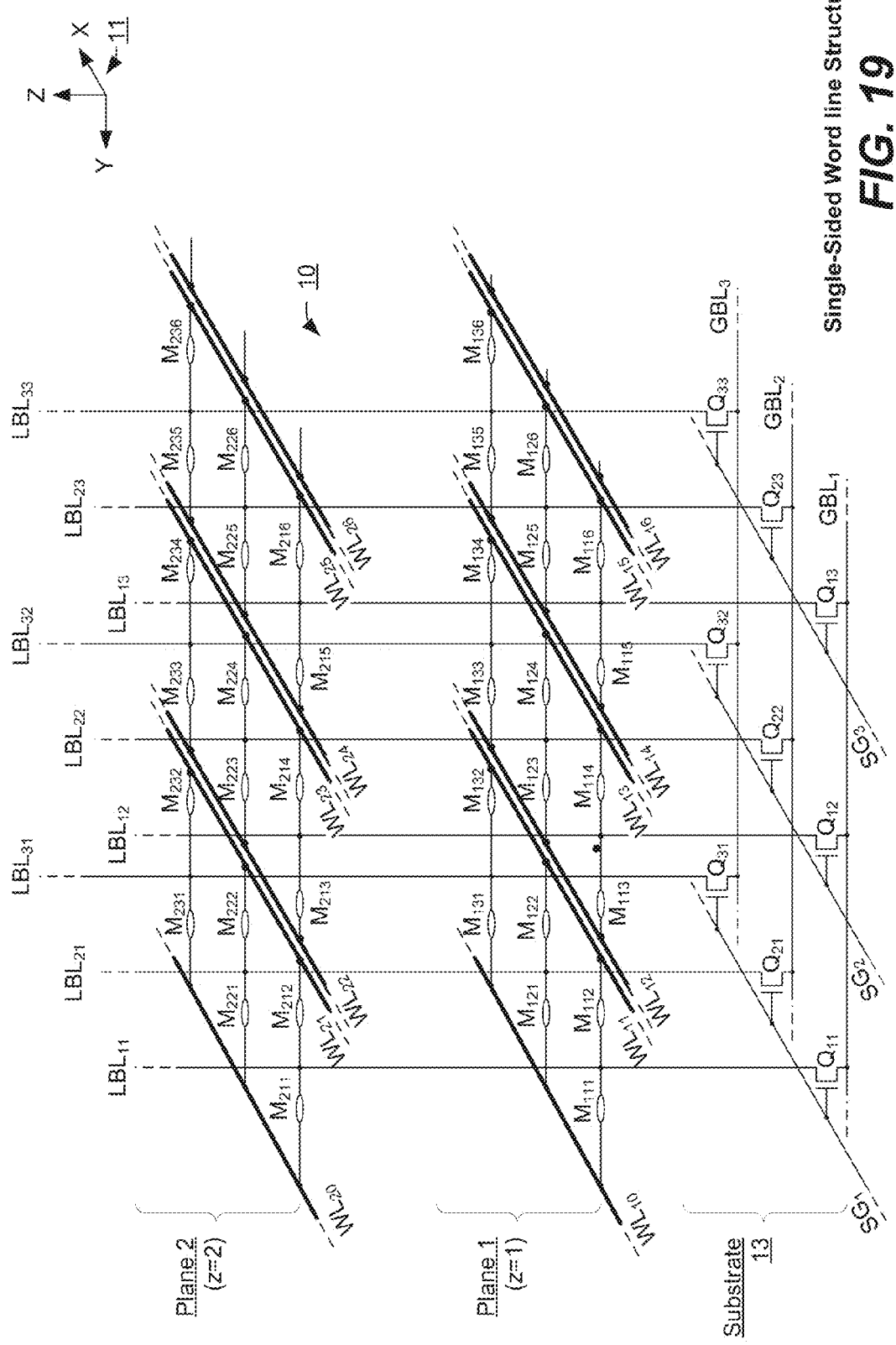
FIG. 19 illustrates schematically a single-sided word line architecture.

FIG. 19 illustrates schematically a single-sided word line architecture. Each word line is connected to an adjacent row of memory elements associate with one row of local bit lines on only one side.

The 3D memory array with the double-sided word line architecture illustrated in FIG. 1 can be modified to the single-sided word line architecture where each word line except ones at an edge of the array will be replaced by a pair of word lines. In this way, each word line is connecting exclusively to one row of memory elements. Thus, the word line $WL_{12}$ shown in FIG. 1 is now replaced in FIG. 19 by the pair of word lines $WL_{13}$ and $WL_{14}$. It will be seen that WL13 is connected to one row of memory elements ($M_{114}$, $M_{124}$, $M_{134}$, ...) and WL14 is connected to one row of memory elements ($M_{115}$, $M_{125}$, $M_{135}$, ...) As described before, a row of memory elements constitutes a page which is read or written to in parallel.

Figure 20:
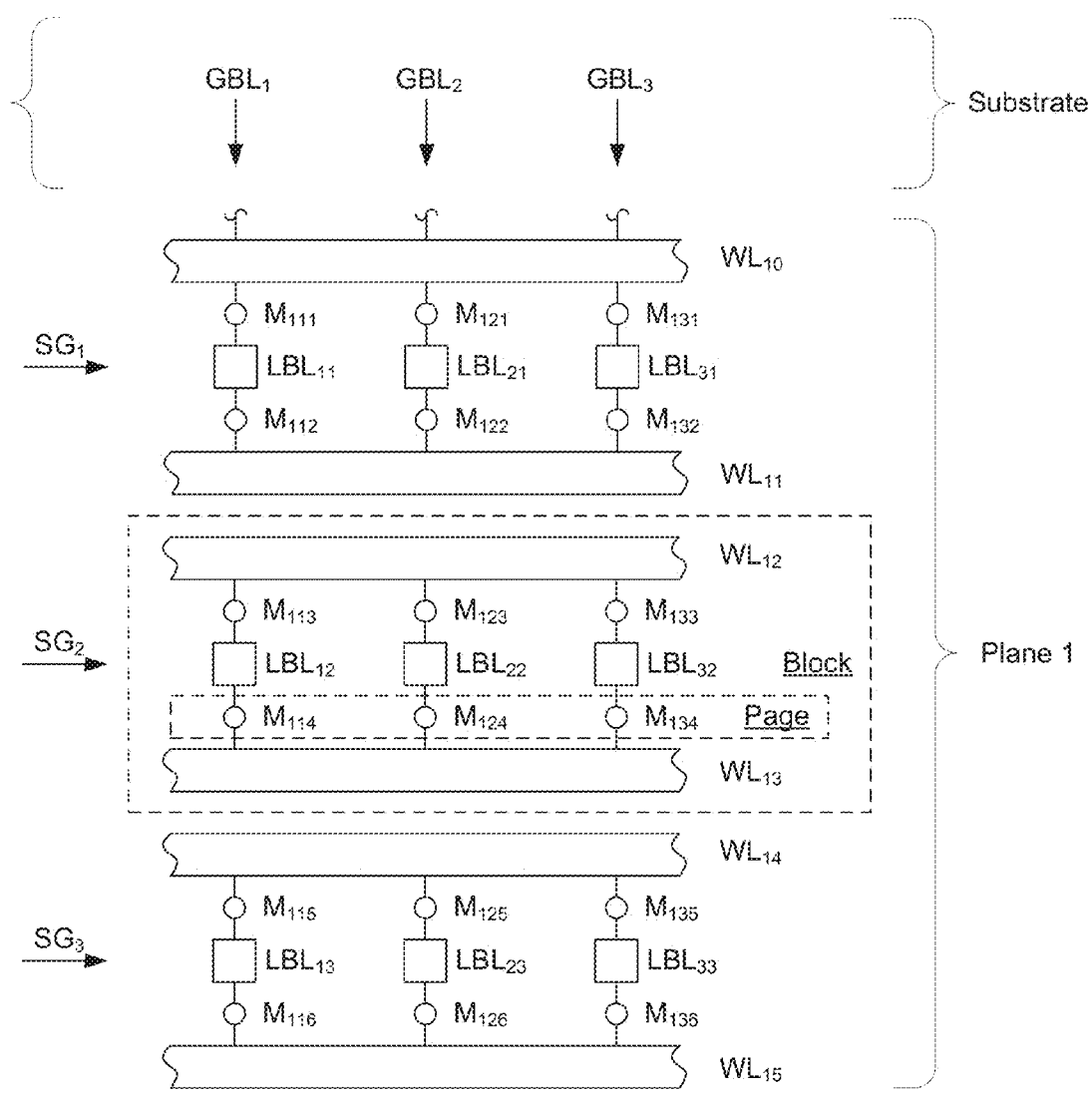
FIG. 20 illustrates one plane and substrate of the 3D array with the single-sided word line architecture.

FIG. 20 illustrates one plane and substrate of the 3D array with the single-sided word line architecture. Going from the double-sided word line architecture of FIG. 3, similarly, $WL_{12}$ in FIG. 3 would be replaced by the pair $WL_{13}$, $WL_{14}$ in FIG. 20, etc. In FIG. 3, a typical double-sided word line (e.g., $WL_{12}$) is connected to two rows of memory elements (on both side of the word line). In FIG. 20, each single-sided word line (e.g., $WL_{13}$) is connected to only one row of memory elements.

FIG. 20 also illustrates a minimum block of memory elements that is erasable as a unit to be defined by two row of memory elements ($M_{113}$, $M_{123}$, $M_{133}$, ...) and ($M_{114}$, $M_{124}$, $M_{134}$, ...) sharing the same row of local bit lines (e.g., $LBL_{12}$, $LBL_{22}$, $LBL_{32}$, ...)

Figure 21:
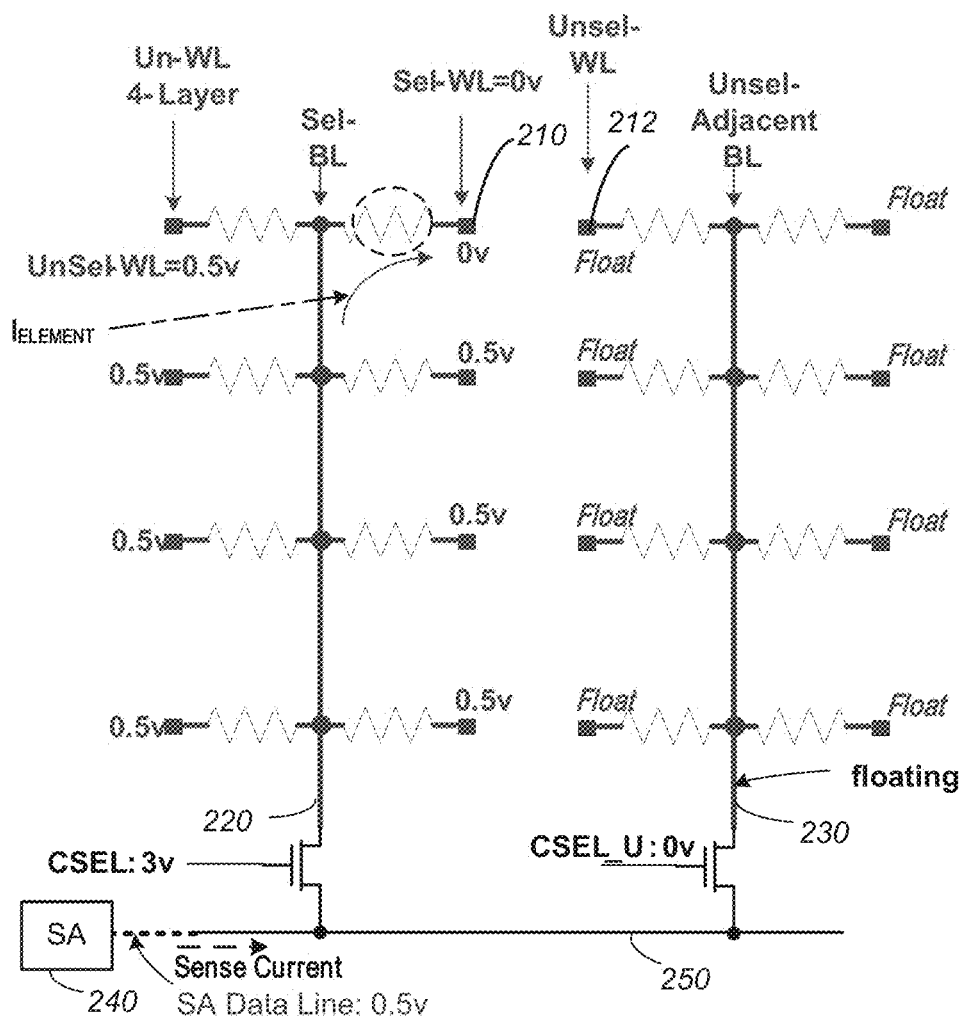
FIG. 21 illustrates the elimination of leakage currents in the single-sided word-line architecture 3-D array of FIGS. 19 and 20.

FIG. 21 illustrates the elimination of leakage currents in the single-sided word-line architecture 3-D array of FIGS. 19 and 20. The analysis of leakage current is similar to that described with respect to FIG. 16. However, with the single-sided word-line architecture, the selected local bit line 220 (Sel-LBLj) is not coupled to an adjacent bit line 230 across the separated word lines 210 and 212. Thus there is no leakage current between adjacent local bit lines and the sense current in the sense amplifier 240 via the global bit line 250 and the local bit line 220 will be just that from the current of the memory element $I_{ELEMENT}$.

The single-sided word-line architecture doubles the number of word lines in the memory array compared to the architecture shown in FIG. 1. However, this disadvantage is offset by providing a memory array with less leakage currents among the memory elements.

Figure 22:
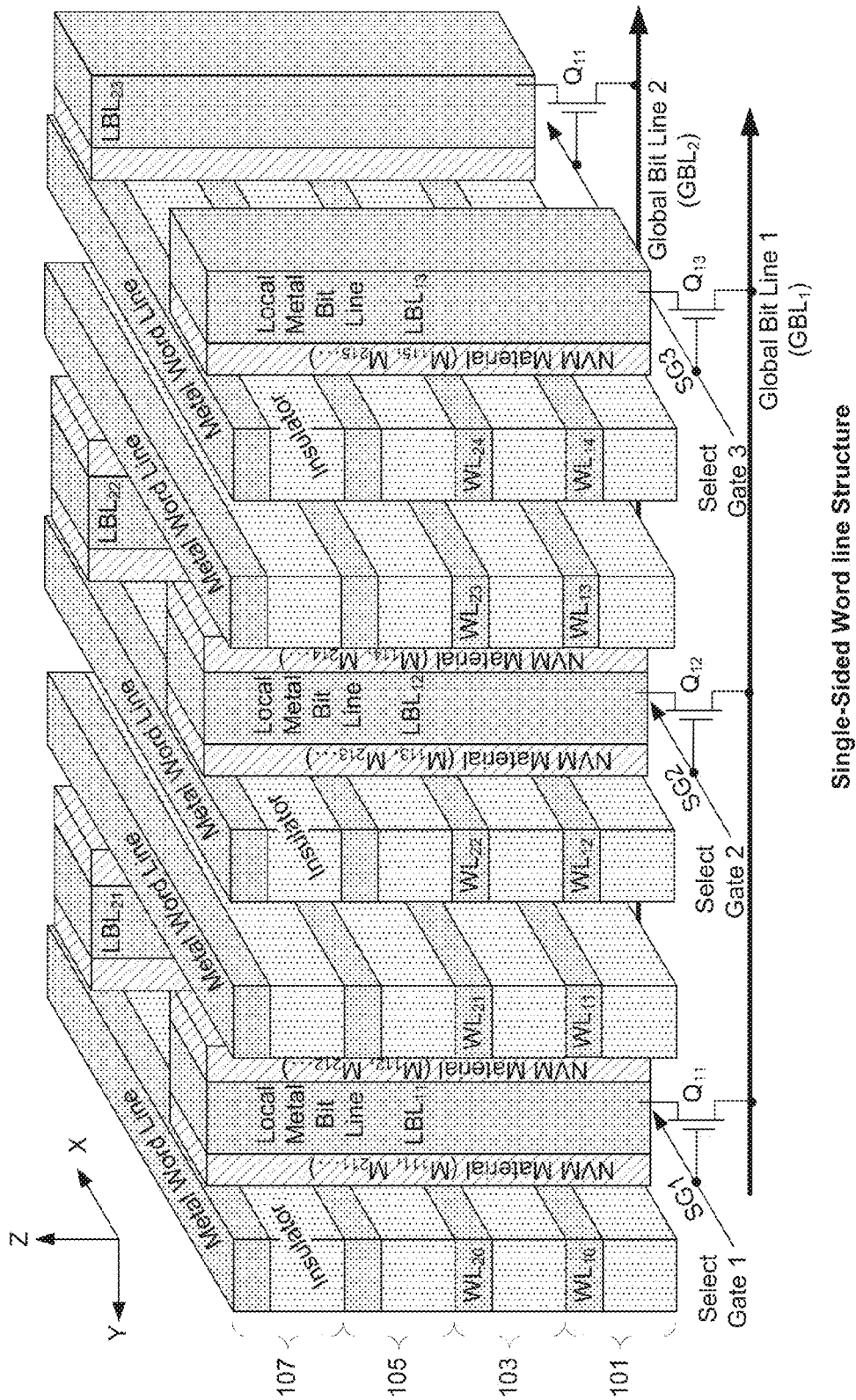
FIG. 22 is an isometric view of a portion of the 3D array with the single-sided word line architecture shown in FIG. 19.

FIG. 22 is an isometric view of a portion of the 3D array with the single-sided word line architecture shown in FIG. 19. Again, similar to the isometric view for the double-side word line architecture shown in FIG. 7, FIG. 22 is one specific example of implementation for the single-sided word-line architecture. The main difference compared to FIG. 7 is that each word line is connected to one side to a row of memory elements. As explained earlier, this architecture has the advantage of decoupling bit-line to bit line coupling across the plurality of word lines in the y-direction.

The 3D array is configured for use of memory element (NVM) material that is non-conductive when first deposited. A metal oxide of the type discussed earlier has this characteristic. As explained with respect to FIG. 6, conductive filaments are formed between electrodes on opposite sides of the material in response to appropriate voltages placed on those electrodes. These electrodes are a bit line and a word line in the array. Since the material is otherwise non-conductive, there is no necessity to isolate the memory elements at the cross-points of the word and bit lines from each other. Several memory elements may be implemented by a single continuous layer of material, which in the case of FIG. 22 are strips of NVM material oriented vertically along opposite sides of the vertical bit lines in the y-direction and extending upwards through all the planes. A significant advantage of the structure of FIG. 22 is that all word lines and strips of insulation under them in a group of planes may be defined simultaneously by use of a single mask, thus greatly simplifying the manufacturing process.

Referring to FIG. 22, a small part of four planes 101, 103, 105 and 107 of the three-dimensional array are shown. Elements of the FIG. 22 array that correspond to those of the equivalent circuit of FIG. 19 are identified by the same reference numbers. It will be noted that FIG. 22 shows the two planes 1 and 2 of FIG. 19 plus two additional planes on top of them. All of the planes have the same horizontal pattern of word lines, dielectric and memory storage element (NVM) material. In each plane, metal word lines (WL) are elongated in the x-direction and spaced apart in the y-direction. Each plane includes a layer of insulating dielectric that isolates its word lines from the word lines of the plane below it or, in the case of plane 101, of the substrate circuit components below it. Extending through each plane is a collection of metal local bit line (LBL) "pillars" elongated in the vertical z-direction and forming a regular array in the x-y direction.

Each bit line pillar is connected to one of a set of global bit lines (GBL) in the silicon substrate running in the y-direction at the same pitch as the pillar spacing through the select devices ($Q_{xy}$) formed in the substrate whose gates are driven by the select gate lines (SG) elongated in the x-direction, which are also formed in the substrate. The switching devices $Q_{xy}$ may be conventional CMOS transistors (or vertical npn transistors) and fabricated using the same process as used to form the other conventional circuitry. In the case of using npn transistors instead of MOS transistors, the select gate (SG) lines are replaced with the base contact electrode lines elongated in the x-direction. Also fabricated in the substrate but not shown in FIG. 22 are sense amplifiers, input-output (I/O) circuitry, control circuitry, and any other necessary peripheral circuitry. There is one select gate line (SG) for each row of local bit line pillars in the x-direction and one select device (Q) for each individual local bit line (LBL).

Each vertical strip of non-volatile memory element (NVM) material is sandwiched between the vertical local bit lines (LBL) and a plurality of word lines (WL) vertically stacked in all the planes. Preferably the NVM material is present between the local bit lines (LBL) in the x-direction. A memory storage element (M) is located at each intersection of a word line (WL) and a local bit line (LBL). In the case of a metal oxide described above for the memory storage element material, a small region of the NVM material between an intersecting local bit line (LBL) and word line (WL) is controllably alternated between conductive (set) and non-conductive (reset) states by appropriate voltages applied to the intersecting lines.

There may also be a parasitic NVM element formed between the LBL and the dielectric between planes. By choosing the thickness of the dielectric strips to be large compared to the thickness of the NVM material layer (that is, the spacing between the local bit lines and the word lines), a field caused by differing voltages between word lines in the same vertical word line stack can be made small enough so that the parasitic element never conducts a significant amount of current. Similarly, in other embodiments, the non-conducting NVM material may be left in place between adjacent local bit lines if the operating voltages between the adjacent LBLs remain below the programming threshold.

The single-sided word line architecture almost double the number of word line in the memory array compared to the double-sided one. This disadvantage is offset by providing a more partitioned memory array with less leakage currents among the memory elements.

While the exemplary embodiments have been described using a 3D co-ordinate system preferably with orthogonal axes, other embodiment in which the local bit lines LBL, word lines WL and global bit lines GBL cross at angles different than 90 degrees are also possible and contemplated.

3D Array of Read/Write Elements with Vertical Bit Lines and Laterally Aligned Active Elements Unlike memory devices with charge storage elements that must be programmed starting from the erased state, the variable resistive memory element described earlier can be written to any one of its states without starting from a given state. As such it is referred to as read/write (R/W) memory as compared to read/erase/program memory of the charge storage type. Thus, the resistive memory elements referred to earlier is also known as R/W memory elements or R/W elements. The 3D array of such R/W elements can be considered as a 3D interconnected resistive mesh.

As described earlier, conventionally, diodes are commonly connected in series with the R/W elements of a 3D memory array in order to reduce leakage currents in the resistive mesh. Across each crossing between a word line and a bit line is disposed a R/W element (also referred to earlier as NVM) with a diode slacked in series. The diode is typically much larger in size compared to the NVM. Thus the diodes form a layer above the NVM and substantially increase the thickness of the memory.

The 3D array with relative short vertical bit lines described earlier in connection with FIG. 1 and FIG. 7, helps to limit the interconnectivity of the resistive mesh and therefore the leakage.

Furthermore the single-side word line architecture for the 3D array described earlier in connection with FIG. 19 also helps to segment the resistive mesh and further reduce the interconnectivity and leakage.

Depending on the material and property of the R/W element, the reduction in leakage enables a viable 3D array that can do away with a diode in series with every R/W element. At least, the reduction in leakage brought by the short bit lines and single-side word lines enables a viable 3D array to employ a less than ideal diode (or what might be considered as a "lousy diode") in series with each R/W element.

According to one aspect of the invention, with the bit lines oriented in the vertical direction serving multiple layers of 2D array of R/W elements and the word lines in the horizontal or lateral direction in each layer, each R/W element with a diode in series are form in a lateral direction between a word line and a bit line at a crossing. By aligning the diode and R/W memory element in the horizontal or lateral direction, the thickness of each layer of word lines is not increased. Furthermore, the diode is formed or incorporated as part of the bit line structure, thereby affording the diode without expensing additional space for it.

According to another aspect of the invention, the 3D array is formed by a process in which the R/W elements and diodes are formed, not layer by layer vertically as in prior art, but laterally on all layers in parallel. This is accomplished by creating a simple multi-layer structure, exposing a cross section of the stratified layers by opening a portal and forming fine structures in each of the exposed layers in a lateral direction. This process is advantageous whether diodes are included or not.

Forming the active devices such as diodes is a high-temperature process. If metallization takes place before, the metal will have to be able to withstand the high-temperature processes that follow. This may exclude the use of aluminum or copper for their better conductivity and economy. The increased resistance in the word lines can exacerbate leakage problems.

The present process allows the high-temperature process for all the layers to be clustered together, and the metallization for the word lines to be performed after the high-temperature process.

Figure 23:
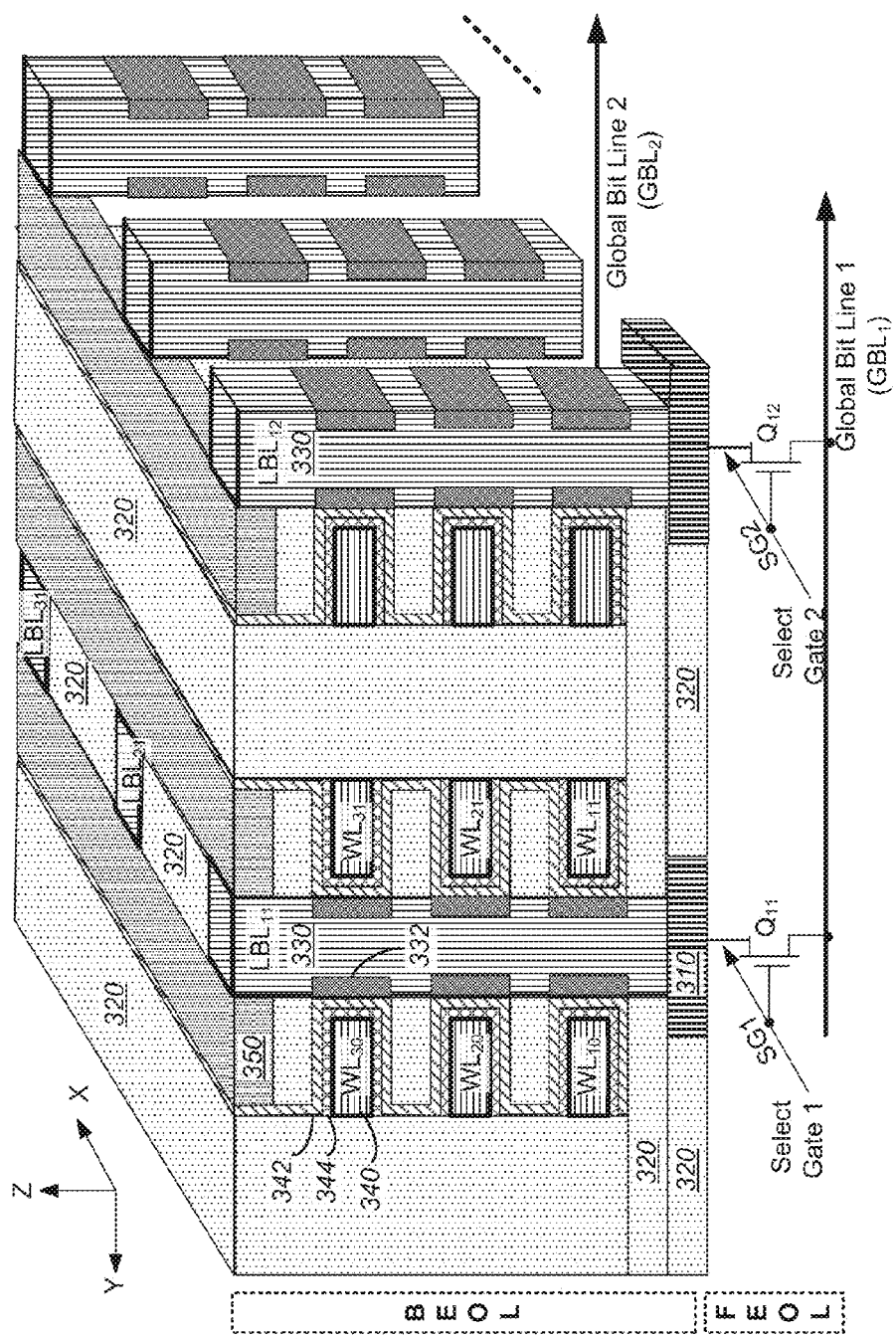
FIG. 23 illustrates a preferred 3D memory structure with vertical local bit lines and horizontally formed active memory elements and diodes.

FIG. 23 illustrates a preferred 3D memory structure with vertical local bit lines and horizontally formed active memory elements and diodes. The 3D memory structure is defined with respect to an x-y-z coordinate system. The local bit lines are in the z-direction, the word lines are in the x-direction and the global lines are in the y-direction.

The 3D structure can be regarded as comprising two portions. A base portion, commonly referred to as FEOL ("Front End Of (Manufacturing) Lines"), is supported by a semiconductor substrate on which active elements such as the selector switching devices Qxy are formed (see also FIG. 1 and FIG. 7). A series of metal lines serving as global lines and various metal contact pads are formed on top of the active elements. Each select device Qxy has a source connected to a metal line and drain connected to a drain terminal. In this way, the select device functions as a switch between the metal line and the drain terminal. As described before, the Qxy for a given y along the x-direction have a common gate in the form of a poly line running along the x-direction. For example, when a select signal SG1 is asserted on the common gate for y=1 of $Q_{11}, Q_{21}, Q_{31}, \ldots$, the drain terminals along x=1, 2, 3, . . . are connected respectively to global lines $GBL_1$, $GBL_2$, $GBL_3$. . . . As will be seen later, the drain terminals are connected to respective local bit lines or word lines via contact pads 310.

A second portion above the base portion is referred to as BEOL ("Back End Of (Manufacturing) Lines"). BEOL is where the multiple layers of R/W material, word lines and vertical local bit lines are formed. The local bit lines are connected to respective contact pads in the FEOL portion. Schematically, a plurality of local bit lines 330 in the z-direction are connected to a set of the contact points 310. Along the z-direction, a stack of memory element layers is formed. At each layer a pair of word lines 340 surrounds from opposite sides a set of local bit line 330. For example, the set of local bit lines ($LBL_{11}$, $LBL_{21}$, $LBL_{,31}$, . . . ) is surrounded by word lines ($WL_{10}$, $WL_{11}$) in layer 1 and ($WL_{20}$, $WL_{21}$) in layer 2, . . .

The bit line 330 is preferably formed from P+ polysilicon. In a region of a bit line where it is adjacent a word line, the region 332 is doped with N+ doping. In this way a diode 336 is formed in each region of the bit line 330 when it is adjacent a word line 340. In between each word line 340 and the diode 336 is formed a R/W memory element 346. In a preferred embodiment, the resistive memory element 346 is formed by a Ti layer 344 next to the word line 340 followed by a HfOx layer 342. The top layer of the 3D structure is capped by a nitride layer 350. Thus, various layers of R/W elements 342 and 344 and diodes 332 and 330 are formed about each vertical local bit line 330 along the x-direction (e.g., $LBL_{11}$, $LBL_{21}$, $LBL_{31}$, . . . ) so that they are coupled on one side to respective bit lines 330 and on the other side to respective word lines WL 340 (e.g., $WL_{10}$, $WL_{20}$, $WL_{30}$, . . . ) formed subsequently. Similar R/W elements and diodes are formed on another side of the same set of bit lines 330 ($LBL_{11}$, $LBL_{21}$, $LBL_{31}$, . . . ) along the x-direction and also connected to respective word lines ($WL_{11}$, $WL_{21}$, $WL_{31}$, . . . ).

Other volumes of the BEOL portion are filled by a dielectric such as an oxide 320. In this way a 3D R/W array is formed similar to that illustrated schematically in FIG. 19 except for the diode in series between each R/W element and its respective bit line.

Figure 24A:
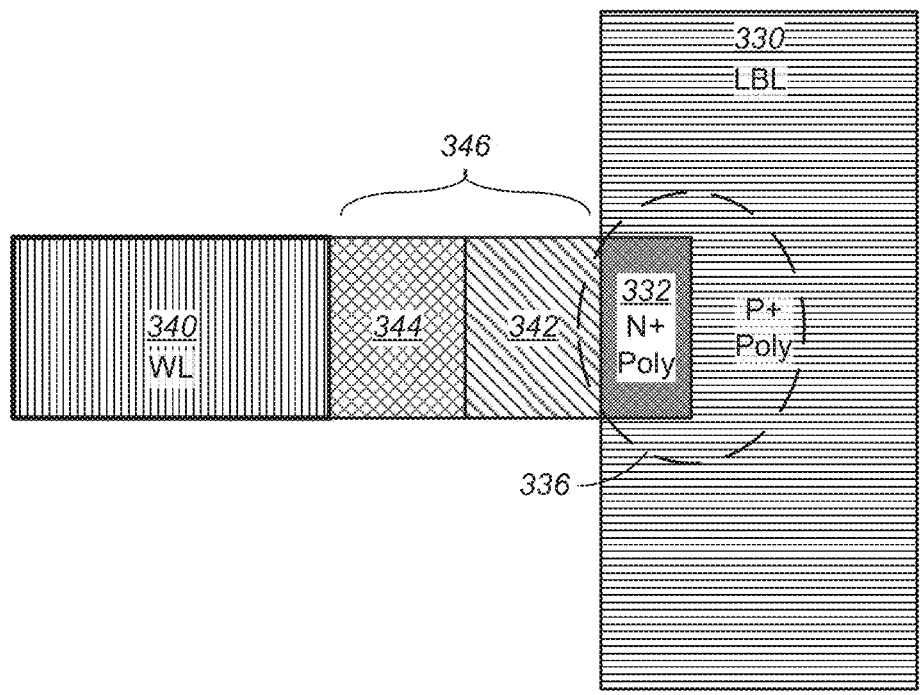
FIG. 24A illustrates in more detail the R/W element and diode formed between a pair of word line and bit line at a crossing.

FIG. 24A illustrates in more detail the R/W element and diode formed between a pair of word line and bit line at a crossing. In one embodiment, the R/W memory element 346 is formed with the Ti layer 344 and the HfOx layer 342. The Ti layer is in electrical contact with the word line 340 while the HfOx layer 342 is in electrical contact with the diode 336. The bit line 330 is generally doped as a P+ polysilicon. However, it is countered doped as N+ in the region 332 where there is a crossing with a word line such as the word line 340. The resulting PN junction effectively forms the diode 336 which is disposed in series with the R/W element 346 between the word line 340 and the local bit line 330.

Figure 24B:
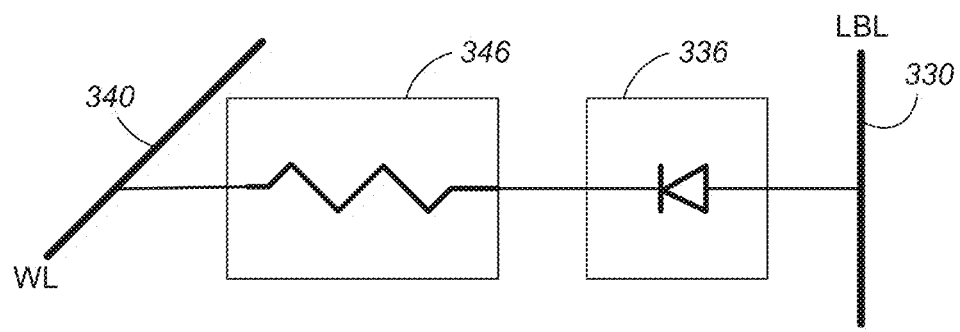
FIG. 24B illustrates schematically the equivalent circuit of the R/W memory element 346 and diode 336 in series between each crossing of a word line 340 and a local bit line 330.

FIG. 24B illustrates schematically the equivalent circuit of the R/W memory element 346 and diode 336 in series between each crossing of a word line 340 and a local bit line 330.

The 3D memory structure shown in FIG. 23 and also in FIG. 24A and FIG. 24B has the advantage of realizing a 3D memory where each memory element has a diode isolation to reduce current linkage to adjacent local bit lines. Unlike prior art structure where the diode is formed on top of each memory element in the z-direction, the horizontal (x-direction) orientation of the memory element 346 allows each diode to be formed as a region of a local bit line, thereby not taking up additional space.

FIGS. 25A-25F illustrate the formation of the BEOL (top) portion of 3D memory shown in FIG. 23 at various processing stages.

Figure 25A:
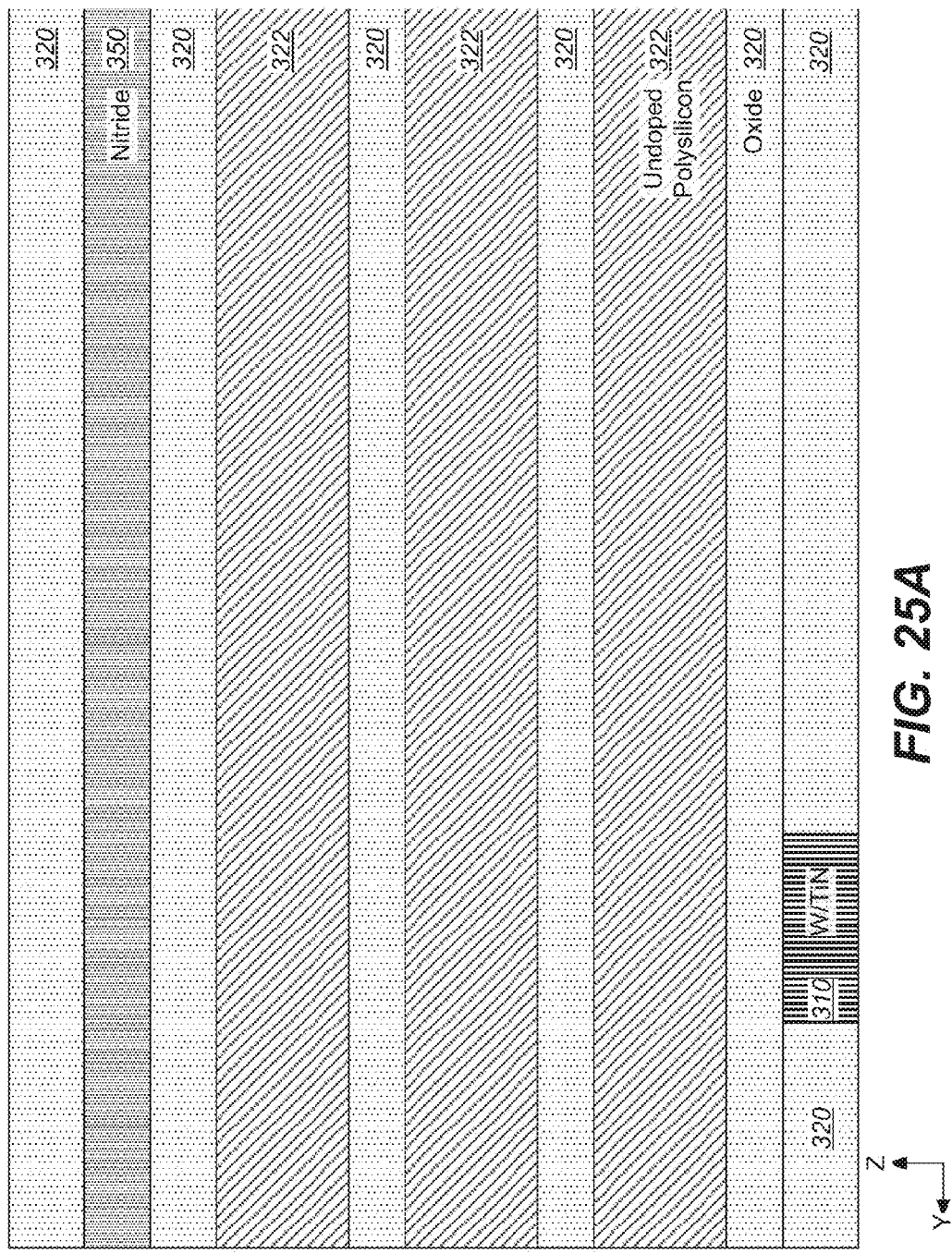
FIG. 25A illustrates the formation of the BEOL portion as a multi-layer structure being formed on top of the FEOL base layer.

FIG. 25A illustrates the formation of the BEOL portion as a multi-layer structure being formed on top of the FEOL base layer. A gross structure is formed as a sandwich of multiple alternate layers of oxide 320 and layer of sacrificial material 322. Undoped polysilicon is preferably used to form the sacrificial layer 322 as it can easily be etched away and replaced by other structures. The FEOL base layer is formed with the switching devices Qxy which switch between respective global line and drain terminals as described earlier. A metal pad of preferably W or TiN is formed on each drain terminal to make the connection. This is followed by a layer of oxide 320. The layer of oxide is then planarized to be flushed with that of the metal pads. Subsequently, a sandwich of alternate layers of undoped polysilicon 322 and oxide 320 are laid down. The sandwich is capped by a protective nitride layer 350. In the preferred embodiment, another sacrificial layer of oxide is also deposited on top of the nitride layer.

Figure 25B:
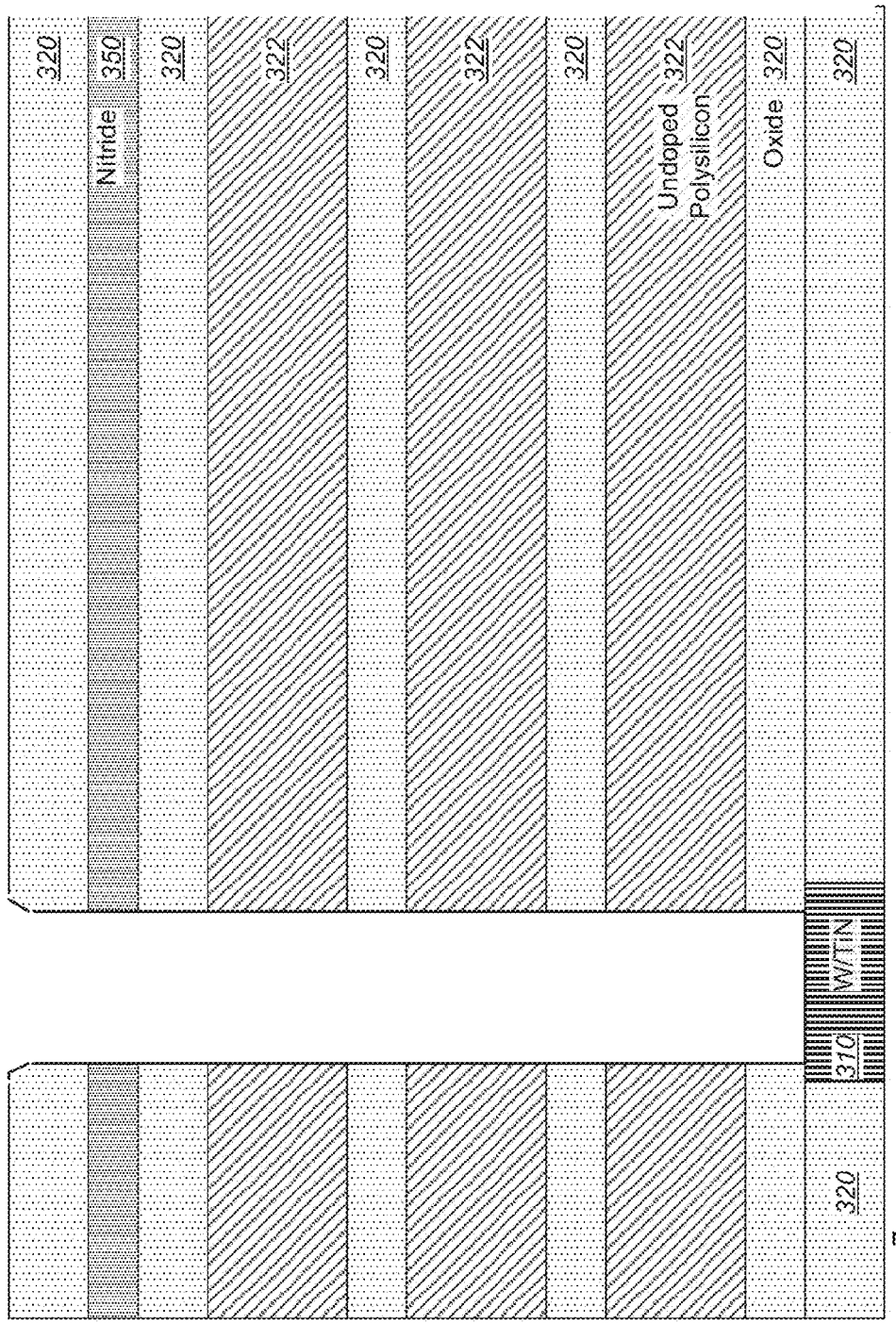
FIG. 25B illustrates the formation of trenches where the plurality of local bit lines 330 are to be formed in the 3D structure of FIG. 25A.

FIG. 25B illustrates the formation of trenches where the plurality of local bit lines 330 are to be formed in the 3D structure of FIG. 25A. Essentially a hard mask ("HM") deposition and lithography is set up so that vertical trenches running along the x-direction in the 3D structure can then be etched away to form the trenches where the local bit lines are to be formed. The trenches are lined up with contact pads in the x-direction so that local bit lines will be formed to make contacts with the contact pads.

Figure 25C:
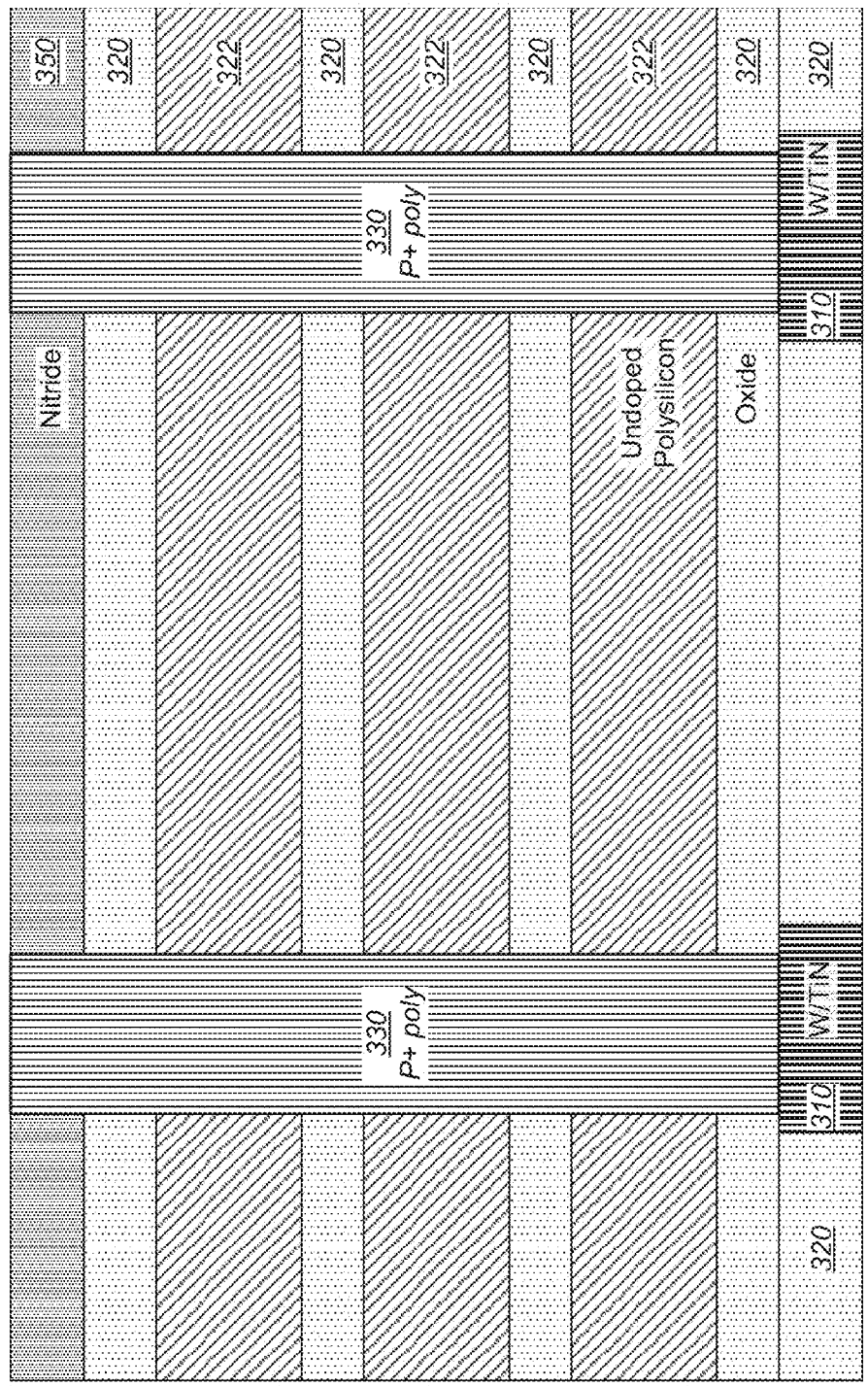
FIG. 25C illustrates the formation of the local bit lines in the trenches of FIG. 25B.

FIG. 25C illustrates the formation of the local bit lines in the trenches of FIG. 25B. After HM removal, a BOE ("buffered oxide etch) help to clean the structure exposing the nitride layer as a top layer. The local bit lines 330 are then formed (in the form of a slab along the x-direction) by filling the trenches with P+ poly. The P+ poly is then planarized.

Figure 25D:
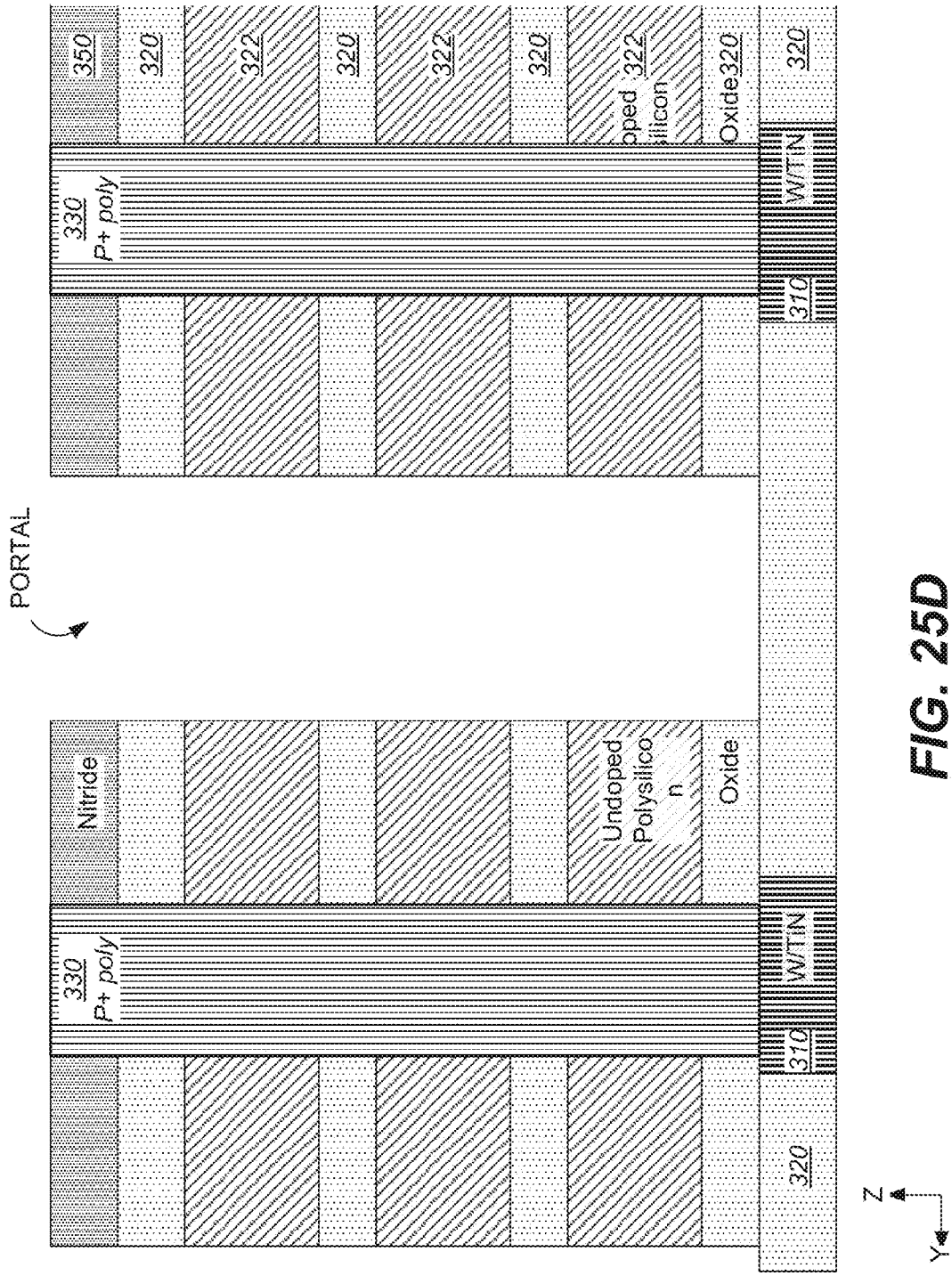
FIG. 25D illustrates the formation of a portal to access the stratified 3D structure laterally.

FIG. 25D illustrates the formation of a portal to access the stratified 3D structure laterally. This allows the structures in each layer, such as R/W elements, diodes and word lines, to be formed for all layers in parallel. This is accomplished by HM deposition followed by litho and etch.

Figure 25E:
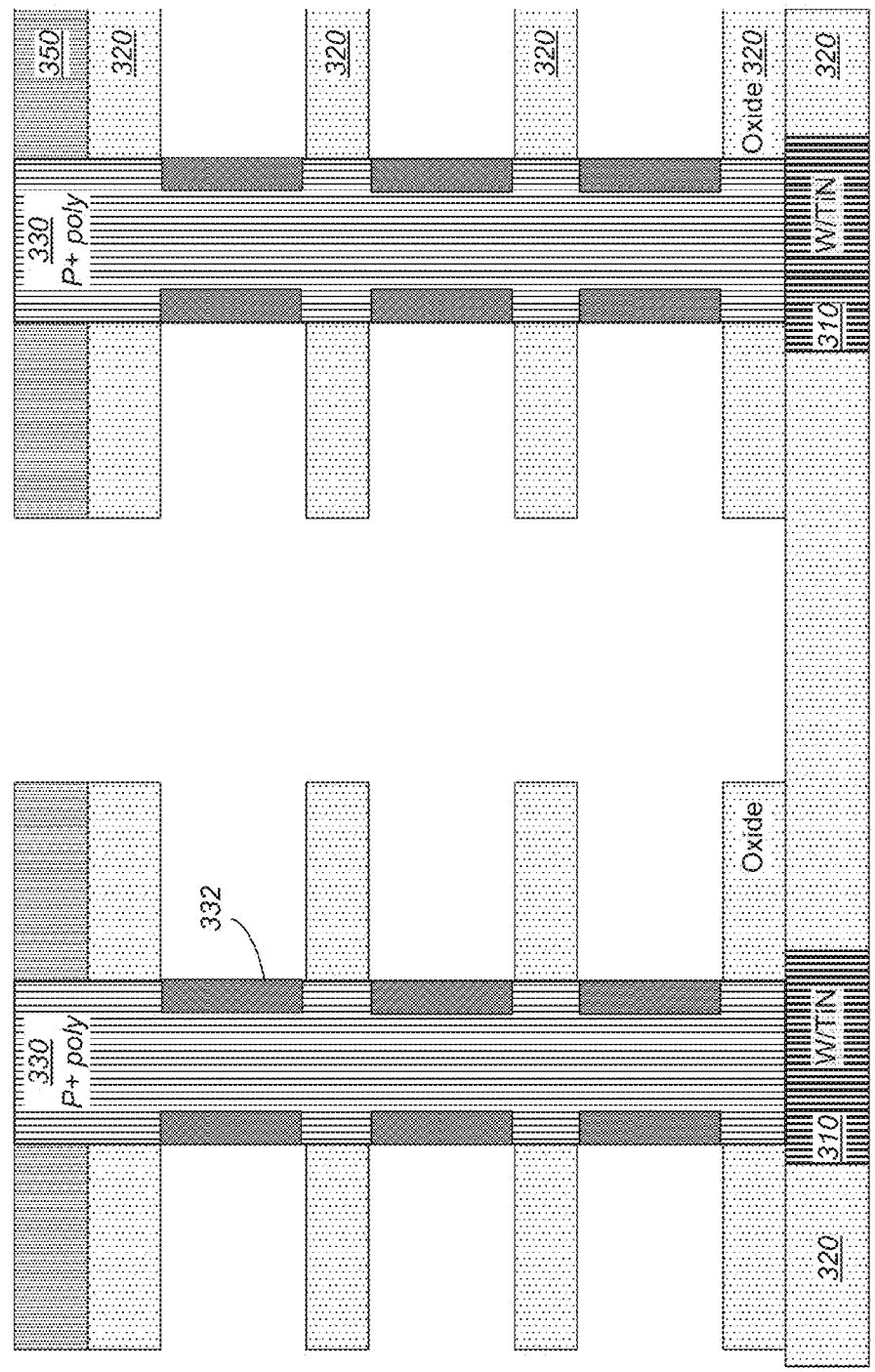
FIG. 25E illustrates the formation of recessed spaces for forming the structures in each layer.

FIG. 25E illustrates the formation of recessed spaces for forming the structures in each layer. The recessed spaces for all layers are created in parallel. This is accomplished by a KOH wet etch followed by a second, isotropic recess etch which selectively removes the undoped poly right up to the columns of the local bit lines.

The exposed bands of the slabs of local bit lines are then counter-doped with N+ by a gas-phase doping process. This will create a PN junction just below the exposed surface of the local bit lines.

In another embodiment, the local bit lines are formed with N+ polysilicon. The diode will then be made by P+ diffusion.

In another embodiment where diodes are not implemented, the N+ doping will be skipped. In that case, the local bit lines can be formed with metal.

Figure 25F:
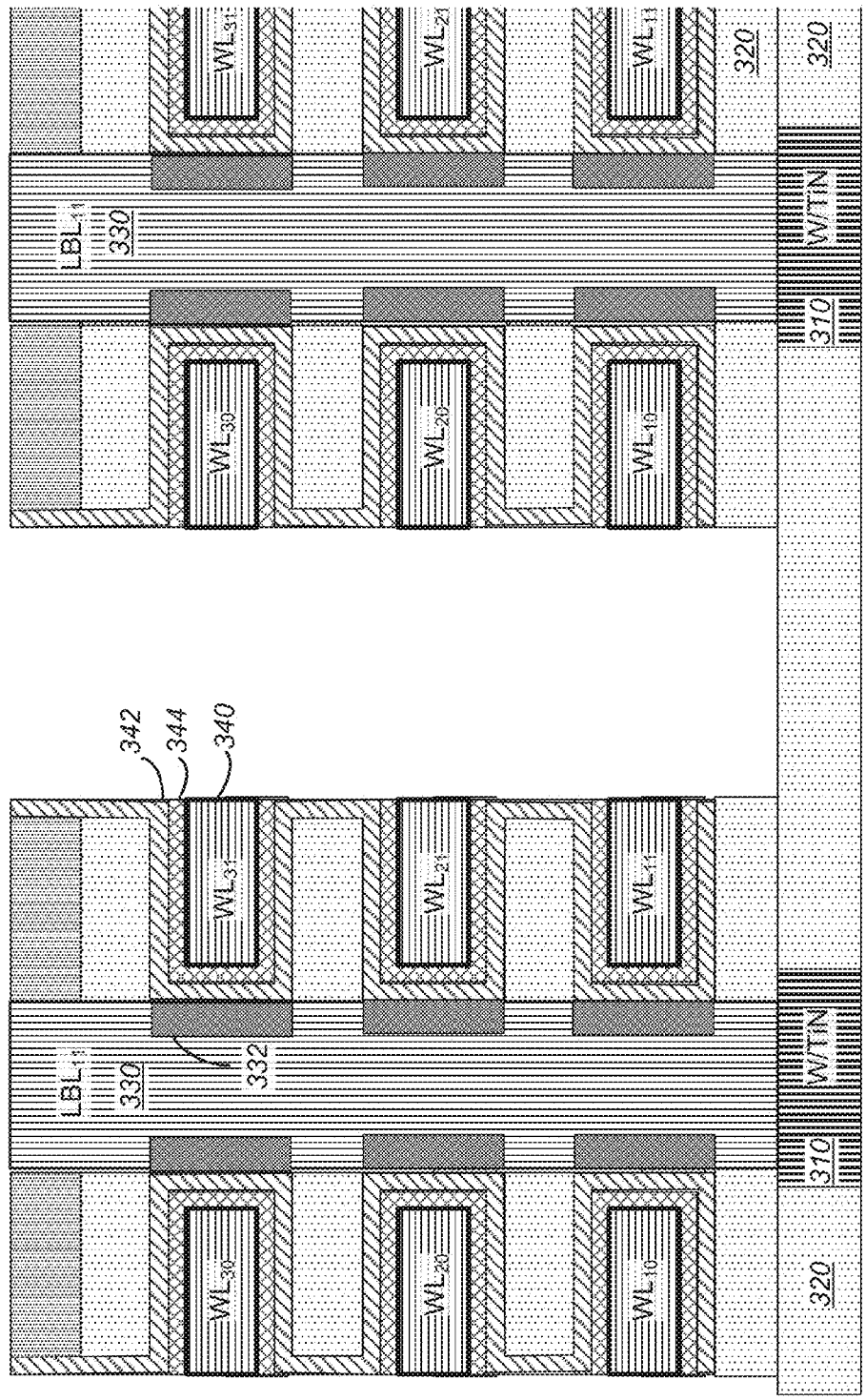
FIG. 25F illustrates the formation of the R/W layer followed by the word line for each of all the recessed spaces.

FIG. 25F illustrates the formation of the R/W layer followed by the word line for each of all the recessed spaces. The recessed space is first BOE (Buffered Oxide Etched) etched. Then the R/W material is formed by Atomic Layer Deposition of a first layer 342 (e.g., HFOx.) This is followed by depositing a second layer 344 (e.g., Ti (titanium)) by Chemical Vapor Deposition.

Next, the word lines 340 can be formed. With the high-temperature process of forming the active elements of the diodes 332, 330 all completed as described in FIG. 25E, the metallization can be optimized for its conductivity without regard to subsequent high-temperature degradation. For example, aluminum or copper could be deposited. In other embodiments, high-temperature metals can also be contemplated such as a thin layer of TiN followed by a bulk layer of W (titanium) by Chemical Vapor Deposition. The excess from various depositions can be etched back.

Figure 25G:
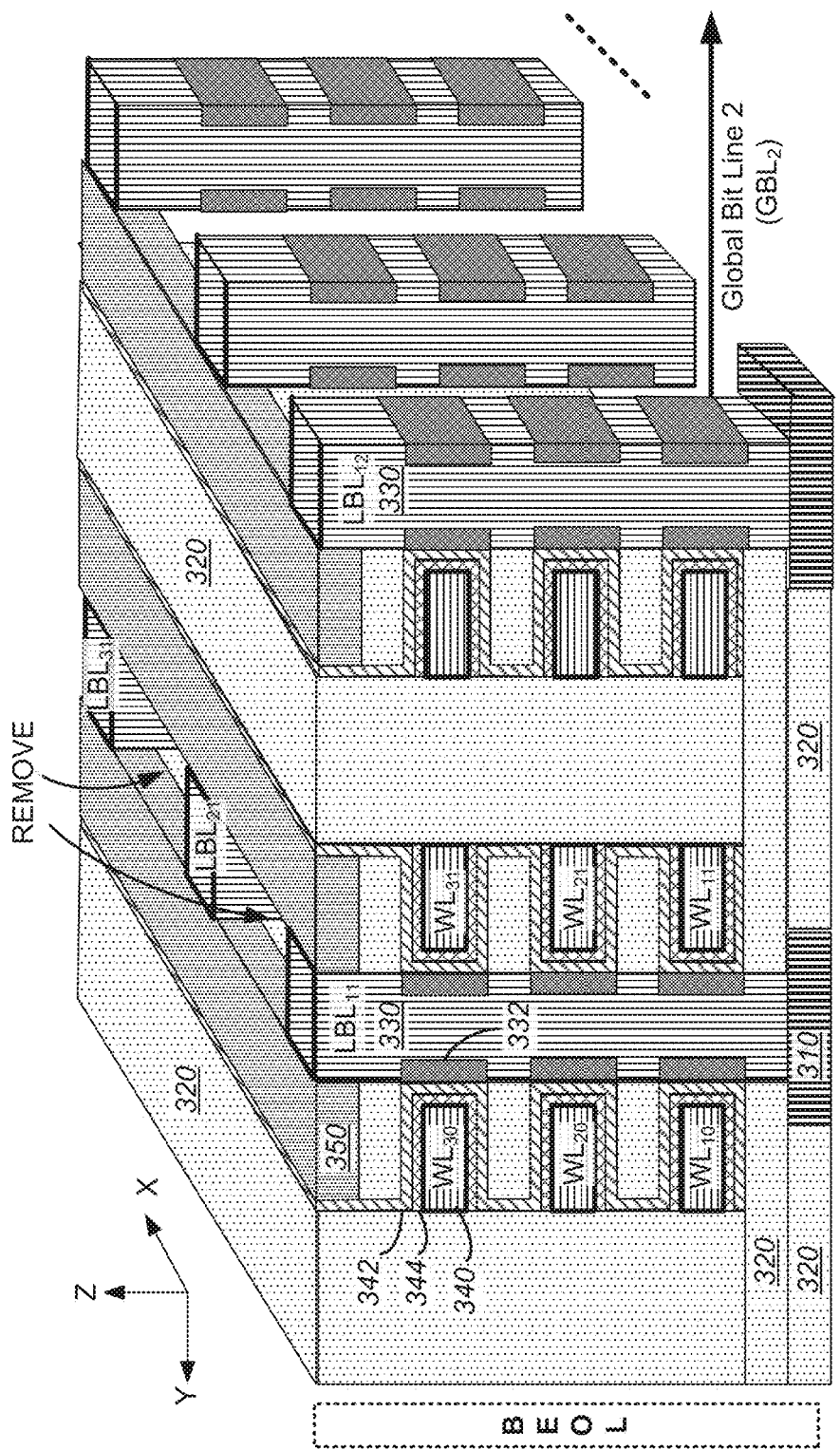
FIG. 25G illustrates the formation of the individual local bit line columns by first removing portions of the local bit line slab along the x-direction.

FIG. 25G illustrates the formation of the individual local bit line columns by first removing portions of the local bit line slab along the x-direction. The resulting voids are then filled with oxide 320 as shown in FIG. 23. The top surface is planarized by chemical and mechanical polishing.

Figure 26B:
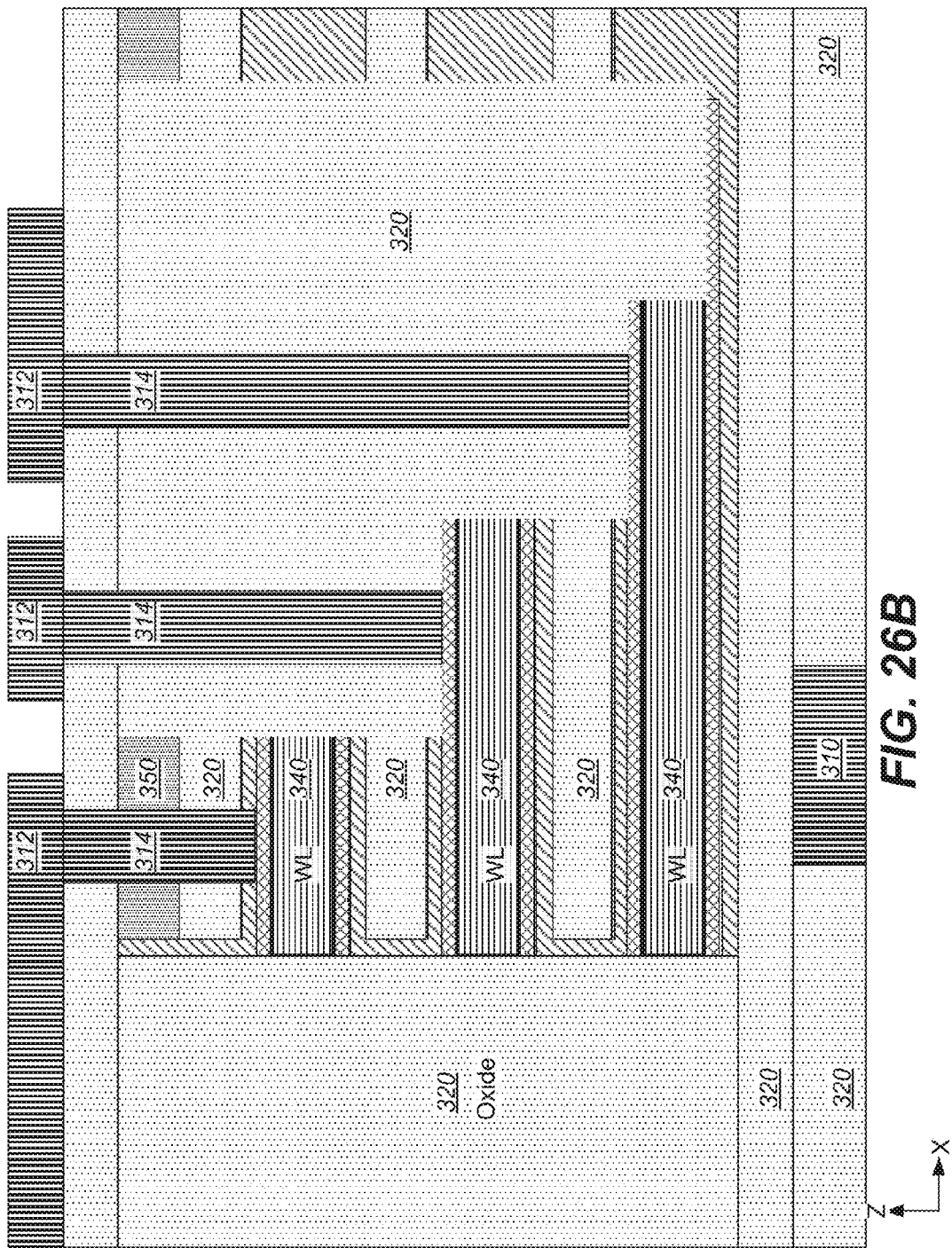
FIG. 26B illustrates the formation of the surface metal lines connecting to the respective word lines by riser columns.

FIG. 26A-26B illustrate the formation of metal lines and contacts for accessing the word lines 340 of the 3D memory shown in FIG. 23. Essentially, the word lines are accessed by contacts from either top or bottom of the 3D memory structure. Each word line is connected to a metal line at a surface of the 3D memory structure by a vertical riser column 314.

FIG. 26A illustrates the 3D structure is terraced to provide an offset at different layers. By terracing the different layers, the word lines at each layer will have an unobstructed path for its riser column from the top. Preferably, the access is at the ends of the word lines. For example, terracing is formed at both ends of the 3D structure along the x-direction so that the metal lines at the surface is at half density compared to accessing all the word lines from one end. After terracing and creating an unobstructed view for each layer of word lines, the volume removed during terracing is refilled with oxide and planarized.

FIG. 26B illustrates the formation of the surface metal lines connecting to the respective word lines by riser columns. The spaces for the riser columns are etched away from the top of each of the terrace layers to make way for the riser column. The resulting void is then filled with a riser column 314 that connects a word line to the top surface of the 3D structure.

In one embodiment, the riser column 314 can then be connected by a metal line 312 formed at the top surface.

According to another aspect of the invention to be described in more detail in a next section, the word lines are accessed via some of the global bit lines, such as those shown in FIG. 22.

Figure 27:
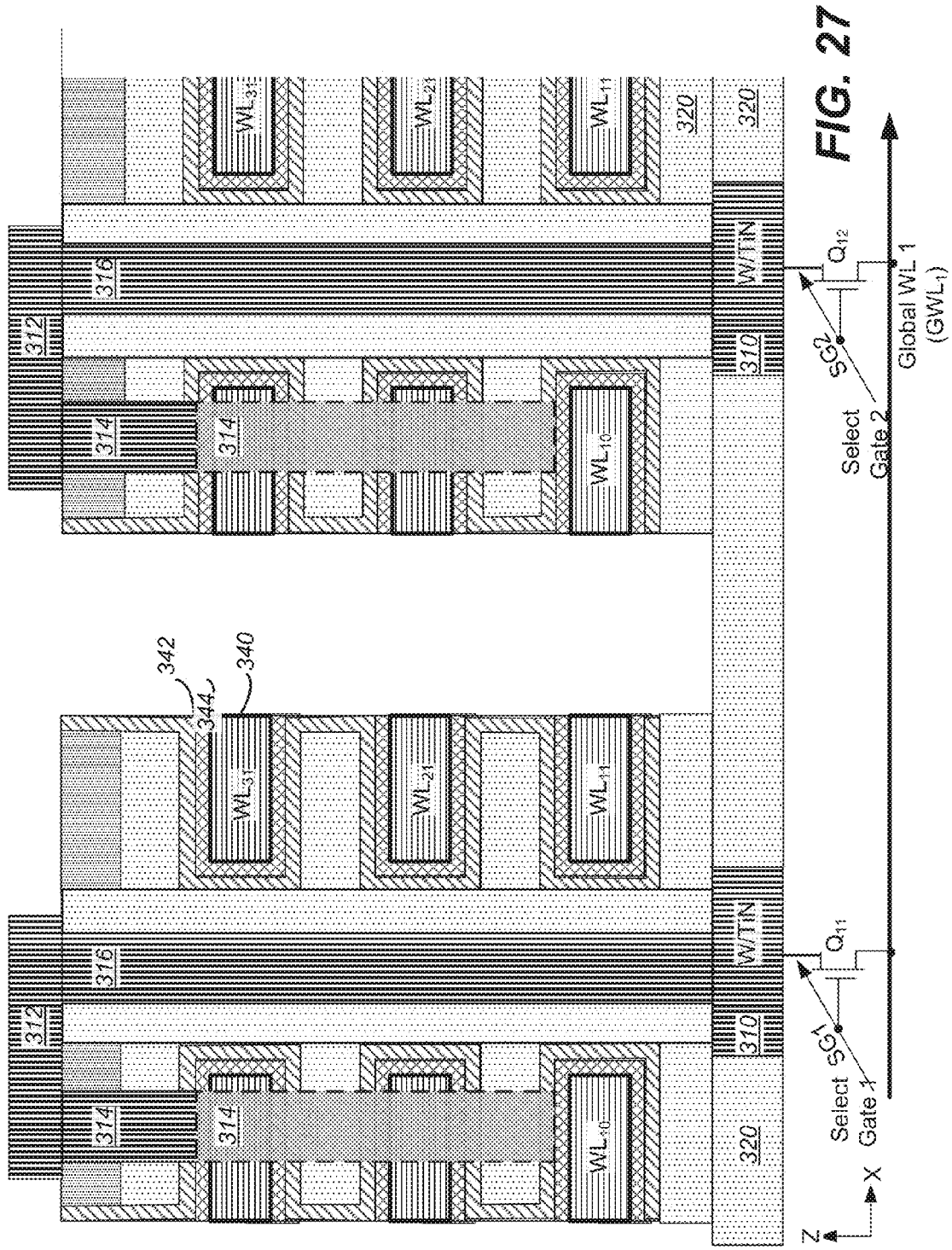
FIG. 27 illustrates another embodiment in where the word lines are accessed by metal wires at the base portion of the 3D structure, such as appropriating some of the global bit lines shown in FIG. 22 to act as global word lines.

FIG. 27 illustrates another embodiment in where the word lines are accessed by metal wires at the base portion of the 3D structure, such as appropriating some of the global bit lines shown in FIG. 22 to act as global word lines. In one embodiment, the connection to a word line is brought to a metal line at the top of the 3D structure as in FIG. 26A and FIG. 26B. With the metal line at the top serving as a connection bridge, a second column riser 316 drills down to make contact with an appropriate global word line via one of the contact pads 310. To form the second riser columns 316, columns are evacuated from the top of the 3D structure and then filled with conductive material such as metal. Then the metal lines 312 at the top serving as connection bridges are formed.

Efficient Decoding of Vertical Bit Lines And Horizontal Word Lines

According to anther aspect of the invention, a 3D memory having multiple layers of 2D array of R/W elements in the x-y plane are accessible by word lines among each layer and an array of vertical local lines in the z-direction common to all layers. A plurality of metal lines along the y-direction is provided either at a base portion or a top surface of a 3D memory. A first set of the metal lines is switchably connected to allow access to a first set of vertical local lines acting as a selected group vertical local bit lines. A second set of the metal lines is switchably connected to allow access to a second set of vertical local lines connected to selected word lines in respective layers.

The set of metal lines serves as global access lines for selected sets of local bit lines and word lines. The switching of the set of metal lines to the selected sets of local bit lines and word lines is accomplished by a set of switching transistors at the base portion of the 3D memory. When the metal lines are located at the top surface of the 3D memory, a set of riser columns provides the connections from the switching transistors to the metal lines.

As described earlier, the 3D memory array has a base layer (FEOL) portion and another portion (BEOL) having multiple layers memory element planes. In the embodiments described earlier in connection with FIG. 1, FIG. 7 and FIG. 22, a set of metal lines acting as global bit lines are formed at the base portion (FEOL) of the 3D structure.

In the present invention not all the metal lines in the set are used for decoding the local bit lines. Similarly, not all the local vertical lines in the array are used as local bit lines. Instead some of the metal lines and some of the local vertical lines are reserved for decoding a set of selected word lines, two from each layer. This scheme provides a highly scalable decoding architecture. It allows decoding of any combination of word lines and local bit lines. It allows further segmentation of the word lines into local word lines, thereby helping to reduce the word line resistance and the interactivity of the 3D resistive mesh.

Figure 28:
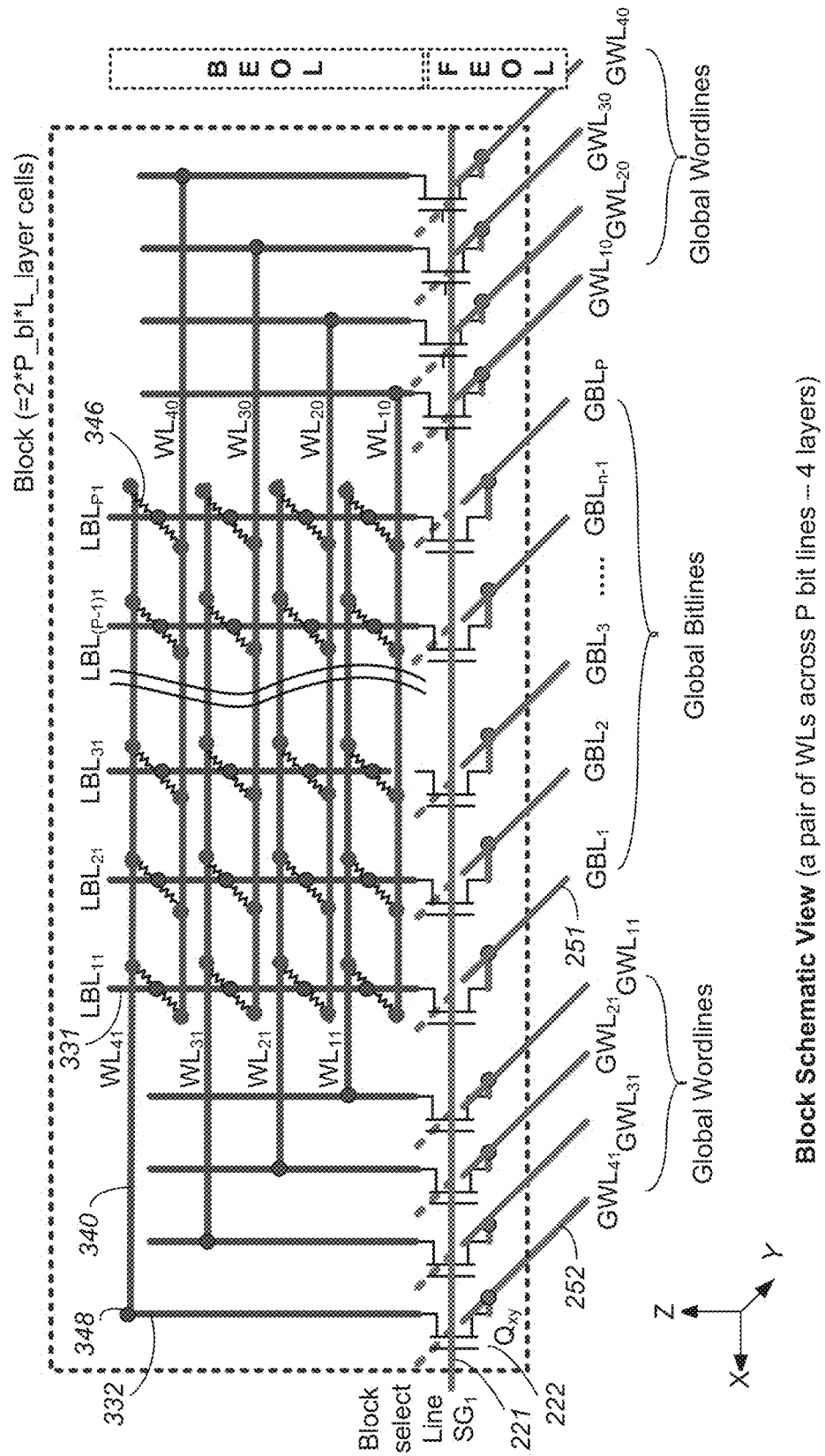
FIG. 28 illustrates an efficient decoding of vertical bit lines and horizontal word lines in a 3D memory array via a set of global lines and select devices.

FIG. 28 illustrates an efficient decoding of vertical bit lines and horizontal word lines in a 3D memory array via a set of global lines and select devices. An example 3D array with 4 layers stacked along the z-direction is shown. Similar to the 3D array shown in FIG. 17 and FIG. 23, the 4 layers are accessible by a 2D array of local vertical lines 331 and 332 in the z-direction. The 2D array of local vertical lines are partitioned into two sets. A first set of local vertical lines 331 individually act as local bit lines and is switchably connected to a first set of global lines such as global bit lines 251. A second set of local vertical lines 332 individually act as interconnects that are switchably connected between the word lines 340 and a second set of the global lines such as global word lines 252. Each of the first set of local vertical lines 332 makes contact with a word line at each layer via a connector or contact 348. At each layer there will be a set of word lines 340 spaced apart along the y-direction and with each word line running along the x-direction.

FIG. 28 only shows one block of memory elements constituted from a selected pair of word lines 340 on each layer, wrapping on both sides of a selected page of vertical local lines 331 acting as local bit lines ($LBL_{11}$, $LBL_{21}$, $LBL_{31}$, ..., $LBL_{(P-1)1}$, $LBL_{P1}$). Thus, WL10 and WL11 are the selected pair of word lines at layer 1; WL20 and WL21 are the selected pair of word lines at layer 2; WL30 and WL31 are the selected pair of word lines at layer 3; and WL40 and WL41 are the selected pair of word lines at layer 4. The block is constituted from 2*P_bl*L_layer of memory elements. In the current example P_bl=P and L_layer=L, amounting to 2PL memory elements.

The decoding of a selected page of local bit lines is similar to before where there is a first set P metal lines ($GBL_1$, $GBL_2$, $GBL_3$, ..., $GBL_P$) acting as the first set of global lines (global bit lines) 251 to access the selected page of local bit lines among the first set of vertical local lines 331. Since the memory has a page architecture with two word lines (even and odd) on each layer around the same page of local bit lines, there is a second set of 2×4 metal lines acting as a second set of global lines (global word lines) 252. The metal lines are distributed on both side of the first set, with a left flank of 4 metal lines ($GWL_{11}$, $GWL_{21}$, $GWL_{31}$ and $GWL_{41}$) respectively for the odd word lines ($WL_{11}$, $WL_{21}$, $WL_{31}$ and $WL_{41}$) at each of the 4 layers. Similar, there is a right flank of 4 meal lines ($GWL_{10}$, $GWL_{20}$, $GWL_{30}$ and $GWL_{40}$) respectively for the even word lines ($WL_{10}$, $WL_{20}$, $WL_{30}$ and $WL_{40}$) at each of the 4 layers. The connections of the metal lines (global lines) to selected word lines and local bit lines are via the select devices Qxy 222 controlled by the select line 221 such as $SG_1$ acting as a block select line.

Thus, a selected page/block is decoded by asserting the block select line $SG_1$. As described before, the R/W elements 346 in the block are accessible by the global lines with the bit lines accessed via the global lines 251 and the word lines via the global lines 252. Sensing circuits are then connectable to the bit lines for sensing the memory state of the R/W elements.

Figure 29:
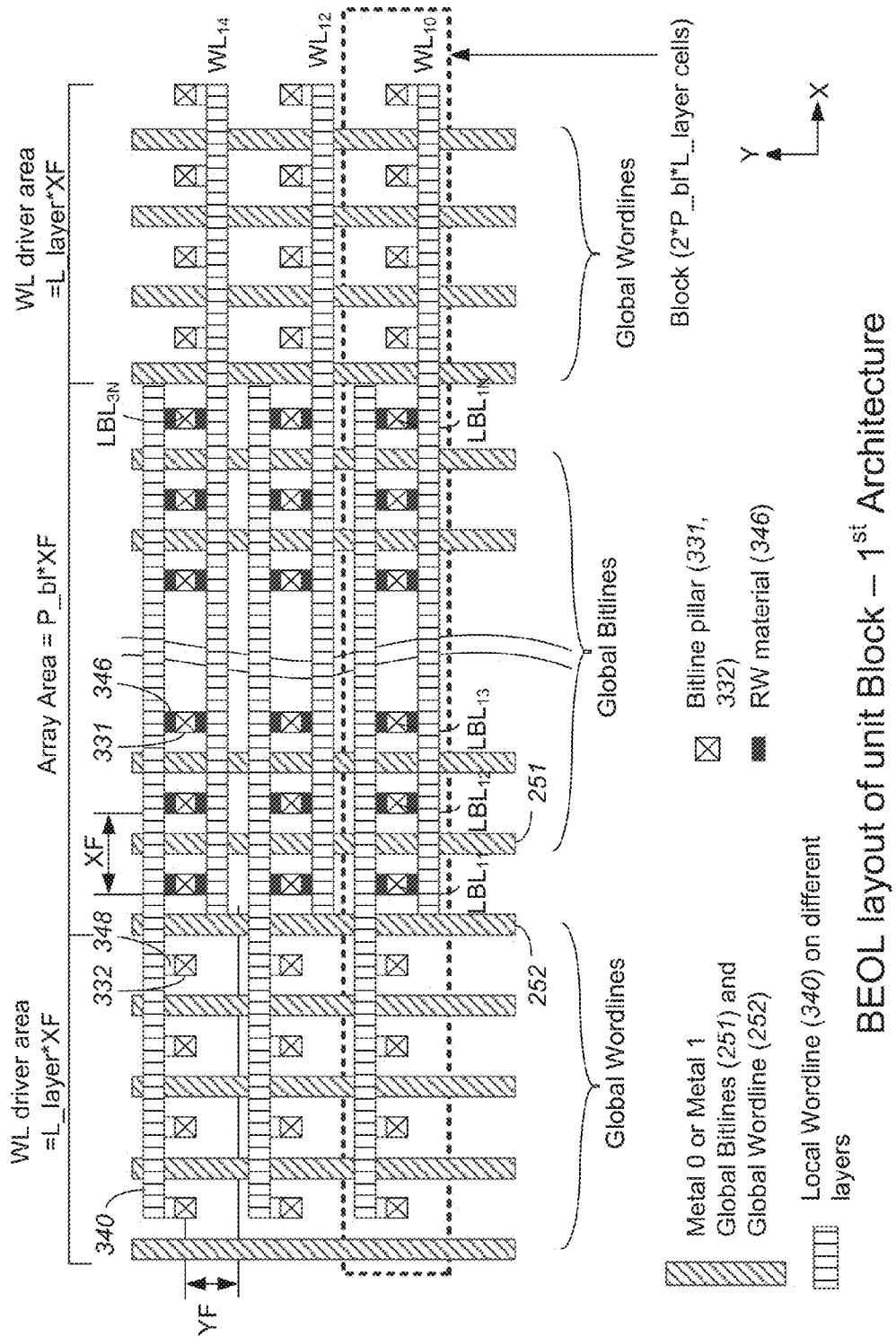
FIG. 29 illustrates a BEOL (top portion of the 3D memory) layout for the word lines and the R/W elements according to a first architecture for the 3D array shown in FIG. 28.

FIG. 29 illustrates a plan view of a BEOL (top portion of the 3D memory) layout for the word lines and the R/W elements according to a first architecture for the 3D array shown in FIG. 28. In the first BEOL architecture, the global lines 250 (include global word lines 252 and global bit 251 lines) are offset (~1 F; F is the feature length) from each of the pillars of vertical local lines 330 (include vertical local bit lines 331 and vertical local lines 332).

The array of vertical local lines are divided into a first set and a second set. The first set acts as vertical local bit lines, where each local bit line 331 is used to access a R/W element 346 in combination with a word line 340. In the preferred embodiment, at each layer, a local bit line is shared between a pair of word lines for accessing two R/W elements. Each local bit line 331 is coupled to a metal line forming a global bit line 251.

Each of the second set of vertical local lines 332 acts as an interconnect between a word line 340 and a metal line forming a global word lines 252. The vertical local line 332 is connected to the word line 340 via the connector 348. If there are four layers, there will be four vertical local line per row of word lines. The first vertical local line is connected to the word line on the first layer, the second vertical local line is connected to the word line on the second layer, etc.

A unit cell has dimension XF*YF. XF is limited by bit line pillar to bit line spacing (~4F). YF is limited by local WL to local WL to R/W material to BL pillar (~2.5 F). These give a cell size of ~10F2 for each layer. When amortized over the multiple layers, the cell size is XF*XY/L_layer. However, when taking into account the space occupied by the WL drivers, the effective cell size=XF*XF/L_layer+2*XF*XF/P_bl, where L_layer=number of layers and P_bl is the number bit line in a page of cells that are read or written in parallel. Therefore the percentage loss due to the WL drivers=2*L_layer/P_bl.

The block can be selected by enabling a bank of select devices via a common gate select line (e.g., SG1, see FIG. 28). Thus, the layout of the FEOL (base portion of the 3D memory) will have to accommodate P+2L metal lines plus a number of select devices equal to (P+2L)*(number of pair of word lines in each layer). Each select device is an active region on the base portion (or FEOL plane) of the 3D memory. Typically a select device is formed on the substrate with a poly gate over a pair of source and drain diffusion spots. For a bank of select devices, a common poly line enables control over the bank of select devices in parallel.

Figure 30A:
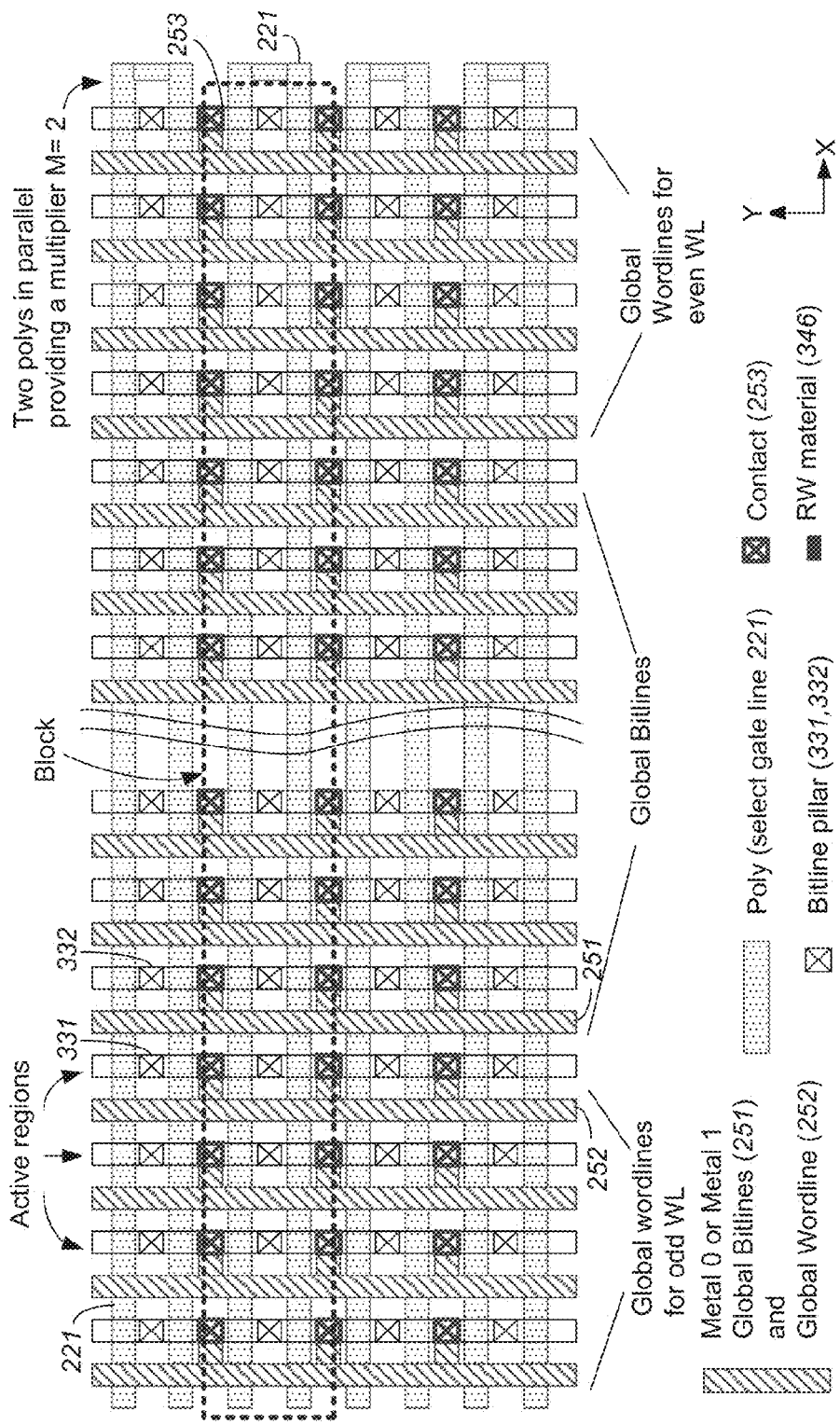
FIG. 30A illustrates a first embodiment of the FEOL layout of a unit block when the BEOL has the first architecture of FIG. 29.

FIG. 30A illustrates a first embodiment of the FEOL layout in a plan view of a unit block when the BEOL has the first architecture of FIG. 29. It will be understood that on either sides of a poly line 221, a plurality of select transistors 222 exists (not shown explicitly), each with its source and drain coinciding with either a vertical local line pillar 331 or 332, or a contact 253. The select transistors are the select devices Qxy 222 shown in FIG. 28. It can be seen that the select devices for switching the bit lines 331 and word lines 340 to the global lines 251 and 252 respectively are size-limited by the spacing between pillars 331 or 332 along the y-direction. However, owing to two contacts 253 adjacent a vertical local line pillar being connected to the same global line, it does have the advantage of doubling the drive power by allowing two banks of select devices to be used in parallel. It therefore has a multiplier of M=2.

Figure 30B:
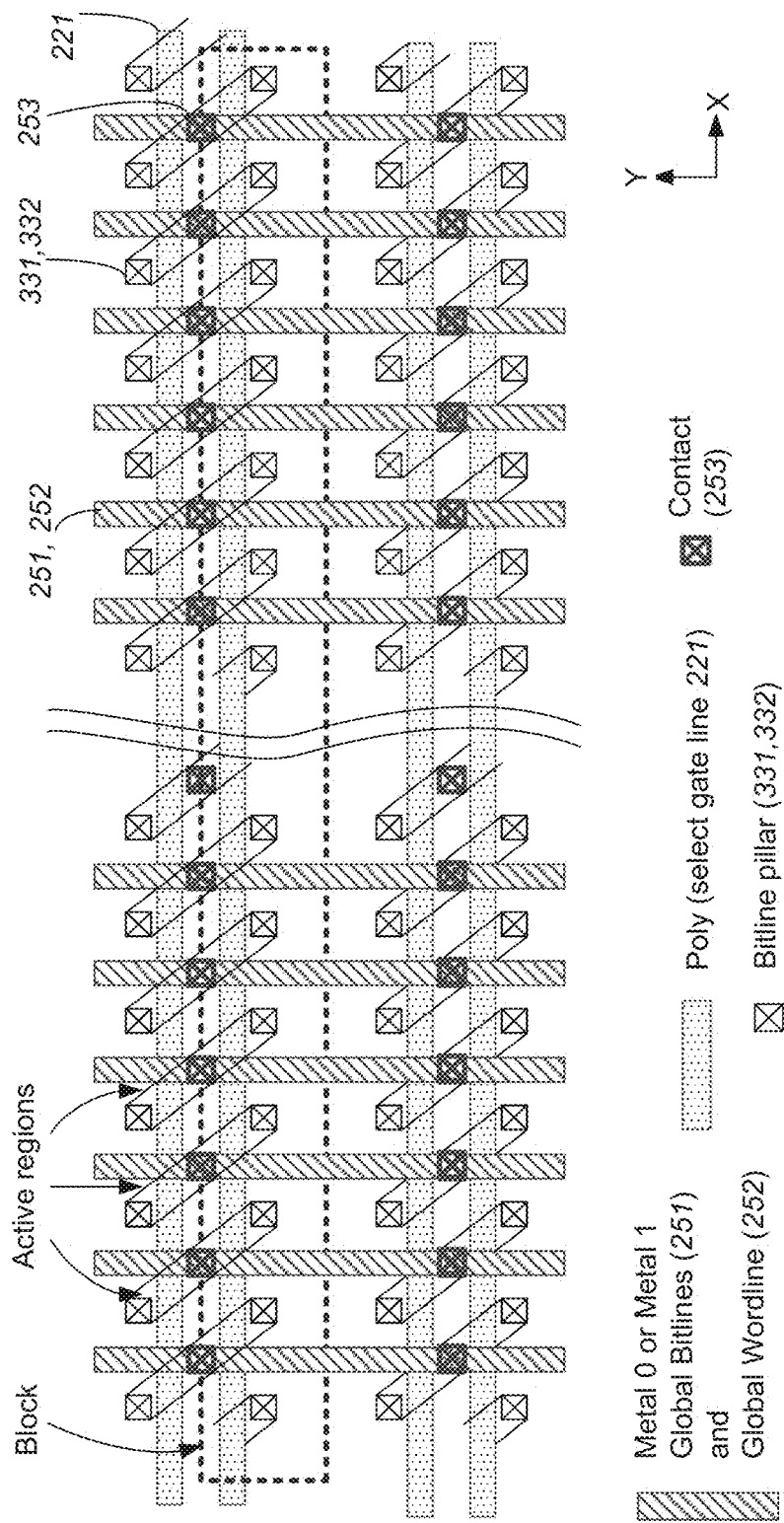
FIG. 30B illustrates a second embodiment of the FEOL layout of a unit block when the BEOL has the first architecture of FIG. 29.

FIG. 30B illustrates a second embodiment of the FEOL layout in a plan view of a unit block when the BEOL has the first architecture of FIG. 29. By forming the active elements (select transistors 222 not shown explicitly but each with its source and drain coinciding with either a vertical local line pillar 331 or 332, or a contact 253) in a diagonal manner relative to the global lines, the length of the select devices can be increased by a factor of SQRT(2). However, the feature of doubling up two banks of select device is not available as the two contact points adjacent to a local bit line pillar are not connected to the same global line. It therefore only has a multiplier of M=1.

Figure 30C:
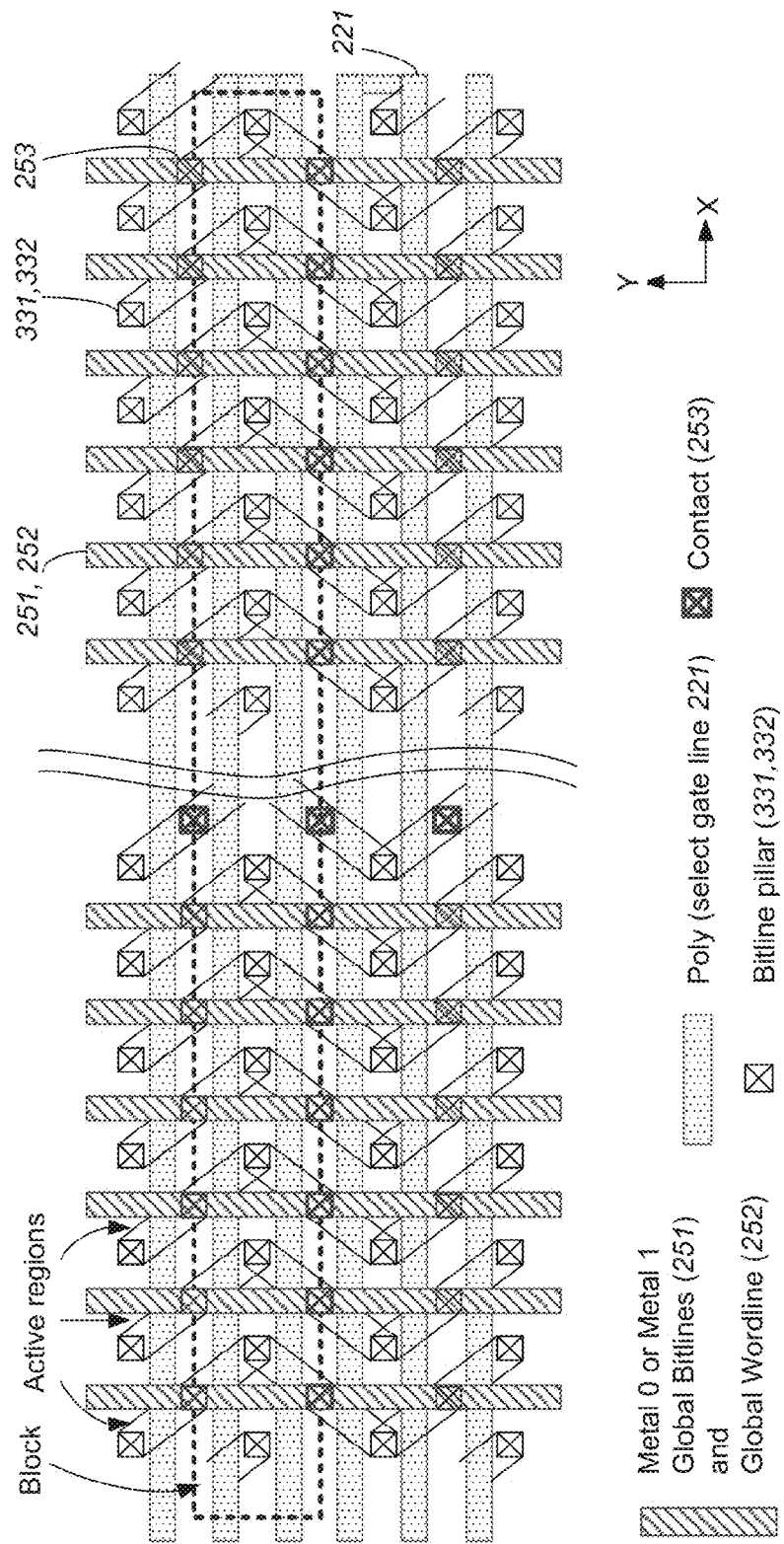
FIG. 30C illustrates a third embodiment of the FEOL layout of a unit block when the BEOL has the first architecture of FIG. 29.

FIG. 30C illustrates a third embodiment of the FEOL layout in a plan view of a unit block when the BEOL has the first architecture of FIG. 29. The third embodiment serves to overcome the deficiency of reduced drive power with M=1 of the second embodiment. With the layout in FIG. 30C, the two contacts on either sides of a local bit line pillar are connected to the same global line. Thus, M again equals 2.

Figure 31:
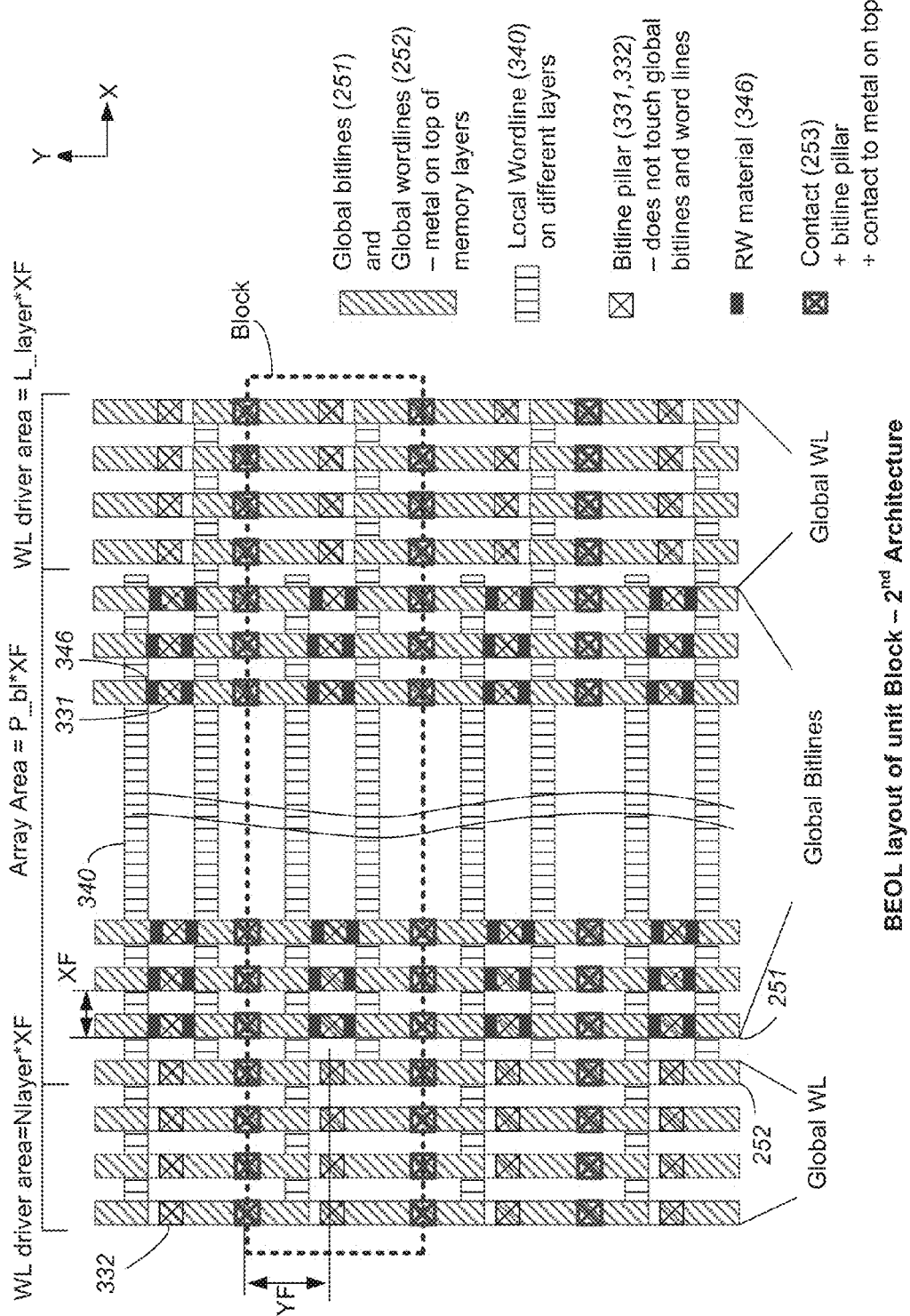
FIG. 31 illustrates a BEOL (top portion of the 3D memory) layout for the word lines and the R/W elements according to a second architecture for the 3D array shown in FIG. 28.

FIG. 31 illustrates a BEOL (top portion of the 3D memory) layout in a plan view for the word lines and the R/W elements according to a second architecture for the 3D array shown in FIG. 28. In the second BEOL architecture, the global lines (include global word lines 252 and global bit lines 251) are formed on the top part of the 3D memory. The global lines are aligned with the pillars of vertical local lines 331 and 332. A unit cell has dimension XF*YF. XF is limited by vertical local line pillar 331, 332 to pillar spacing (~2 F). YF is limited by local WL 340 to local WL to R/W material 346 to vertical local line pillar 331, 332 and also additional space for a contact 253 (~3.5 F). These give a cell size of ~7F2 for each layer. Each bit line pillar make contact with a global line 251 or 252.

Figure 32:
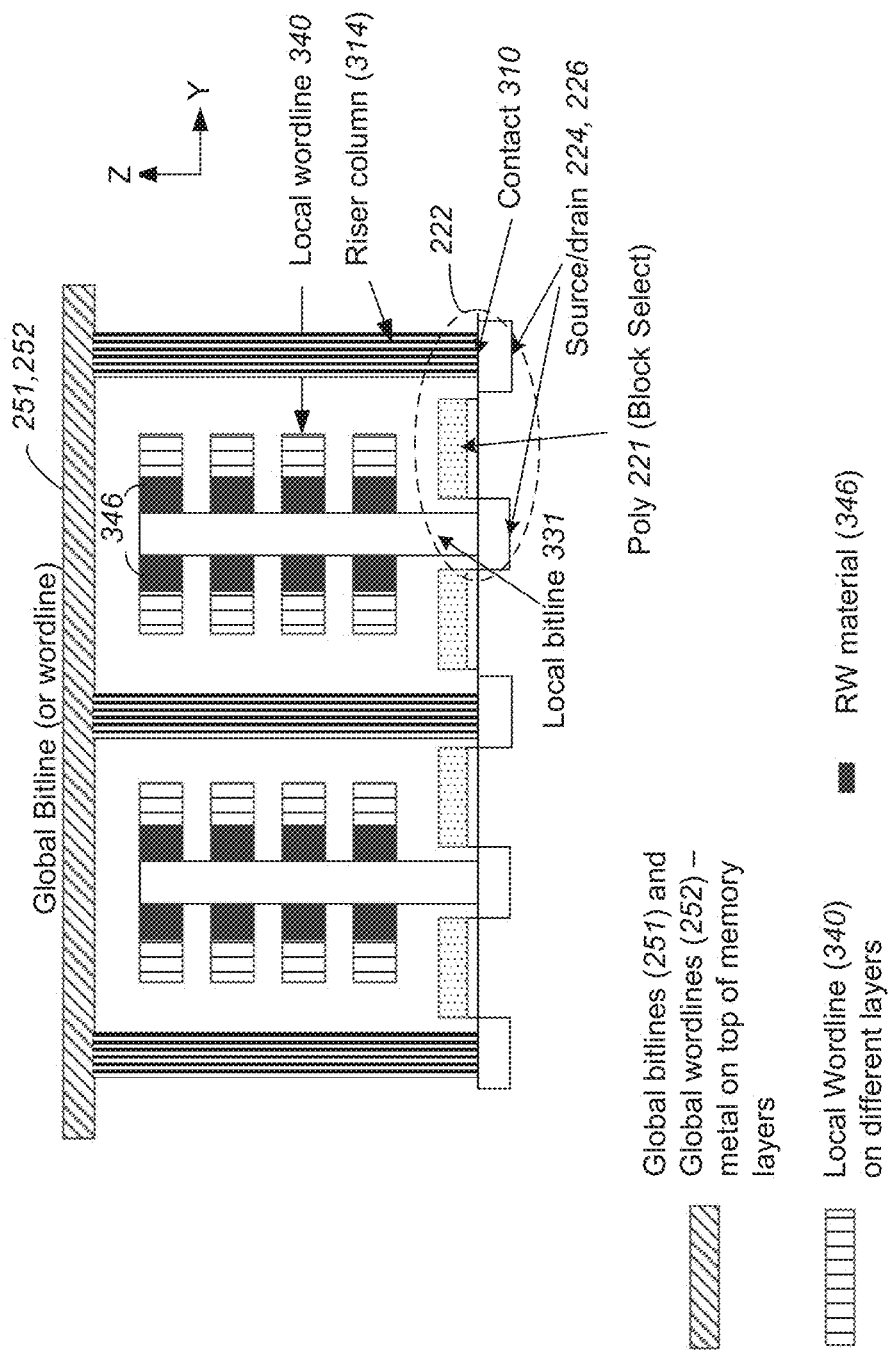
FIG. 32 illustrates a cross section of the BEOL layout of FIG. 31 in the y-z plane.

FIG. 32 illustrates a cross section of the BEOL layout of FIG. 31 in the y-z plane. Essentially, a local bit line 331 associated with a word line 340 sits on one terminal (either source 224 or drain 226) of a select transistor 222 and makes a connection via the select transistor and a riser column 314 with one of the global lines 251 on the top of the 3D memory.

Figure 33:
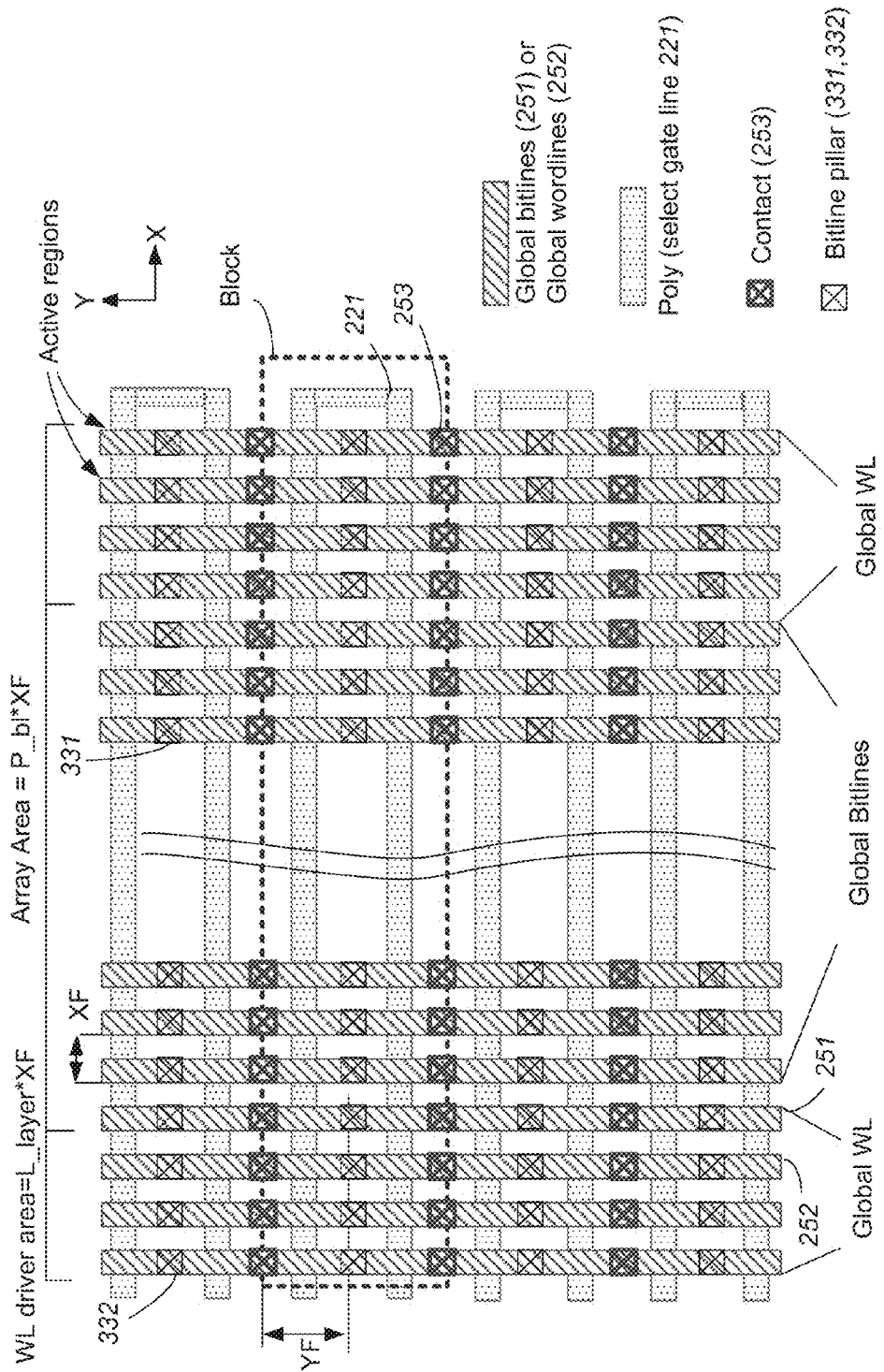
FIG. 33 illustrates a first embodiment of the FEOL layout of a unit block when the BEOL has the second architecture of FIG. 31.

FIG. 33 illustrates a first embodiment of the FEOL layout in a plan view of a unit block when the BEOL has the second architecture of FIG. 31. There are two contacts 253 on either sides of a vertical local line pillar 331 or 332 and they are connected to the same global line 251 or 252. Thus, M again equals 2.

The first embodiment of the second architecture shown in FIG. 33 is similar to the first embodiment of the first architecture shown in FIG. 30A. In the same manner, the second and third embodiments of the first architecture shown respectively in FIG. 30B and FIG. 30C can readily be adapted to the second architecture.

Figure 34:
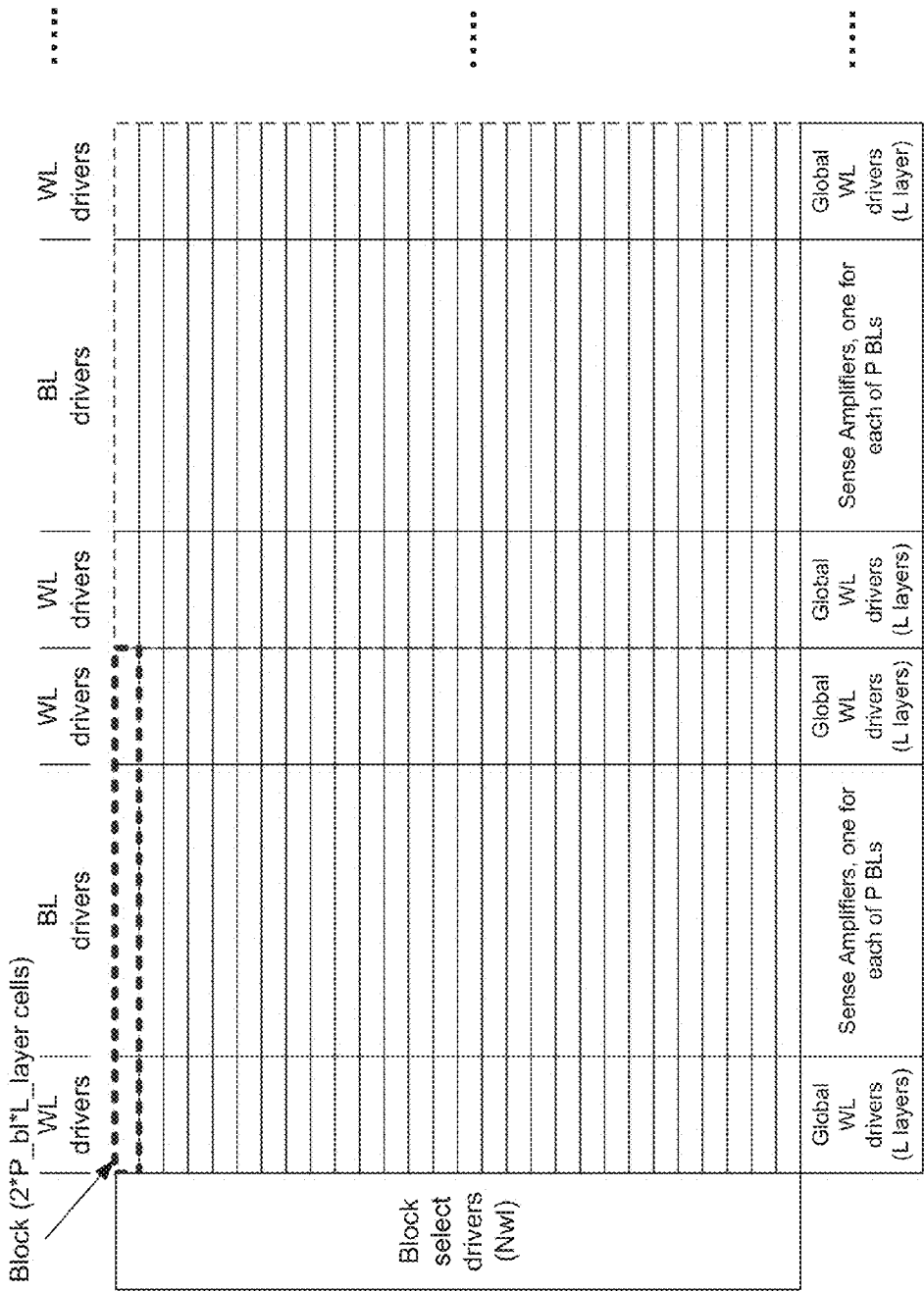
FIG. 34 illustrates a schematic top view of the entire 3D array including peripheral circuits.

FIG. 34 illustrates a schematic top view of the entire 3D array including peripheral circuits. It will be seen that the present architecture of using global lines to decode both the local bit lines and word lines is highly scalable. The global word line drivers, sense amplifiers and block select drivers can be on the same side or on alternate side of the array.

For example, the length of each word line can be halved to reduce the resistance and capacitance across its length. Each time the length of the word line is halved, the number of world lines to decode is doubled, and more vertical local lines and global lines will need to be expropriated for word-line decoding.

Although the various aspects of the present invention have been described with respect to exemplary embodiments thereof, it will be understood that the present invention is entitled to protection within the full scope of the appended claims.

It is claimed:

1. A method of operating a re-programmable non-volatile memory system, comprising:
    utilizing at least one integrated circuit that includes a three-dimensional pattern of memory elements defined by rectangular coordinates having x, y and z-directions and which comprises:
        a plurality of parallel planes stacked in the z-direction on top of a semiconductor substrate;
        a plurality of first conductive lines elongated in the z-direction through the plurality of planes and arranged in a two-dimensional rectangular array of rows in the x-direction and columns in the y-direction, wherein said plurality of first conductive lines is partitioned into a first set of first conductive lines acting as local bit lines and into a second set of first conductive lines;
        a plurality of second conductive lines elongated in the x-direction across individual planes and spaced apart in the y-direction between and separated from the plurality of first conductive lines in the individual planes, wherein said plurality of second conductive lines act as word lines and the first and second conductive lines cross adjacent each other at a plurality of locations across the individual planes;
        a plurality of non-volatile re-programmable memory elements individually connected between the first set of first conductive lines and second conductive lines adjacent the crossings thereof at a first set of the plurality of locations;
        a plurality of connectors individually connected between the second set of first conductive lines and second conductive lines adjacent the crossings thereof at a second set of the plurality of locations;
        a plurality of third conductive lines partitioned into first and second groups of third conductive lines; and
        a first group of select devices arranged to switch a selected row of first conductive lines in the x-direction to the first set of third conductive lines; and
        a second group of select devices arranged to switch a selected set of the plurality of second conductive lines to respective second set of third conductive lines; and
        wherein the select devices each has a source terminal and a drain terminal that are aligned with the two-dimensional array of first conductive lines in the x-y plane; and
        wherein the source and drain terminals of each select device are aligned diagonally in the x-y plane;
    selecting one or more of the plurality of memory elements by applying select control signals to the first and second groups of select devices in order to connect selected row of the first set of first conductive lines to individual ones of the first set of third conductive lines and to connect selected second conductive lines, via the second set of first conductive lines, to individual ones of the second set of third conductive lines; and
    causing the selected one or more of the plurality of memory elements to simultaneously change between their at least first and second states by applying either a first or a second electrical stimulus through the individual ones of the first and second sets of third conductive lines between which the selected one or more of the plurality of memory elements are operably connected.

2. The method as in claim 1, wherein:
each adjacent pair of the second conductive lines are disposed around a corresponding row of first conductive lines in the x-direction for operating exclusively therewith.

3. The method as in claim 1, wherein the selected set of the plurality of second conductive lines includes adjacent pairs of the second conductive lines that are disposed around the selected row of first conductive lines at all of the plurality of planes.

4. The method as in claim 1, wherein
the third conductive lines are elongated in the y-direction,
the select devices are arranged to make those of the first conductive lines aligned in the x-direction connectable with selected ones of the plurality of third conductive lines, and
a plurality of control lines extending in the x-direction and individually connected with a plurality of the select devices aligned in the x-direction to enable connection of a plurality of first conductive lines aligned in the x-direction with different ones of the third conductive lines.

5. The method as in claim 1, wherein a row of first conductive lines are simultaneously switched by two rows of adjacent select devices to connect to different ones of the third conductive lines.

6. The method as in claim 1, wherein the plurality of select devices and the plurality of third conductive lines are formed in a semiconductor substrate and the plurality of planes are formed as a stack over the semiconductor substrate.

7. The method as in claim 6, wherein a row of first conductive lines are simultaneously switched by two rows of adjacent select devices to connect to different ones of the third conductive lines.

8. The method as in claim 6, wherein a row of first conductive lines are simultaneously switched by two rows of adjacent select devices to connect to different ones of the third conductive lines.

9. The method as in claim 1, wherein:
the plurality of select devices are formed in a semiconductor substrate;
the plurality of planes are formed as a stack over the semiconductor substrate; and
the plurality of third conductive lines are formed over the stack.

10. The method as in claim 9, further comprising:
vertical interconnecting conductive lines through the stack between individual select devices and respective third conductive lines.

11. The method as in claim 1, wherein the individual memory elements are characterized by including a material that reversibly changes its level of electrical conductance between at least first and second stable levels in response to an electrical stimulus being applied through the first and second conductive lines between which the memory element is connected.

12. The method as in claim 1, wherein the plurality of non-volatile re-programmable memory elements are constituted from a chalcogenide.

13. The method as in claim 1, wherein the plurality of non-volatile re-programmable memory elements are constituted from a phase change material.

14. The method as in claim 1, wherein the plurality of nonvolatile re-programmable memory elements are constituted from a metal oxide.

15. The method as in claim 1, wherein the plurality of first conductive lines is formed from P+ doped polysilicon.

16. The method as in claim 1, wherein the plurality of second conductive lines is formed from metal.

17. The method as in claim 1, wherein the plurality of third conductive lines is formed from metal.

* * * * *